(12) United States Patent
Jaiswal et al.

(10) Patent No.: US 11,881,263 B2
(45) Date of Patent: Jan. 23, 2024

(54) METHOD, SYSTEM AND DEVICE FOR INTEGRATION OF VOLATILE AND NON-VOLATILE MEMORY BITCELLS

(71) Applicant: Arm Limited, Cambridge (GB)

(72) Inventors: Akhilesh Ramlaut Jaiswal, West Lafayette, IN (US); Mudit Bhargava, Austin, TX (US)

(73) Assignee: Arm Limited, Cambridge (GB)

( * ) Notice: Subject to any disclaimer, the term of this patent is extended or adjusted under 35 U.S.C. 154(b) by 7 days.

(21) Appl. No.: 17/221,670

(22) Filed: Apr. 2, 2021

(65) Prior Publication Data
US 2021/0295915 A1    Sep. 23, 2021

Related U.S. Application Data

(63) Continuation of application No. 16/201,080, filed on Nov. 27, 2018, now Pat. No. 10,971,229, which is a continuation-in-part of application No. 15/960,365, filed on Apr. 23, 2018, now Pat. No. 10,741,246.

(51) Int. Cl.
| G11C 14/00 | (2006.01) |
| G11C 11/16 | (2006.01) |
| G11C 11/418 | (2006.01) |
| G11C 11/419 | (2006.01) |
| H01F 10/32 | (2006.01) |
| G11C 13/00 | (2006.01) |

(Continued)

(52) U.S. Cl.
CPC ...... *G11C 14/0081* (2013.01); *G11C 11/1655* (2013.01); *G11C 11/1657* (2013.01); *G11C 11/1673* (2013.01); *G11C 11/1675* (2013.01); *G11C 11/418* (2013.01); *G11C 11/419* (2013.01); *G11C 11/161* (2013.01); *G11C 13/004* (2013.01); *G11C 13/0007* (2013.01); *G11C 13/0026* (2013.01); *G11C 13/0028* (2013.01); *G11C 13/0069* (2013.01); *G11C 14/009* (2013.01); *G11C 2213/31* (2013.01); *G11C 2213/32* (2013.01); *H01F 10/329* (2013.01); *H01F 10/3254* (2013.01); *H10N 50/80* (2023.02); *H10N 50/85* (2023.02)

(58) Field of Classification Search
CPC ............ G11C 14/0081; G11C 11/1655; G11C 11/1657; G11C 11/1673; G11C 11/1675; G11C 11/418; G11C 11/419; G11C 13/0069; G11C 11/009
See application file for complete search history.

(56) References Cited

U.S. PATENT DOCUMENTS

| 7,298,640 | B2 | 11/2007 | Chen et al. |
| 7,639,523 | B2 | 12/2009 | Celinska et al. |
| 7,778,063 | B2 | 8/2010 | Brubaker et al. |

(Continued)

OTHER PUBLICATIONS

Restriction Requirement, U.S. Appl. No. 15/960,365, dated Oct. 3, 2019, 6 Pages.

(Continued)

*Primary Examiner* — Tuan T Nguyen
(74) *Attorney, Agent, or Firm* — Berkeley Law & Technology Group, LLP

(57) ABSTRACT

Disclosed are methods, systems and devices for operation of memory device. In one aspect, volatile memory bitcells and non-volatile memory bitcells may be integrated to facilitate transfer of stored values between the volatile and non-volatile memory bitcells.

10 Claims, 26 Drawing Sheets

(51) Int. Cl.
    *H10N 50/80*       (2023.01)
    *H10N 50/85*       (2023.01)

(56) References Cited

U.S. PATENT DOCUMENTS

| | | | |
|---|---|---|---|
| 7,872,900 | B2 | 1/2011 | Paz De Araujo et al. |
| 9,349,440 | B1 | 5/2016 | Ma |
| 9,514,814 | B1 | 12/2016 | Sandhu et al. |
| 9,548,117 | B2* | 1/2017 | Ma ..................... G11C 11/5685 |
| 9,548,118 | B1 | 1/2017 | Bhavnagarwala et al. |
| 9,558,819 | B1 | 1/2017 | Aitken et al. |
| 9,621,161 | B1 | 4/2017 | Das et al. |
| 9,660,189 | B1 | 5/2017 | Reid et al. |
| 9,715,916 | B1* | 7/2017 | Tomishima ......... G11C 11/1657 |
| 9,734,895 | B2 | 8/2017 | Savanth et al. |
| 9,735,360 | B2 | 8/2017 | Shifren et al. |
| 9,735,766 | B2 | 8/2017 | Shifren |
| 9,747,982 | B1 | 8/2017 | Shifren et al. |
| 9,748,943 | B2 | 8/2017 | Sandhu et al. |
| 9,755,146 | B2 | 9/2017 | Shifren et al. |
| 9,773,550 | B2 | 9/2017 | Bhavnagarwala et al. |
| 9,786,370 | B2 | 10/2017 | Aitken et al. |
| 9,792,982 | B1 | 10/2017 | Sandhu |
| 9,792,984 | B1 | 10/2017 | Bhavnagarwala et al. |
| 9,805,777 | B2 | 10/2017 | Sandhu et al. |
| 9,851,738 | B2 | 12/2017 | Sandhu et al. |
| 9,871,528 | B1 | 1/2018 | Kumar et al. |
| 9,899,083 | B1 | 2/2018 | Rosendale |
| 9,947,402 | B1 | 4/2018 | Bhavnagarwala et al. |
| 9,972,388 | B2 | 5/2018 | Das et al. |
| 9,978,942 | B2 | 5/2018 | Shifren et al. |
| 9,979,385 | B2 | 5/2018 | Sandhu et al. |
| 9,990,992 | B2 | 6/2018 | Bhavnagarwala et al. |
| 9,997,424 | B2 | 6/2018 | Arvin et al. |
| 10,002,665 | B1 | 6/2018 | Bhargava et al. |
| 10,002,669 | B1 | 6/2018 | Bhargava et al. |
| 10,032,487 | B2 | 7/2018 | Shifren et al. |
| 2008/0107801 | A1 | 5/2008 | Celinska et al. |
| 2008/0232167 | A1 | 9/2008 | Scade et al. |
| 2009/0180334 | A1 | 7/2009 | Syzdek |
| 2012/0020159 | A1* | 1/2012 | Ong .................... G11C 14/0081 |
| | | | 365/185.08 |
| 2013/0285699 | A1 | 10/2013 | Mcwilliams et al. |
| 2014/0177356 | A1 | 6/2014 | Su et al. |
| 2014/0210535 | A1 | 7/2014 | Bartling et al. |
| 2016/0163978 | A1 | 6/2016 | Paz De Araujo et al. |
| 2016/0329100 | A1 | 11/2016 | Javerliac et al. |
| 2017/0047116 | A1 | 2/2017 | Sandhu et al. |
| 2017/0062052 | A1 | 3/2017 | Roy et al. |
| 2017/0069378 | A1 | 3/2017 | Shifren et al. |
| 2017/0092858 | A1 | 3/2017 | Shifren |
| 2017/0147207 | A1 | 5/2017 | Hansson et al. |
| 2017/0220491 | A1 | 8/2017 | Pelley et al. |
| 2017/0244032 | A1 | 8/2017 | Reid et al. |
| 2017/0288675 | A1 | 10/2017 | Chandra et al. |
| 2018/0061467 | A1 | 3/2018 | Kan et al. |
| 2018/0095114 | A1 | 4/2018 | Bhargave et al. |

OTHER PUBLICATIONS

Response to Restriction Requirement, U.S. Appl. No. 15/960,365, filed Dec. 6, 2019, 12 Pages.
Notice of Allowance, U.S. Appl. No. 15/960,365, dated Mar. 10, 2020, 29 Pages.
Issue Fee, U.S. Appl. No. 15/960,365, filed Jun. 10, 2020, 11 Pages.
Corrected Notice of Allowability, U.S. Appl. No. 15/960,365, dated Jul. 15, 2020, 12 Pages.
Issue Notification, U.S. Appl. No. 15/960,365, dated Jul. 22, 2020, 1 Page.
Yamamoto et. al., "Nonvolatile Static Random Access Memory (NV-SRAM) Using Magnetic Tunnel Junctions with Current-Induced Magnetization Switching Architecture", Japanese Journal of Applied Physics . Apr. 2008DOI: 10.1143/JJAP.48.043001, 19 pgs.
Kim et. al, "DSTT-MRAM: Differential Spin Hall MRAM for On-chip Memories", School of Electrical and Computer Engineering, Purdue University West Lafayette, Indiana, 47907, USA, 11 pgs.
Dorrance, et. al., "Diode-MTJ Crossbar Memory Cell Using Voltage-Induced Unipolar Switching for High-Density MRAM", IEEE Electron Device Letters, vol. 34, No. 6, Jun. 2013, pp. 753-755.
Ikeda, et. al., "Tunnel magnetoresistance of 604% at 300 K by suppression of Ta diffusion in CoFeb/Mgo/CoFeb pseudo-spin-valves annealed at high temperature", Appl. Phys. Lett. 93, 082508 (2008); https://doi.org/10.1063/1.2976435 Submitted: May 30, 2008 . Accepted: Aug. 5, 2008 . Published Online: Aug. 29, 2008, 4 pgs.
Jaiswal, et. al., "Comprehensive Scaling Analysis of Current Induced Switching in Magnetic Memories Based on In-Plane and Perpendicular Anisotropies," in IEEE Journal on Emerging and Selected Topics in Circuits and Systems, vol. 6, No. 2, pp. 120-133, Jun. 2016, doi: 10.1109/JETCAS.2016.2547698.
Kang, et. al., "Low Store Power High-Speed High-Density Nonvolatile SRAM Design With Spin Hall Effect-Driven Magnetic Tunnel Junctions," in IEEE Transactions on Nanotechnology, vol. 16, No. 1, pp. 148-154, Jan. 2017, doi: 10.1109/TNANO.2016.2640338.
Liu, et. al., "Spin Hall effect tunnelling spectroscopy", Published online Jul. 20, 2014, DOI: 10.1038/NPHYS3004. Nature Physics. 10. 561-566. 10.1038/nphys3004.
Oh, et. al., "Field-free switching of perpendicular magnetization through spin-orbit torque in antiferromagnet/ferromagnet/oxide structures". Nature Nanotech 11, 878-884 (2016), https://doi.org/10.1038/nnano.2016.109.
Ohsawa, et. al., "1Mb 4T-2MTJ nonvolatile STT-RAM for embedded memories using 32b fine-grained power gating technique with 1.0ns/200ps wake-up/power-off times," 2012 Symposium on VLSI Circuits (VLSIC), Honolulu, HI, 2012, pp. 46-47, doi: 10.1109/VLSIC.2012.6243782.
Raha, et. al., "Designing Energy-Efficient Intermittently Powered Systems Using Spin-Hall-Effect-Based Nonvolatile SRAM," in IEEE Transactions on Very Large Scale Integration (VLSI) Systems, vol. 26, No. 2, pp. 294-307, Feb. 2018, doi: 10.1109/TVLSI.2017.2767033.
Seo, et. al., "Area-Efficient SOT-MRAM With a Schottky Diode," in IEEE Electron Device Letters, vol. 37, No. 8, pp. 982-985, Aug. 2016, doi: 10.1109/LED.2016.2578959.
Shirotori, et. al., "Voltage-Control Spintronics Memory With a Self-Aligned Heavy-Metal Electrode", IEEE Transactions on Magnetics, vol. 53, No. 11, Nov. 2017, 4 pgs.
Butler, et. al., "Spin-Dependent Tunneling Conductance of Fe/MgO/ Fe Sandwiches". Physical Review B, vol. 63, DOI: 10.1103/PhysRevB.63.054416, 2001, 12 pgs.
Pai, "Spin-Torque Switching with the Giant Spin Hall Effect of Tantalum", Science May 4, 2012: vol. 336, Issue 6081, pp. 555-558, DOI: 10.1126/science.1218197.
Yoda, et. al., "Voltage-control spintronics memory (VoCSM) having potentials of ultra-low energy-consumption and high-density," 2016 IEEE International Electron Devices Meeting (IEDM), San Francisco, CA, 2016, pp. 27.6.1-27.6.4, doi: 10.1109/IEDM.2016.7838495.
Notice of Allowance, U.S. Appl. No. 16/201,080, dated Apr. 6, 2020, 12 Pages.
Office Action, U.S. Appl. No. 16/201,080, dated Aug. 7, 2020, 31 Pages.
Response to Office Action, U.S. Appl. No. 16/201,080, filed Nov. 9, 2020, 16 Pages.
Notice of Allowance, U.S. Appl. No. 16/201,080, dated Dec. 3, 2020, 8 Pages.
Issue Fee, U.S. Appl. No. 16/201,080, filed Mar. 3, 2021, 12 Pages.
Issue Notification, U.S. Appl. No. 16/201,080, dated Mar. 17, 2021, 1 Page.

* cited by examiner

METHOD, SYSTEM AND DEVICE FOR INTEGRATION OF VOLATILE AND NON-VOLATILE MEMORY BITCELLS

CROSS REFERENCE TO RELATED APPLICATIONS

This application is a continuation of U.S. patent application Ser. No. 16/201,080 entitled "METHOD, SYSTEM AND DEVICE FOR INTEGRATION OF VOLATILE AND NON-VOLATILE MEMORY BITCELLS," filed Nov. 27, 2018, which is a continuation-in-part of U.S. Pat. No. 10,741,246 entitled "METHOD, SYSTEM AND DEVICE FOR INTEGRATION OF VOLATILE AND NON-VOLATILE MEMORY BITCELLS," filed Apr. 23, 2018, both incorporated herein by reference in their entirety. This application is also related to U.S. patent application Ser. No. 15/960,405, titled "METHOD, SYSTEM AND DEVICE FOR INTEGRATION OF VOLATILE AND NON-VOLATILE MEMORY BITCELLS," filed on Apr. 23, 2018, incorporated herein by reference in its entirety.

BACKGROUND

1. Field

Disclosed are techniques for utilizing memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for speed and higher bit density.

More recently, FeRAMs (Ferroelectric RAMs) have provided low power, relatively high write/read speed, and endurance for read/write cycles exceeding 10 billion times. Similarly, magnetic memories (MRAMs) have provided high write/read speed and endurance, but in some circumstances with a higher cost premium and/or higher power consumption. In some situations, these technologies may not achieve the density of flash memory devices, for example. As such, flash often remains a non-volatile memory of choice. Nevertheless, it is generally recognized that flash memory technology may not scale easily below 65 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_\epsilon$, with x, y, z and $\epsilon$ of varying stoichiometry; transition metal oxides, such as CuO, CoO, VON, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments is still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

SUMMARY

Briefly, one particular implementation is directed to bitcell circuit comprising: one or more volatile memory elements; and one or more non-volatile magnetic memory elements electrically coupled to a first node of the one or more volatile memory elements, wherein the one or more volatile memory elements and the one or more non-volatile magnetic memory elements are individually accessible, wherein the one or more volatile memory elements are accessible via a bitline responsive to a signal on a first wordline and wherein the one or more non-volatile magnetic memory elements are accessible via a second wordline, and wherein one or more signals and/or states stored at the one or more volatile memory elements are maintained if the one or more non-volatile magnetic memory elements are accessed.

Another particular implementation is directed to a method comprising: accessing one or more non-volatile magnetic memory elements of a bitcell, wherein the bitcell further includes one or more volatile memory elements, wherein the one or more non-volatile magnetic memory elements are electrically coupled to a first node of the one or more volatile memory elements, wherein the one or more volatile memory elements and the one or more non-volatile magnetic memory elements are individually accessible, wherein the one or more volatile memory elements are accessible via a bitline responsive to a signal on a first wordline and wherein the one or more non-volatile magnetic memory elements are accessible via a second wordline, and wherein the one or more signals and/or states stored at the one or more volatile memory elements of the bitcell are maintained responsive to the accessing of the one or more non-volatile magnetic memory elements.

An additional particular implementation is directed to an apparatus including an array of bitcells, wherein the bitcells individually comprise one or more volatile memory elements accessible via one or more bitlines responsive to one or more signals on one or more first wordlines, and one or more non-volatile magnetic memory elements accessible via one or more second wordlines, wherein one or more signals and/or states stored at the one or more volatile memory elements are maintained if the one or more non-volatile magnetic memory elements are accessed.

It should be understood that the aforementioned implementations are merely example implementations, and that claimed subject matter is not necessarily limited to any particular aspect of these example implementations.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
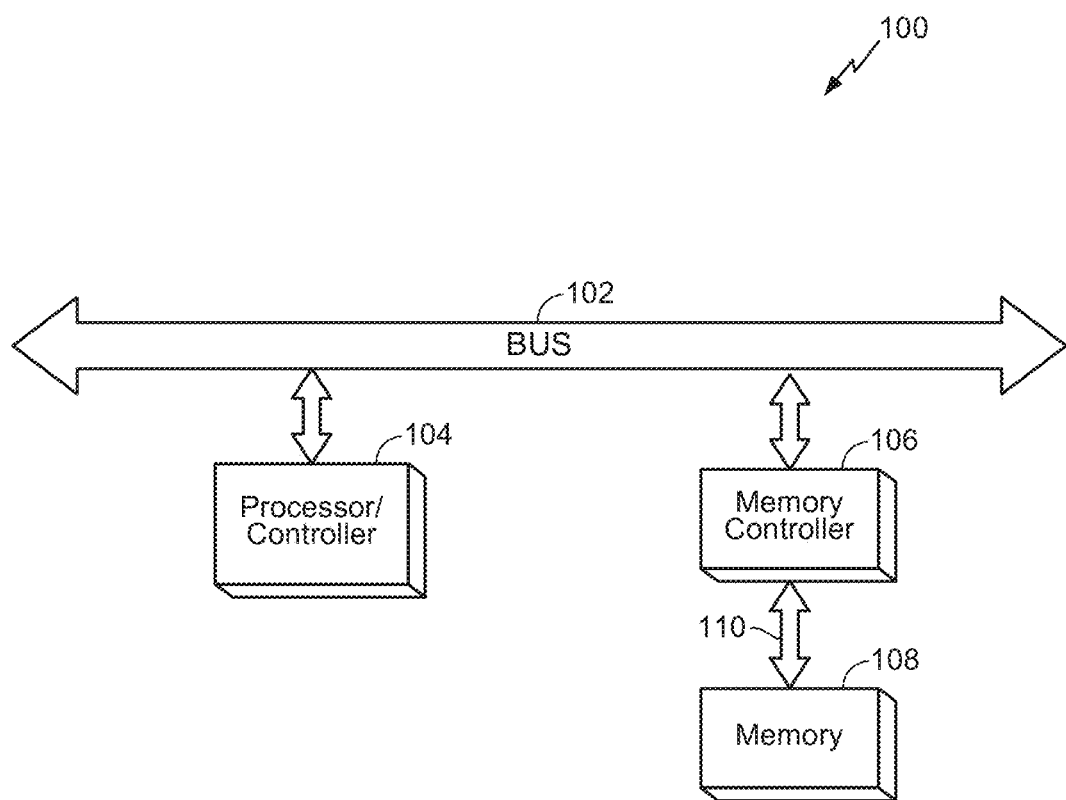
FIG. 1 is a schematic diagram of a computing device according to an embodiment.

Reference is made in the following detailed description to accompanying drawings, which form a part hereof, wherein like numerals may designate like parts throughout that are identical, similar and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

According to an embodiment, a computing device or computing platform may incorporate volatile memory systems and non-volatile memory systems to perform computing operations. In one embodiment, a memory device may comprise a "volatile" memory device that may maintain a particular memory state while power is applied to the volatile memory device, but may lose the particular memory state if power is removed. In another embodiment, a memory device may comprise a "non-volatile" memory that may maintain a particular memory state even after power is removed from the memory device.

A volatile memory system or non-volatile memory system may maintain memory states to represent values, symbols, parameters and/or conditions as memory states such as "bitcells." In this context, a "bitcell" or "bitcell circuit" as referred to herein comprises a circuit or portion of a circuit capable of representing one or more values, symbols or parameters as one or more states. For example, a bitcell may comprise one or more memory devices that are capable of representing one or more values, symbols or parameters as one or more memory states of the one or more memory devices. In particular implementations, a volatile memory device may be made up of "volatile memory" bitcells that may lose a detectable memory state after power is removed from the volatile memory bitcells. Likewise, a non-volatile memory device may be made up of "non-volatile memory" bitcells capable of maintaining a detectable memory state after power is removed from the non-volatile memory bitcells.

According to an embodiment, a computing device or computing platform may include both non-volatile memory devices and volatile memory devices. In particular implementations, such a computing device or computing platform may copy or transfer memory states or stored values read from a volatile memory device to a non-volatile memory. Likewise, such a computing platform or computing device may copy memory states read from a non-volatile memory to a volatile memory device. Copying memory states or transferring stored values between volatile and non-volatile memory devices may entail latencies and power consumption affecting performance of a computing platform or device. Additionally, copying memory states or transferring stored values between volatile and non-volatile memory devices may impact memory bus resources used to transfer values between physical devices. Particular implementations described herein are directed to a coupling of volatile memory bitcells and non-volatile memory bitcells to reduce power consumption and latency in connection with copying memory states between volatile and non-volatile memory devices.

FIG. 1 is a schematic diagram of a computing device 100 according to an embodiment. A processor/controller 104 may execute processes or procedures (e.g., under control of computer-readable instructions) to perform various tasks including, for example, storing values in or reading values from addressable portions of memory 108. In a particular implementation, processor/controller 104 may communicate with a memory controller 106 through bus 102 according to a predefined interface. Processor/controller 104 may provide commands (e.g., specifying a physical memory address) to memory controller 106 to write values to or read values from an addressable portion of memory 108.

Memory array 108 may comprise one or more volatile or non-volatile memory devices including, for example, a memory array comprising volatile and non-volatile memory bitcells elements as described herein. Processor/controller 104, memory controller 106 and memory 108 may be formed as separate components or integrated together in a system-on-a-chip (SoC) along with other components not shown (e.g., sensors, user interface, I/O devices). Furthermore, processor/controller 104, memory controller 106 and memory array 108 may be formed from any one of several different process technologies including, for example, correlated electron material (CEM) processes discussed herein, complementary metal oxide semiconductor (CMOS) processes or other process used to form non-volatile memory bitcells or volatile memory bitcells, for example.

According to an embodiment, memory 108 may comprise volatile memory devices comprising volatile memory bitcells and non-volatile memory devices comprising non-volatile memory bitcells. Such volatile memory bitcells may comprise bitcells formed according to any one of several circuit structures for forming volatile memory bitcells such as SRAM bitcells, DRAM bitcells, just to provide a few examples. Such non-volatile memory bitcells may be formed according to any one of several non-volatile memory bitcells such as flash memory bitcells, correlated electron memory bitcells, phase change memory (PCM) bitcells, magnetic memory bitcells, just to provide a few examples. As described below in particular implementations, non-volatile and volatile memory bitcells formed in memory 108 may be integrated to enable copying of memory states between the non-volatile and volatile memory bitcells using any one of several different techniques.

Figure 2:
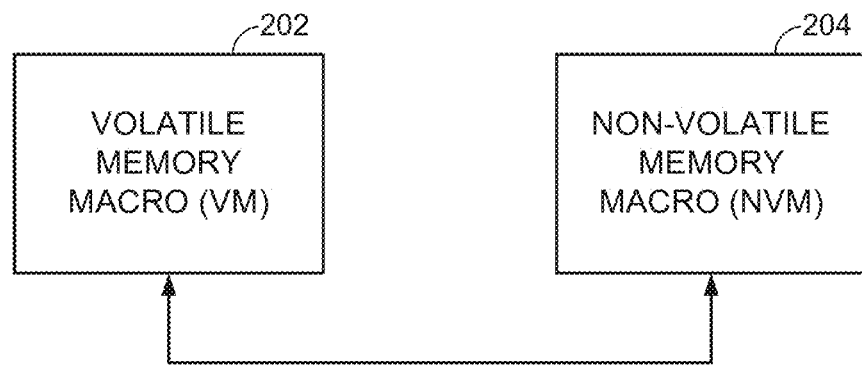
FIGS. 2, 3A and 3B are schematic diagrams of memory systems comprising volatile memory bitcells and non-volatile memory bitcells according to an embodiment.
Figure 3A:
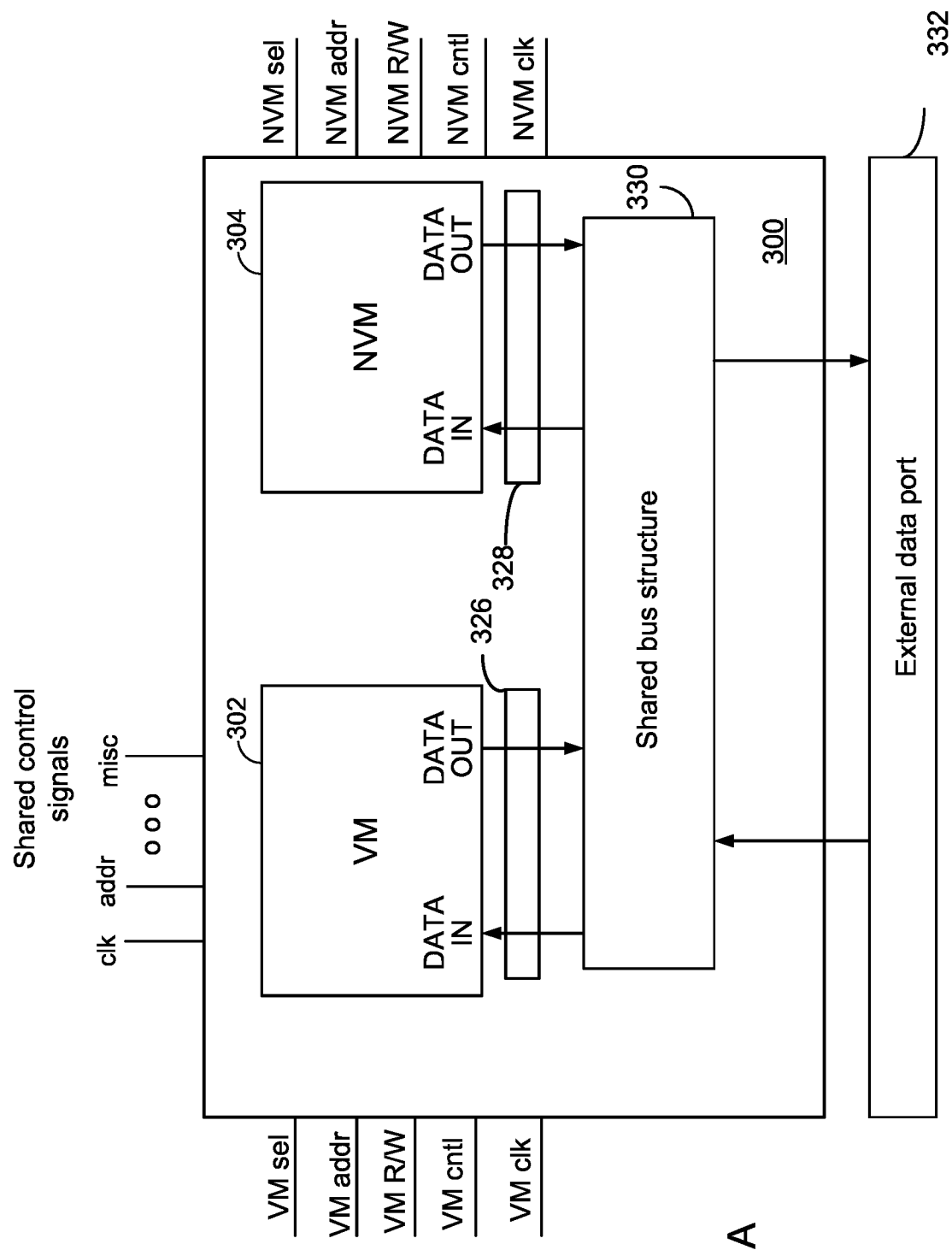

FIG. 2 is a schematic diagram illustrating a process of copying states or transferring stored values between or among volatile memory bitcells and non-volatile memory bitcells, for example, within memory 108. FIG. 3A is a schematic diagram of a particular implementation in which memory states may be copied or stored values may be transferred between or among volatile memory bitcells 302 and non-volatile memory bitcells 304 over memory busses (e.g., fixed bit length memory busses) coupled between volatile memory bitcells 302 and non-volatile memory bitcells 304. In addition to volatile memory bitcells 302 and non-volatile memory bitcells 304, integrated circuit device 300 may comprise a shared data bus structure 300 and an external data port 322. According to an embodiment, shared data bus structure 330 may facilitate copy or transfer of stored values between or among volatile memory bitcells 302 and non-volatile memory bitcells 304. Shared data bus structure 330 may also facilitate transfer of stored data values between external data port 332 and either volatile memory bitcells 302 or non-volatile memory bitcells 304.

According to an embodiment, volatile memory bitcells 302 and non-volatile memory bitcells 304 may be formed in the single integrated circuit device 300 where volatile memory bitcells 302 may be formed in one or more volatile memory arrays and non-volatile memory bitcells 304 may be formed in one or more non-volatile memory bitcells.

Integrated circuit device 300 may comprise a plurality of external signal pins such as, for example, signal pins VM sel (volatile memory select), VM addr (volatile memory address), VM R/W (volatile memory read/write), VM cntl (volatile memory control) and VM clk (volatile memory clock). Likewise, integrated circuit device 300 may comprise a plurality of external signal pins such as, for example, signal pins NVM sel (non-volatile memory select), NVM addr (non-volatile memory address), NVM R/W (non-volatile memory read/write), NVM cntl (non-volatile memory control) and NVM clk (non-volatile memory clock). Integrated circuit device 300 may further comprise signaling pins 322 and 324 to at least in part form a single data port that is configurable to transfer data between an external device (not shown) and either volatile memory bitcells 302 or non-volatile memory bitcells 304. In addition, integrated circuit device 300 may comprise shared control signals such as a shared clock signal clk, shared address signal addr, among others. In a particular example, shared clock signal clk may control memory cycles (e.g., for read operations and/or write operations) applied to either volatile memory bitcells 302 or non-volatile memory bitcells, or both. Also, shared address signal addr may be used for accessing bitcells formed in either volatile memory bitcells 302 or non-volatile memory bitcells, or both.

In a particular implementation, integrated circuit device 300, including volatile memory bitcells 302, non-volatile memory bitcells 304 and shared bus structure 330, may be formed according to a digital circuit design within a single register transfer level (RTL) boundary defining a synchronous digital circuit (e.g., in terms of the flow of digital signals between or among registers and operations performed on such digital signals). In a particular implementation, the digital circuit design within the single RTL boundary may be defined according to a hardware description language (HDL) such as, for example, Verilog or VHDL, based on high-level representations of a circuit.

Figure 3B:
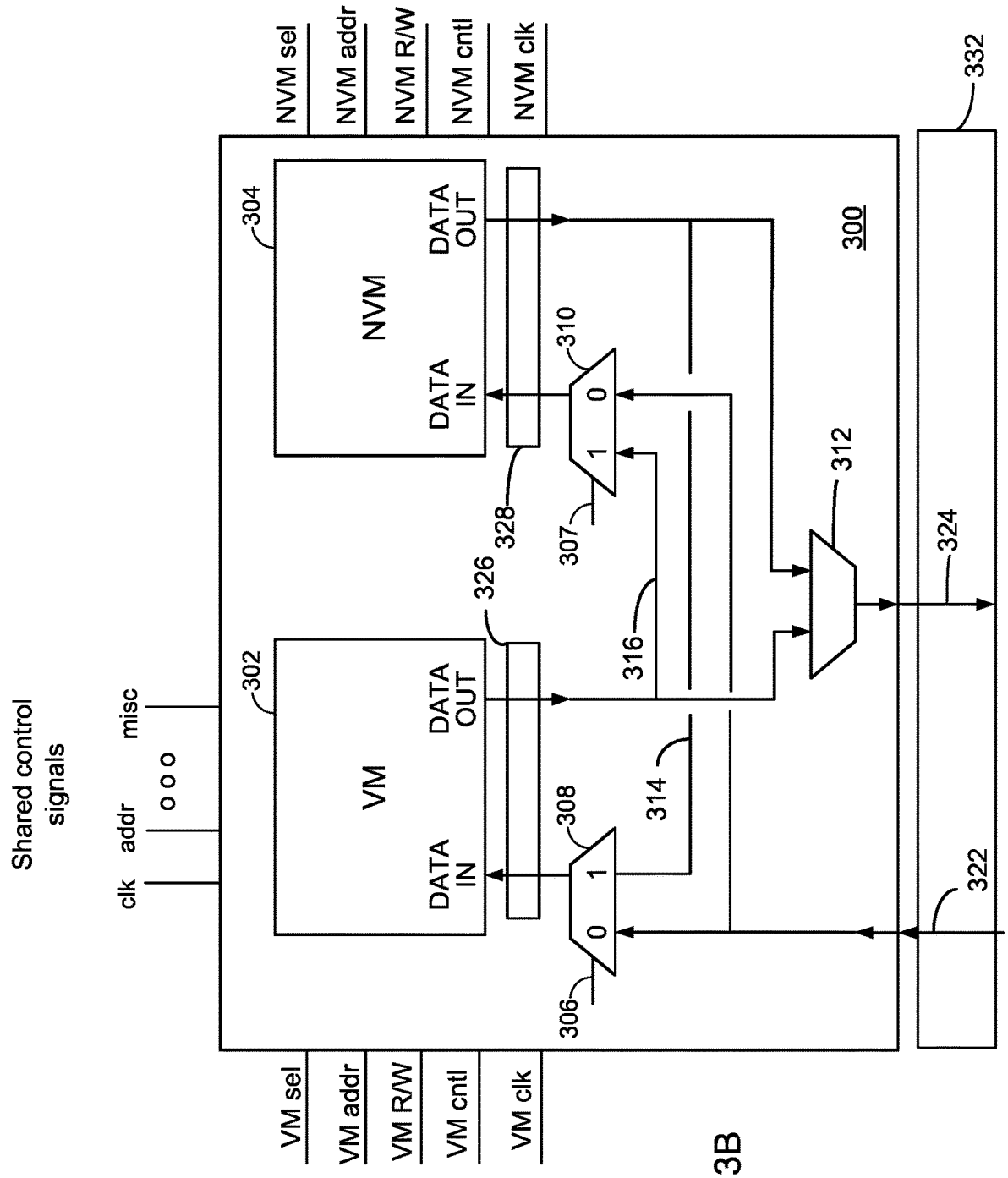

Integrated circuit 300 further comprise at least one volatile memory data bus 326 configurable to transfer data signals to volatile memory bitcells 302 in write operations and transfer stored values obtained from volatile bitcells 302 in read operations. Likewise, integrated circuit 300 further comprise at least one non-volatile memory data bus 328 configurable to transfer stored values to non-volatile bitcells 304 in write operations and transfer data obtained from non-volatile bitcells 304 in read operations. FIG. 3B is a schematic diagram of a specific implementation of integrated circuit device 300 shown in FIG. 3A including a specific implementation of shared data bus structure 330 and external data port 332. Here, a value for signal 306 provided to multiplexers 308 and 310 may indicate whether states are to be copied from volatile memory cells 302 to non-volatile memory cells 304, or from non-volatile memory cells 304 to volatile memory bitcells 302.

In this context, a "read operation" as referred to herein means an operation implemented by a circuit to detect a memory state of one or more bitcells. Further in this context, a "write operation" as referred to herein means an operation implemented by a circuit to place one or more bitcells in a particular memory state. For example, a write operation may comprise generation of a "programming signal" having particular properties (e.g., a voltage and/or current) which may be applied to one or more portions of a bitcell to place the bitcell in a particular memory state (e.g., a memory state that is detectable in a subsequent read operation).

In one embodiment, memory states or stored values of one or more volatile memory bitcells 302 may be copied or transferred to one or more non-volatile memory bitcells 304. In this context, values stored in one or more first memory bitcells may be "transferred" to one or more second memory bitcells by placing the one or more second memory bitcells in a particular memory state so as to store or represent, according to a particular mapping between stored values and memory states, the values stored in the one or more first memory bitcells. In the particular embodiment of FIG. 3, a transfer of stored values from one or more volatile memory bitcells 302 to one or more non-volatile memory bitcells 304 may comprise one or more read operations applied to the one or more volatile memory bitcells 302 to detect memory states of the one or more volatile memory bitcells 302 followed by one or more write operations applied to the one or more non-volatile memory bitcells 304. Similarly, a transfer of stored values from one or more non-volatile memory bitcells 304 to one or more volatile memory bitcells 302 may comprise one or more read operations applied to the one or more non-volatile memory bitcells 304 to detect memory states of the one or more non-volatile memory bitcells 304 followed by one or more write operations applied to the one or more volatile memory bitcells 302.

As shown in the specific implementation of FIG. 3B, external data port 332 may comprise external pins 322 and 324. In one embodiment, volatile memory data bus 326 may be configurable to transfer data received at external signal pins 322 to volatile memory bitcells 302 in a write operation according to a first state of multiplexer 308. Also, the least one volatile memory data bus 326 may be configurable for signaling to transfer data retrieved from volatile memory bitcells 302 in a read operation to external signal pins 324 according to a first state of multiplexer 312. Likewise in another embodiment, the least one non-volatile memory data bus 328 is configurable to transfer data received at external signal pins 322 to non-volatile memory bitcells 304 in a write operation according to a first state of multiplexer 310. Also, the least one non-volatile memory data bus 328 may be configurable to transfer data retrieved from non-volatile memory bitcells 304 in a read operation to external signal pins 324 according to a second state of multiplexer 312. Accordingly, by setting states of multiplexers 308, 310 and 312, integrated circuit device 300 may configure external data port 322 formed by external signal pins 322 and 324 to transfer data between an external device and either volatile memory bitcells 302 or non-volatile memory bitcells 304.

In another embodiment, the least one volatile memory data bus 326 and the least one volatile memory data bus 328 may be configured to transfer stored values between volatile memory bitcells 302 and non-volatile memory bitcells 304 independently of the data port formed by external signal pins 322 and 324. In one particular implementation, volatile memory bitcells 302, non-volatile memory bitcells 304, the least one volatile memory data bus 326 and the least one volatile memory data bus 328 may be configured to transfer stored values between volatile memory bitcells 302 and non-volatile memory bitcells independently of the data port formed by external signal pins 322 and 324 by application of a combination of signal conditions (e.g., including signal conditions affected by voltage levels, current levels, signal timing, etc.) to external signal pins (e.g., VM R/W, VM addr, VM sel, NVM R/W, NVM addr, NVM sel, etc.) of integrated circuit 300. Application of such voltages to external signal pins of integrated circuit 300 may, for example, place multiplexer 308 in a second state enabling the at least one volatile memory data bus 326 to receive stored values transferred from non-volatile memory bitcells 304 in a read operation. Here, received stored values transferred from non-volatile memory bitcells 304 in a read operation may be stored in volatile memory bitcells 302 in a subsequent write operation. Similarly, application of a combination of voltages to external signal pins of integrated circuit 300 may set multiplexer 310 in a second state enabling the at least one volatile memory data bus 310 to receive data transferred from volatile memory bitcells 302 in a read operation. Here, received stored values transferred from volatile memory bitcells 302 in a read operation may be stored in non-volatile memory bitcells 304 in a subsequent write operation.

In one implementation, volatile memory data bus 326 and non-volatile memory data bus 328 may have the same bus width (e.g., a byte or word) to transfer the same quantity of data or retrieved stored values on memory cycles. For example, buses 314 and 316 may comprise the same number of conductors, each conductor capable of transmitting a signal representing a single bit or symbol. In an alternative implementation, volatile memory data bus 326 and non-volatile memory data bus 328 may have different bus widths. For example, volatile memory data bus 326 may have a bus width that is an integer multiple the bus width of non-volatile memory data bus 328. In this example, multiplexer 310 may partition data transferred from volatile memory bitcells 302 in a single memory cycle for storage in non-volatile memory elements 304 in write operations over multiple memory cycles. Likewise, if non-volatile memory data bus 328 has a bus width that is an integer multiple larger than volatile memory data bus 326, multiplexer 308 may partition data transferred from non-volatile memory bitcells 304 in a single memory cycle for storage in non-volatile memory elements 302 in write operations over multiple memory cycles.

Figure 4:
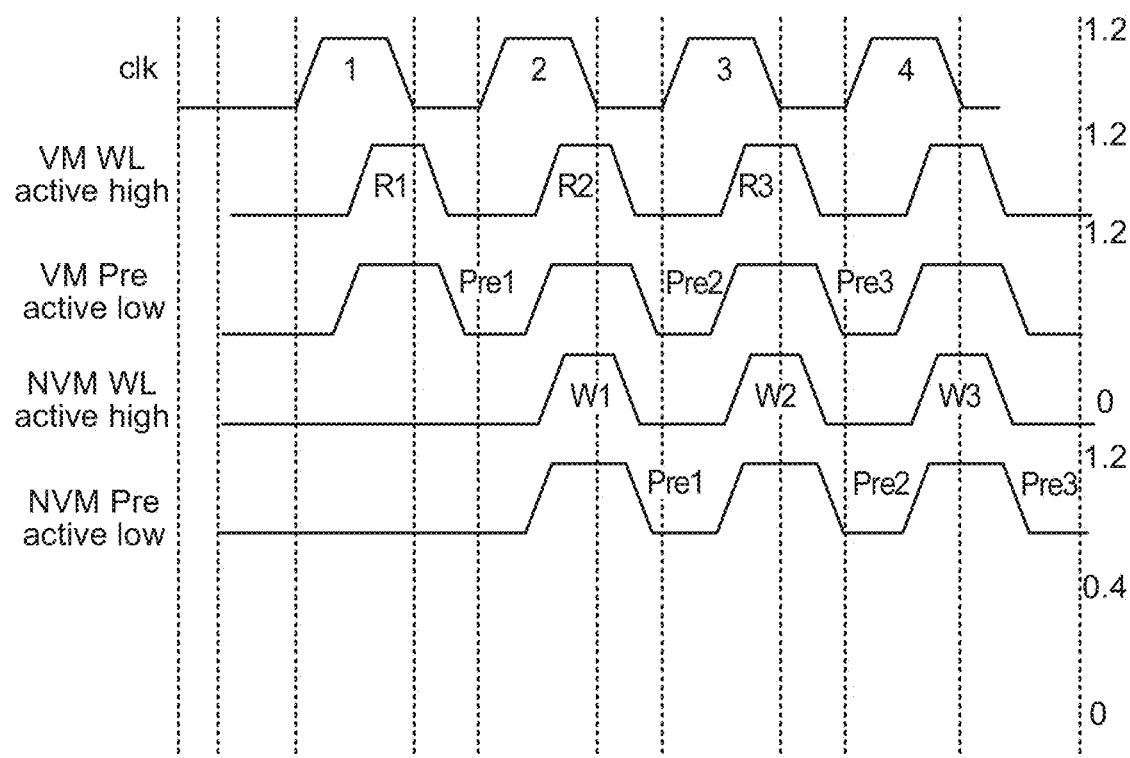
FIG. 4 is a diagram illustrating timing of operations to copy states between volatile memory bitcells and non-volatile memory bitcells according to an embodiment.

FIG. 4 illustrates timing of operations to copy states from volatile memory bitcells (e.g., volatile memory bitcells 302) to non-volatile memory bitcells (e.g., non-volatile memory bitcells 304). It should be understood that the particular timing of operations illustrated in FIG. 4 is merely an example of timing, and that other variations of timing may be employed without deviating from claimed subject matter. For example, particular variations may be directed to an active low wordline and/or pre signals, true-precharge versus post-charge schemes, etc. In an implementation, volatile and non-volatile memory bitcells may be accessed for write operations responsive to application of a voltage signal on a wordline to couple bitcell circuitry to one or more bitlines. A sense amplifier (not shown) may be maintained in an equalization mode until a wordline signal goes active. For example, such a sense amplifier may not become active until a certain signal level on a bitline is reached. Also, a write driver circuit (not shown) may be enabled prior to activation of a wordline.

In a first clock cycle, a voltage on a wordline coupled to one or more volatile memory bitcells (e.g., one or more volatile memory bitcells 302) may be raised to enable a read operation applied to the one or more VM bitcells. Signal VM WL active high may indicate that access of associated volatile memory bitcells is enabled if the associated signal is high and signal NVM WL active high may indicate that access of associated non-volatile memory bitcells is enabled if the associated signal is high. Signal VM Pre active low in a lower state may indicate precharging for bitlines to volatile memory bitcells (e.g., prior to signal VM WL active high is raised). Likewise, signal NVM Pre active low in a lower state may indicate precharging for bitlines to non-volatile memory bitcells (e.g., prior to signal NVM WL active high is raised). As shown, a leading edge of "Pre1" may precede a leading edge of the voltage signal on the wordline. Memory states or stored values detected in the read operation may then be copied or transferred to one or more bitcells in a write operation to one or more bitcells in non-volatile memory bitcells 304. Similar read and write operations may occur at subsequent clock cycles in pipeline fashion as shown. Accordingly, it may be observed that transfer of states from volatile memory bitcells (e.g., volatile memory bitcells 302) to non-volatile memory bitcells (e.g., non-volatile memory bitcells 304) may involve a latency.

Aspects of integrated circuit device 300 shown in FIGS. 3A and 3B may be implemented using features shown in FIGS. 5, 6, 8 and 12 as described below.

Figure 5:
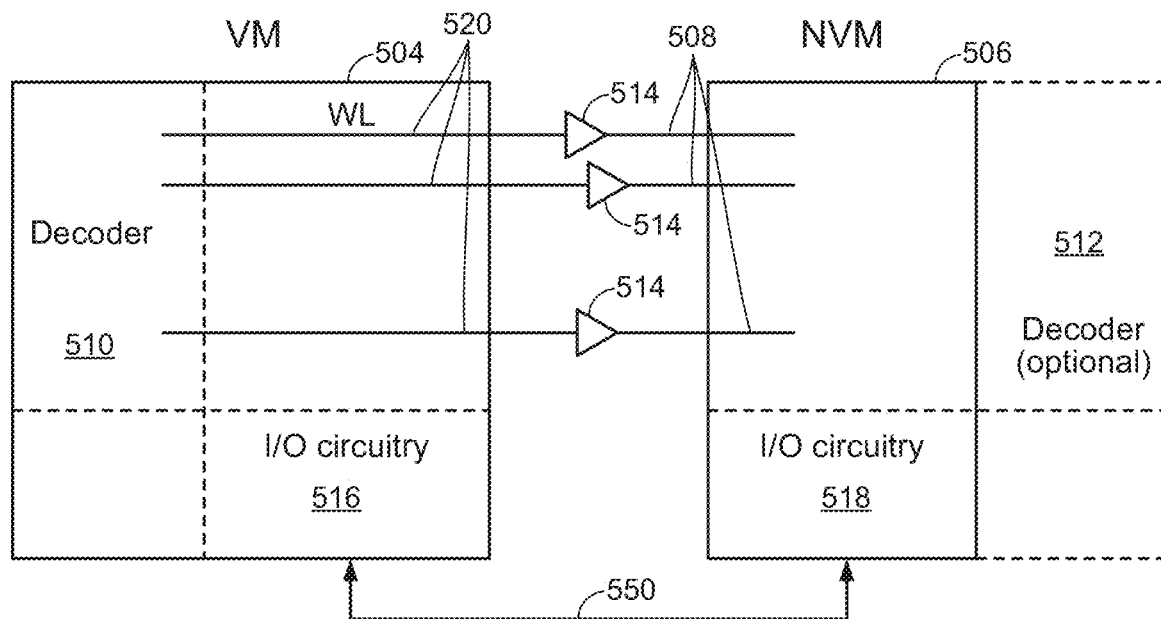
FIGS. 5 and 6 are schematic diagrams of memory systems integrating volatile memory bitcells and non-volatile memory bitcells according to an embodiment on common wordlines according to an embodiment.

FIG. 5 is a schematic diagram of a memory such as memory 108 comprising an array of volatile memory bitcells 504 and an array of non-volatile memory bitcells 506. Wordlines 508 may be used to access bitcells in the array of non-volatile memory bitcells 506 and wordlines 520 may be used to access bitcells in the array of volatile memory bitcells 504 for read and write operations. In this context, a "wordline" comprises a conductor for transmitting a signal to select a particular bitcell or group of bitcells to be accessed in a read operation or a write operation. In a particular example implementation, a voltage of a signal on a wordline may be raised or lowered to select or deselect a particular bitcell or group of bitcells to be connected to a corresponding bitline or group of bitlines during a read or write operation. It should be understood, however, that this is merely an example of a wordline and that claimed subject matter is not limited in this respect.

To enable copying of memory states (or transfer of corresponding stored values) between volatile memory bitcells in array of volatile memory bitcells 504 and non-volatile memory bitcells 506, a particular wordline 508 may be used to access one or more bitcells in the array of non-volatile memory bitcells 506 and a corresponding wordline 520 may be used to access and one or more bitcells in the array of volatile memory bitcells 504.

In one embodiment, decoder circuit 510 may comprise a "shared decoder circuit" in that decoder circuit 510 may, among other things, assert voltage signals on wordlines 520 to access bitcells in the array of volatile memory bitcells 504 and assert voltage signals on wordlines 508 to access bitcells in the array of non-volatile memory bitcells 506. In an alternative embodiment, decoder circuit 510 may assert voltage signals on wordlines 520 to access bitcells in the array of volatile memory bitcells 504 and a second, optional decoder 512 may assert voltage signals on wordlines 508 to access bitcells in the array of non-volatile memory bitcells

506. According to an embodiment, assertion of a wordline 520 may connect corresponding bitcells in volatile memory 504 to bitlines (not shown) connected to I/O circuitry 516. I/O circuitry 516 may comprise sense amplifier circuits (not shown) for detecting memory states of volatile memory bitcells connected to bitlines in read operations. I/O circuitry 516 may also comprise write driver circuits (not shown) to generate programming signals to affect a memory state of volatile memory bitcells connected to bitlines in write operations. Likewise, I/O circuitry 518 may comprise sense amplifier circuits (not shown) for detecting memory states of non-volatile memory bitcells connected to bitlines in read operations. I/O circuitry 518 may also comprise write driver circuits (not shown) to generate programming signals to affect a memory state of non-volatile memory bitcells connected to bitlines in write operations. In this context, a "bitline" comprises a conductor that is connectable to at least a portion of a bitcell circuit during a write operation to transmit a signal altering a memory state of the bitcell circuit, or during a read operation to transmit a signal representative of a memory state of the bitcell circuit. According to an embodiment, bus 550 coupled between I/O circuitry 516 and 518 may facilitate copying of memory states (or transfer of corresponding stored values) between one or more volatile memory bitcells 504 and non-volatile memory bitcells 506. For example, bus 550 may comprise an address portion identifying target bitcells to be affected by a write operation and a data portion (e.g., having a data bus width) to transmit one or more signals indicative of memory states obtained in a read operation to be written to the target bitcells in the write operation.

In a particular implementation, a data bus width and word address width for accessing bitcells in array of volatile memory bitcells 504 (e.g., at I/O circuitry 516) may be the same as a data bus width and word address width for accessing bitcells in array of non-volatile memory bitcells 506 (e.g., at I/O circuitry 518). However, corresponding wordlines 520 and 508 may be connected through buffers 514 formed between portions of bitcells in the array of volatile memory bitcells 504 and the array of non-volatile memory bitcells 506. In an implementation, to enable decoder circuit 510 to operate as a shared decoder circuit as discussed above, buffers 514 may re-shape voltage signals generated by decoder 510 on corresponding wordlines 520 to be applied to wordlines 508 for accessing bitcells in non-volatile memory array 506. Here, for example, an access signal may be applied to a wordline 508 in response to decoder 510 applying an access signal to a wordline 520 coupled to the bitline 508 through a buffer 514. In an alternative implementation, an optional decoder 512 may generate signals on wordlines 508 to access bitcells in array of non-volatile memory bitcells 506 while decoder 510 generates signals on wordlines 520 to access bitcells in array of volatile memory bitcells 504. Buffers 514 may also perform a latching function to implement pipelining of operations between bitcells of the array of volatile memory bitcells 504 and bitcells of the array of non-volatile memory bitcells 506. For example, a buffer 514 may affect wordline signal to enabling pipelining of read and write operations to copy memory states between bitcells of the array of volatile memory bitcells 504 and bitcells of the array of non-volatile memory bitcells 506.

As discussed above, in one embodiment, memory states may be copied (or corresponding stored values may be transferred) between bitcells of the array of volatile memory bitcells 504 and bitcells of the array of non-volatile memory bitcells 506. In a particular implementation, states of bitcells in array of volatile memory bitcells 504 coupled to a particular wordline 520 may be copied or written to bitcells in array of non-volatile memory bitcells 506 coupled to a particular wordline 508 (coupled to the particular wordline 520 through a buffer 514). Timing of such a transaction be illustrated in FIG. 7A according to an embodiment. Here, a signal R1 may be asserted on a wordline 520 to be applied to selected bitcells in array of non-volatile memory bitcells 504 for a read operation following a leading edge of a clock pulse in a first clock cycle. During the read operation, circuitry in I/O circuitry 516 connected to the selected bitcells by bitlines may detect memory states of the selected bitcells. Following detection of states in selected bitcells in the array 504 from the read operation, a signal W1 may then be asserted on a wordline 508 to be applied to bitcells in array of non-volatile memory bitcells 506 at a trailing edge of the clock pulse in the first clock cycle. Here, bitcells in array of non-volatile memory bitcells 506 may be accessed for a write operation to write or copy detected states of the selected bitcells in the array of volatile memory bitcells 504 to the accessed bitcells in array of non-volatile memory bitcells 506. As pointed out above, a buffer 514 in wordline 508 may provide a latch at the boundary between the bitcells coupled to wordline 508 in array 504 accessed for the read operation and the bitcells coupled to the wordline 508 in the array 506 accessed for the write operation. This may allow a falling edge of voltage on wordline 520 coupled to array 504 and the Pre signal (restoring the bitlines of the VM) may also fall. In other implementations, a buffer 514 may comprise level shifter circuit or a latch circuit to raise or lower a voltage on an associated wordline. For example, buffer 514 comprising a level shifter circuit may respond to a first voltage on a wordline 520 (enabling access to selected volatile memory bitcells of array 504) by applying a second, different voltage on a wordline 508 (enabling access to selected non-volatile memory bitcells of array 506).

Figure 7A:
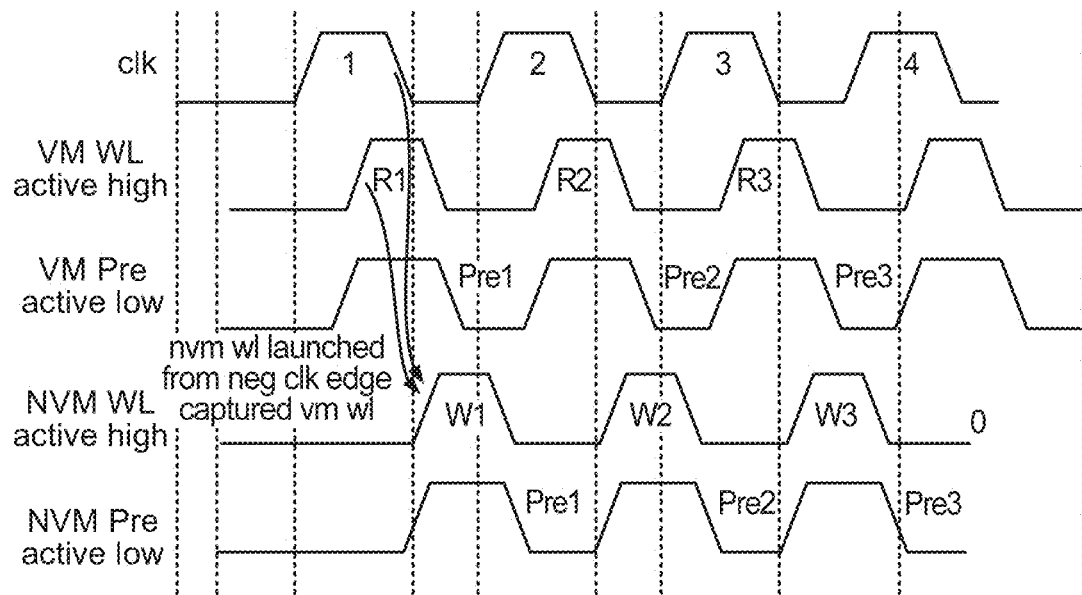
FIGS. 7A and 7B are diagrams illustrating timing of operations to copy states between volatile memory bitcells and non-volatile memory bitcells according to an embodiment.

As may be observed from FIG. 7A, a leading edge of wordline signal W1 for access of bitcells in array of non-volatile memory bitcells 506 may occur at a trailing edge of a clock pulse in an immediately preceding clock cycle. A VM Pre active low signal may be asserted low after the wordline signal R1 is de-asserted or returns low following the write operation occurring during assertion of wordline voltage signal R1.

As pointed out above in connection with FIGS. 3A and 3B, volatile memory bus 326 and non-volatile memory bus 328 may have different bus widths (e.g., wherein one bus width is an integer multiple of the other bus width). Similarly, bus 550 may comprise a bus width to access volatile memory array 504 that is different from a bus width to access non-volatile memory array 506. In a particular numerical example implementation, non-volatile memory array 506 may be accessed with a bus width of 64-bits while volatile memory array 504 may be accessed with a bus width of 16-bits such that 64-bits may be transferred between non-volatile memory array 506 and volatile memory array 504 on four memory cycles of volatile memory array 504 and a single memory cycle of non-volatile memory array 506. It should be understood that this is merely one particular numerical example and that different width may be implemented (e.g., with non-integer widths, bus width to access volatile memory array 504 being wider than a bus width to access non-volatile memory array 506) without deviating from claimed subject matter. In this particular example, I/O circuitry 516 may comprise a 4×1 column multiplexer (not shown) to facilitate transfer of four 16-bit words of volatile memory array 504 between a single 64-bit word of non-volatile memory array 506. Similarly, there may be a data in port (not shown) in I/O circuitry 518. This data in port may have a width of 16-bits, or may have a width of 64-bits. To support such a transfer of 64-bits in a single transaction of non-volatile memory array 506 and four transactions of volatile memory array 504, a corresponding buffer 514 may maintain or latch a particular access signal on a wordline 508 at an active state (e.g., at a constant voltage) while an access signal on a wordline 520 cycles between pre-charge and active phases for four transactions.

To support transfer of stored values between volatile memory bitcells 504 and non-volatile memory bitcells 506 in the case where the bus width to access non-volatile memory bitcells 506 is four times that of the bus width to access volatile memory bitcells 504, a buffer 514 may further comprise a latch to maintain an access signal on a decoded wordline 508 for selected non-volatile memory bitcells 506. For example, such an access signal may be maintained on a decoded wordline 508 until data comprising a complete non-volatile bus width has been read from selected volatile memory bitcells 504. In the above example in which a bus width to access volatile memory bitcells 504 is 16-bits and a bus width to access non-volatile memory bitcells 506 is 64-bits, sixty four bits of data may be stored in volatile memory bitcells 504 on the same wordline 520 or row (and thus a decoder address may be unchanged) but across a column address width of 4-bits. If column addresses of volatile memory bitcells 504 are to be decoded according to an eight to one encoding scheme, the column multiplexer may select one of eight columns while a wordline 520 is selected. In three subsequent accesses of volatile memory bitcells 504 on the selected wordline 520, the same row address may be accessed while a column address may cycle from bit 0 to bit 1 ... ending on bit 3. In this manner accesses of volatile memory bitcells 504 may occur in four access cycles while using the same row address. For each such an access cycle, 16-bits may be read from or written to via bus 550. While a row address may remain the same, a buffer 514 (which may comprise a latch as discussed above) may maintain a value of decoded wordline 508 so that the row is selected for the selected volatile memory bitcells 506.

In one implementation for accessing selected non-volatile memory bitcells 506 in a write operation in connection with four corresponding cycles to access selected volatile memory bitcells 504, selected non-volatile memory bitcells 506 may be accessed through write operations in four different cycles. In an alternative implementation, a write buffer in I/O circuitry 516 (not shown) may accumulate a full 64-bits prior to enabling a wordline 506 for a write operation applied to the selected non-volatile memory bitcells 506. Controls for this wordline 508 may comprise a combination of self-timed and clock signals depending upon a particular implementation. Therefore, features of a buffer 514 may support a case in which a bus width to access volatile memory bitcells 504 and a bus width to access non-volatile memory bitcells 506 are not equal.

Figure 6:
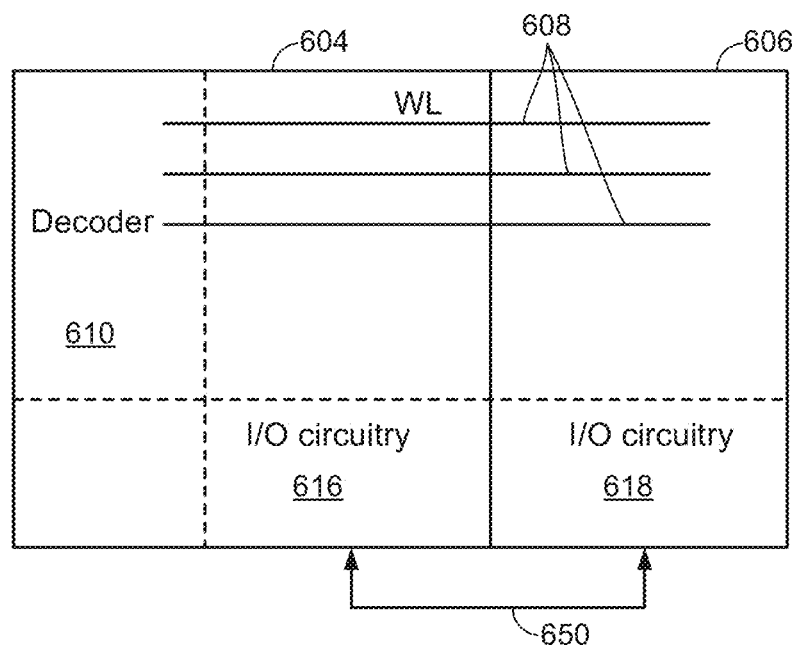

In the particular implementations of FIGS. 5 and 6, volatile memory bitcells are shown to be adjacent to a decoder circuit and non-volatile memory bitcells are shown to be (or flanked by the decoder and non-volatile memory bitcells). In an alternative embodiment to the implementations of FIGS. 5 and 6, non-volatile memory bitcells may be formed to be adjacent to (and flanked by) both a decoder circuit and volatile memory bitcells. Here, a buffer circuit may also be used to reshape an access signal applied to a wordline connected to the volatile memory bitcells (e.g., instead of reshaping an access signal applied to a wordline connected to the non-volatile memory bitcells).

FIG. 6 is a schematic diagram of an alternative embodiment in which wordlines 608 may be used to access bitcells in array of volatile memory bitcells 604 and the array of non-volatile memory bitcells 606 for read and write operations. As in the embodiment of FIG. 5 in which a voltage on a single wordline may be asserted by decoder 510 to access non-volatile memory bitcells 506 and volatile memory bitcells 504 (e.g., through a corresponding buffer 514), decoder 610 may comprise a "shared decoder circuit" to assert a voltage signal on a single wordline 608 to access bitcells in array of volatile memory bitcells 604 and the array of non-volatile memory bitcells 606. Also, decoder 610 may employ the same word address bus for accessing bitcells in array of volatile memory bitcells 604 and the array of non-volatile memory bitcells 606. Bus 650 coupled between I/O circuitry 616 and 618 may facilitate copying of memory states (or transferring of corresponding stored values) between one or more volatile memory bitcells 604 and non-volatile memory bitcells 606. For example, bus 650 may comprise an address portion identifying target bitcells to be affected by a write operation and a data portion (e.g., having a data bus width) to transmit one or more signals indicative of memory states obtained in a read operation to be written to the target bitcells in the write operation.

In an implementation, data bus widths of bus 650 between I/O circuitry 616 and I/O circuitry 618 may be same. Alternatively, a data bus width at I/O circuitry 616 may be an integer multiple of a bus width at I/O circuitry 618, or a data bus width at I/O circuitry 618 may be an integer multiple of a bus width at I/O circuitry 616. For simplicity of this discussion, data bus widths at I/O circuitry 616 and I/O circuitry 618 are presumed to be the same (e.g., same number of bits or bytes). It should be understood, however, that data bus widths at I/O circuitry 616 and I/O circuitry 618 may be different without deviating from claimed subject matter. For example, if I/O circuitry 616 has a data bus width that is an integer multiple of a data bus width of I/O circuitry 618, transfer of values between I/O circuitry 616 and I/O circuitry 618 may entail a single access cycle for I/O circuitry 616 and the integer multiple access cycles for I/O circuitry 618. In other implementations, however, use of read or write masks may enable a bus width of I/O circuitry 616 that is not necessarily an integer multiple of bus width of I/O circuitry 618.

In the particular embodiment of FIG. 6, bitcells in array of volatile memory bitcells 604 and bitcells in array of non-volatile memory bitcells 606 may be simultaneously accessed by assertion of a single wordline 608. In other words, a single wordline 608 may be used to access corresponding bitcells in both arrays 604 and 606 without a buffer (e.g., buffer 514) connecting a first bitline to access bitcells in array 604 and a second bitline in to access bitcells in array 606. Employing the same wordline decoding scheme for accessing bitcells in array of volatile memory bitcells 604 and the array of non-volatile memory bitcells 606, the embodiment of FIG. 6 may enable a tighter coupling between bitcells in array 604 and bitcells in array 606. In particular implementations, embodiments of FIG. 5 or FIG. 6 may enable a read modify write implementation that would potentially shorten a latency to copy memory states between non-volatile memory bitcells (e.g., of array 504 or 604) and volatile memory bitcells (e.g., of array 506 or 606).

In some implementations, copying or transferring a quantity of multiple memory states or stored values (e.g., a "packet" such as byte or word) between non-volatile memory bitcells and volatile memory bitcells may entail a minimum of two memory cycles (e.g., two memory clock cycles). For example, a read operation on a portion of a first memory to detect memory states may consume a first memory cycle and a subsequent operation to write the detected memory states to a portion of a second memory may consume a second memory cycle. Accessing a first memory to read and a second memory to write may entail additional time to restore bitline voltages.

With a shared wordline 608 as illustrated in FIG. 6, it may be possible to assert a voltage signal on the shared wordline 608 to perform a read operation to detect memory states in a first array, and then maintain the voltage signal continuously while performing an operation to write the detected memory states to a second array. Here, while shared wordline 608 is asserted to access bitcells in array of volatile memory bitcells 604 and bitcells in array of non-volatile memory bitcells 608, I/O circuitry 616 and I/O circuitry 618 may perform read and write operations within the same memory cycle. If copying memory states from selected bitcells in array of volatile memory bitcells 604 to selected bitcells in array of non-volatile memory bitcells 606, in the same memory clock cycle sense amplifiers of I/O circuitry 616 may detect memory states of the selected bitcells in the array of volatile memory bitcells 604, and write driver circuits of I/O circuitry 618 may apply programming signals to the selected bitcells of array of non-volatile memory bitcells 606 to write the detected memory states. Similarly, if copying or transferring memory states or stored values from selected bitcells in array of non-volatile memory bitcells 606 to selected bitcells in array of volatile memory bitcells 604, bus 650 in the same memory clock cycle sense amplifiers of I/O circuitry 618 may detect memory states of the selected bitcells in the array of non-volatile memory bitcells 606 and write driver circuits of I/O circuitry 616 may apply programming signals to the selected bitcells of array of volatile memory bitcells 604 to write values corresponding to the detected memory states.

Figure 7B:
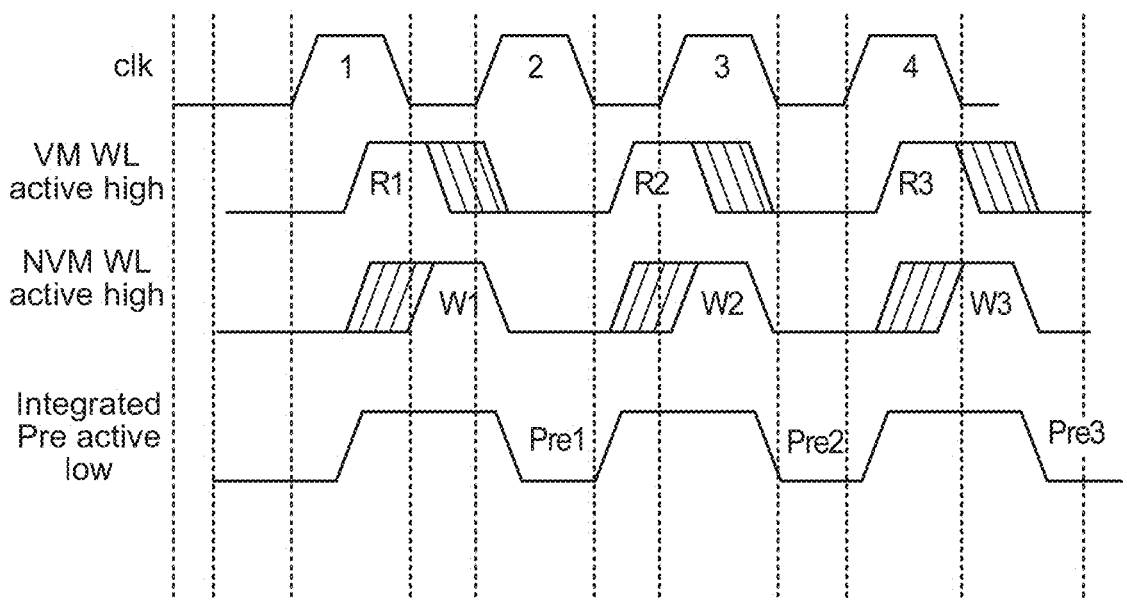

According to an embodiment, voltages of bitlines connecting bitcells in array of volatile memory bitcells 604 to I/O circuitry 616 and connecting bitcells in array of non-volatile memory bitcells 606 to I/O circuitry 618 may be restored following read or write operations. As pointed out above in an implementation, read and write operations to copy memory states between volatile memory bitcells 604 and non-volatile memory bitcells may occur in a single clock cycle. Accordingly, this particular two-part access procedure (read operation to detect a memory state of selected bitcells and write operation to place selected bitcells in the detected memory state) may be performed in a single memory access cycle. Accordingly, voltages on bitlines connecting affected bitcells and I/O circuitry 616 and 618 may be restored in a single period following the single clock cycle to perform the read and write operations. In the timing diagram of FIG. 7B illustrating a particular example, a read operation to detect memory states of a first memory followed by an operation to write the detected memory states to a second memory may occur in a cycle time that is 1.5 times that of a memory cycle for accessing non-volatile memory bitcells in array 604 (e.g., assuming that a duration for a read operation to detect memory states in bitcells of array 604 and a duration for a subsequent operation to write the detected memory states to bitcells in array 606 are approximately the same). Here, FIG. 7B shows that a voltage signal on a wordline connected to non-volatile memory bitcells and volatile memory bitcells is raised following a leading edge of a first clock pulse and lowered following a leading edge of the next clock pulse. While the voltage signal on the wordline is raised, a read operation R1 detects memory states of volatile memory bitcells and a subsequent write operation W1 may write values corresponding to the detected states to non-volatile memory bitcells. Bitline voltages for read operation R1 and write operation W1 may then be restored in a single memory access cycle following a lowering of the voltage signal on the wordline. In other embodiments, a duration to access bitcells in a non-volatile memory array may be longer than a duration to access bitcells in a volatile memory array. Accordingly, the particular implementation of FIG. 7A may reflect a trade-off between a slower cycle time for a smaller area and power.

The specific implementation of FIG. 6 shows that volatile memory bitcells 604 are configured to be between decoder 610 and non-volatile memory bitcells 606, with decoder 610 and non-volatile memory bitcells 606 flanking volatile memory bitcells 604. In an alternative implementation, decoder 610 may be configured to be placed between two physically separate portions of volatile memory bitcells 604 flanking the decoder 610, and two physically separate portions of non-volatile memory bitcells 606 flanking the physically separate portions of volatile memory bitcells 604 in a "butterfly configuration." Here, decoder circuit 610 may apply access signals directly to wordlines connected to selected bitcells in either separate portion of volatile memory bitcells 604. Also, an access signal applied to a wordline connected to a particular separate portion of volatile memory bitcells 604 may access bitcells in a particular portion of non-volatile memory bitcells 606.

In another alternative implementation (also not shown), volatile memory bitcells 604, non-volatile memory bitcells 606, decoder 610, I/O circuitry 616 and I/O circuitry 618 may be further configured to be in a "four quadrant" butterfly configuration. Here, in the aforementioned butterfly configuration, each physically separate portion of volatile memory bitcells 604 may be further partitioned or bifurcated into two additional portions such that a portion of I/O circuitry 616 may be formed between the two portions of the physically separate portion of volatile memory bitcells 604. Similarly, each physically separate portion non-volatile memory bitcells 606 may be further partitioned or bifurcated into two additional portions such that a portion of I/O circuitry 618 may be formed between the two portions of the physically separate portions of non-volatile memory bitcells 606.

In yet another alternative implementation (also not shown), decoder 610 may be configured to be between volatile memory bitcells 604 and non-volatile memory bitcells 606 such that volatile memory bitcells 604 and non-volatile memory bitcells 606 flank decoder 610 in an "asymmetric butterfly configuration." Here, decoder circuit 610 may apply signals directly to wordlines connected to selected bitcells in volatile memory access bitcells 604 or to selected non-volatile memory bitcells 606.

Figure 8:
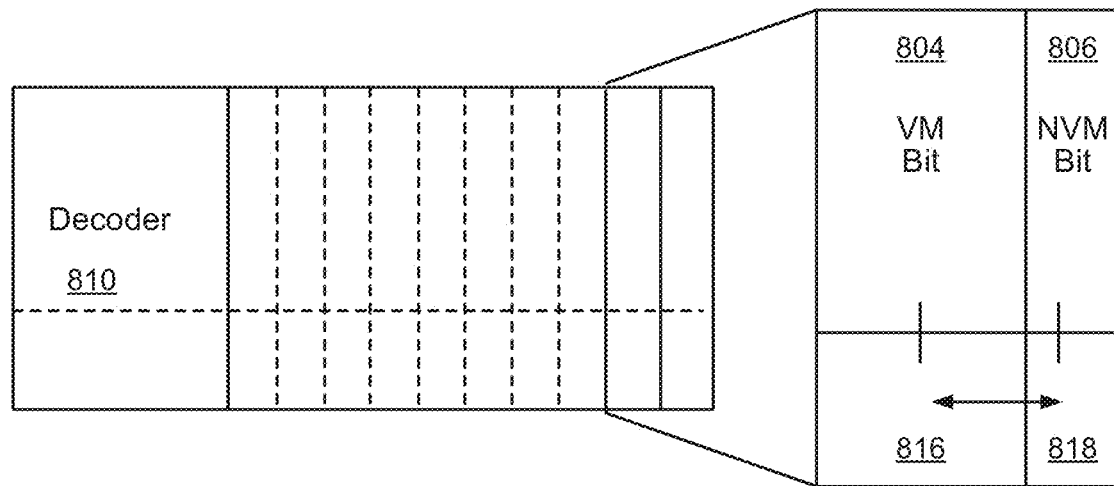
FIG. 8 is a schematic diagram of a memory system integrating volatile memory bitcells and non-volatile memory bitcells according to an embodiment.

FIG. 8 is a schematic diagram of a memory system integrating volatile memory bitcells and non-volatile memory bitcells according to an embodiment. Here, volatile memory bitslice 804 may comprise one or more volatile memory bitcells interleaved with non-volatile memory bitcells of non-volatile memory bitslice 806. In an implementation, corresponding volatile memory bitcells of volatile memory bitslice 804 and adjacent or local non-volatile memory bitcells of non-volatile memory bitslice 806 may be accessed responsive to a single voltage asserted on a wordline as discussed above in connection with FIGS. 5, 6, 7A and 7B. For example, memory states or stored values in one more bitcells of volatile memory bitslice 804 may be copied or transferred to one or more bitcells of non-volatile memory bitslice 806 based on a read operation performed at I/O circuitry 816 to detect memory states of the one or bitcells of array of volatile memory bitcells 804, and a write operation performed by I/O circuitry 818 to write values corresponding to the one or more detected memory states.

In some implementations, transferring stored values between volatile and non-volatile memory bitcells (e.g., as discussed above in connection with FIGS. 5 and 6) may increase or stress memory bus requirements. The particular implementation of FIG. 8, on the other hand, may enable transfer of stored values between adjacently formed volatile and not-volatile memory bitcells without accessing a memory bus coupled between a uniform array of volatile memory bitcells (e.g., volatile memory array 504 or 604) and a uniform array of non-volatile memory bitcells (e.g., non-volatile memory array 506 or 606). As shown in FIG. 8, stored values may be transferred between one or more bitcells of bitslice of volatile memory bitcells 804 and one or more bitcells of bitslice of non-volatile memory bitcells 806.

In one embodiment, I/O circuitry 816 may comprise a read circuit connected to the one or more common first bitlines to detect a value stored in the in a selected volatile memory bitcell of volatile memory bitslice 804 and I/O circuitry 818 may comprise a write driver circuit connected to the one or more common second bitlines to generate a programming signal to store a value corresponding to the detected value in a selected non-volatile memory bitcell of non-volatile memory bitslice 806. Here, values stored in one or more volatile memory bitcells of volatile memory bitslice 804 may be transferred to one or more non-volatile memory bitcells of non-volatile memory bitslice 806 with a simple read-modify-write transaction and without accessing an external bus device. Similarly, I/O circuitry 818 may comprise a read circuit connected to the one or more common first bitlines to detect a value stored in the in a selected non-volatile memory bitcell of non-volatile memory bitslice 806 and I/O circuitry 816 may comprise a write driver circuit connected to the one or more common second bitlines to generate a programming signal to store a value corresponding to the detected value in a selected volatile memory bitcell of volatile memory bitslice 804. Here, values stored in one or more volatile memory bitcells of non-volatile memory bitslice 806 may be transferred to one or more non-volatile memory bitcells of volatile memory bitslice 804 with a simple read-modify-write transaction without accessing an external bus device.

In one implementation, bitslice of volatile memory bitcells 804 or bitslice of non-volatile memory bitcells 806 may comprise a single bit "column slice" of bitcells connected to a single bitline and selectable by a wordline, or multiple bits coupled to multiple corresponding bitlines selectable by a single wordline. In one embodiment in which either bitslice 804 or bitslice 806 comprises multiple bitcells accessible by a single wordline, a multiplexer (not shown) may be used to connect a bitline of a selected bitcell (e.g., selected among multiple bitcells accessible by a wordline), to read a circuit or a write circuit to effect a transfer of a stored value between the selected bitcell and another bitcell as discussed above. In a particular implementation, a first multiplexer may facilitate transfer of stored values from bitslice 804 to bitslice 806, and a second multiplexer may facilitate transfer of stored values from bitslice 806 to bitslice 804. For example, widths of the first and second multiplexers may not be necessarily equal if a number of bitlines connected to bitslice 804 is not equal to a number of bitlines connected to bitslice 806.

Figure 9:
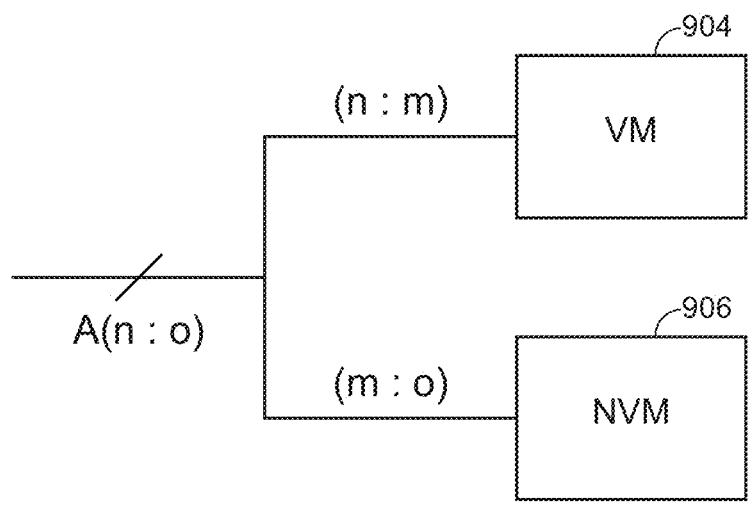
FIG. 9 is a schematic diagram illustrating an addressing scheme integrating volatile memory bitcells and non-volatile memory bitcells according to an embodiment.

FIG. 9 is a schematic diagram illustrating an addressing scheme integrating volatile memory bitcells and non-volatile memory bitcells according to an embodiment. Such an addressing scheme may be implemented, for example, in a decoder circuit (e.g., decoder circuit 510 or decoder 610) for selecting bitcells to be accessed for a read or write operation. In an implementation, a physical address A may range from a value n through o. For example, addressable portions (e.g., fixed length words) in an array of volatile memory bitcells (e.g., arrays of volatile memory bitcells 504 or 604) may be accessed according to addresses in a range of values n to m. Similarly, addressable portions in an array of non-volatile memory bitcells (e.g., arrays of non-volatile memory bitcells 506 or 606) may be accessed according to addresses in a range of values above m to o.

According to an embodiment, physical address A ranging from value n through o may represent an encoded address or a decoded address. For example, if an encoded address bus is written as A<0:5>, six bits <0>, <1> . . . <5> may be decoded or expanded into 64 signals representing an address, say WL<0:63>. In a particular implementation, an address space WL<0:63> may be partitioned into volatile memory and non-volatile memory components. For example, WL<0:15> may be dedicated for accessing non-volatile memory components and WL<16:63> may be dedicated for accessing volatile memory components.

In another embodiment in which physical address A ranging from value n through o represents a decoded address, overlapping portions of a bus may be used to access either volatile memory or non-volatile memory. For example, address WL<0:31> may access NVM while address WL<16:63> may access VM. Address WL<16:31>, while accessed, may be used to read/write from/into both VM and NVM.

Figure 10:
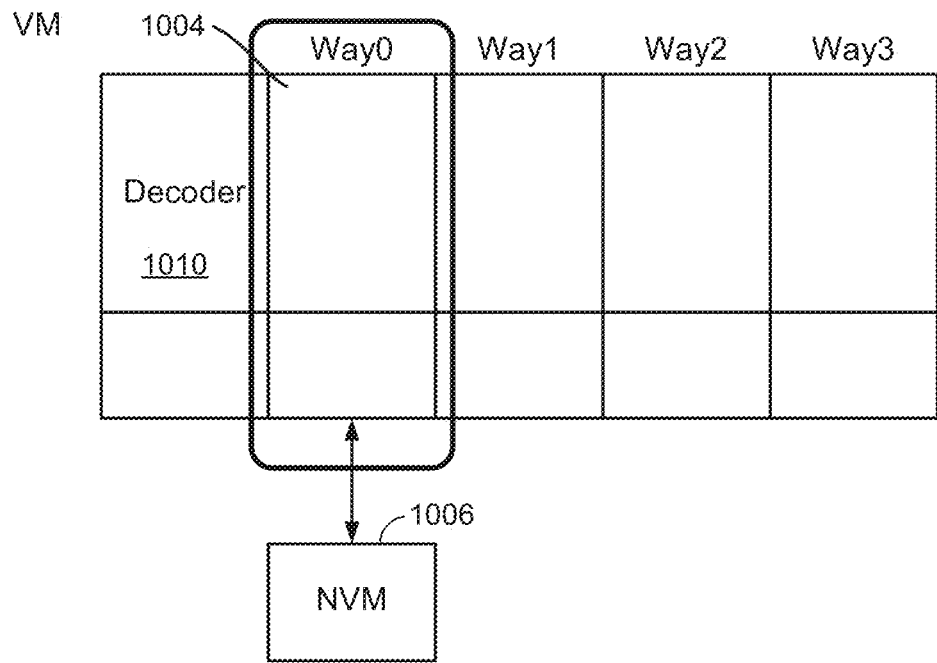
FIG. 10 is a schematic diagram integrating a smaller array of non-volatile memory bitcells with a larger array of volatile memory bitcells according to an embodiment.

Embodiments of FIGS. 5 and 6 are directed to a coupling of arrays of volatile memory bitcells and non-volatile memory bitcells to facilitate copying of memory states (or transferring stored values) between the arrays of volatile memory bitcells and non-volatile memory bitcells. According to an embodiment, FIG. 10 is a schematic diagram integrating only a portion of array of volatile memory bitcells 1004 with array of non-volatile memory bitcells 1006. In this particular implementation, array of volatile memory bitcells 1004 may be formed as a cache memory in a computing platform partitioned into cache "ways" Way0, Way1, Way2 and Way3. As shown, array of non-volatile memory bitcells 1006 may be coupled to Way0 to facilitate copying of memory states between non-volatile memory bitcells 1006 and Way0. In an alternative implementation as shown in FIG. 11, only a portion of array of non-volatile memory bitcells 1106 is coupled with array of non-volatile memory bitcells 1104.

Figure 11:
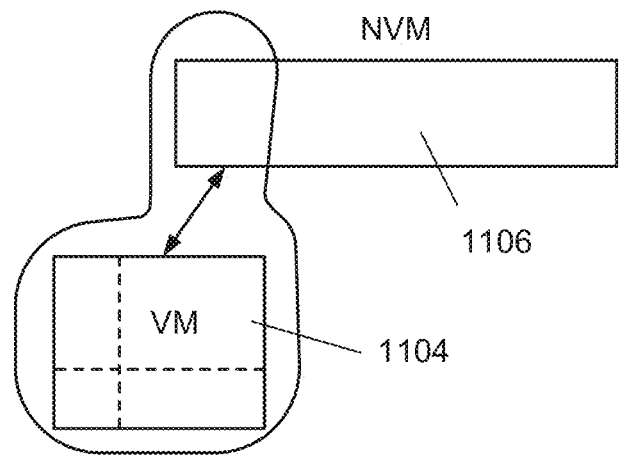
FIG. 11 is a schematic diagram integrating a smaller array of volatile memory bitcells with a larger array of non-volatile memory bitcells according to an embodiment.

In the particular implementations of FIGS. 10 and 11, addresses for accessing volatile or non-volatile memory bitcells may be subsets of one another. For example, as shown in FIG. 10, addresses for accessing volatile memory 1004 (e.g., for portions of cache) may be a subset of addresses for accessing portions of non-volatile memory 1006. Similarly, as shown in FIG. 11, addresses for accessing non-volatile memory 1106 may be a subset of addresses for accessing portions of volatile memory 1104.

Figure 12:
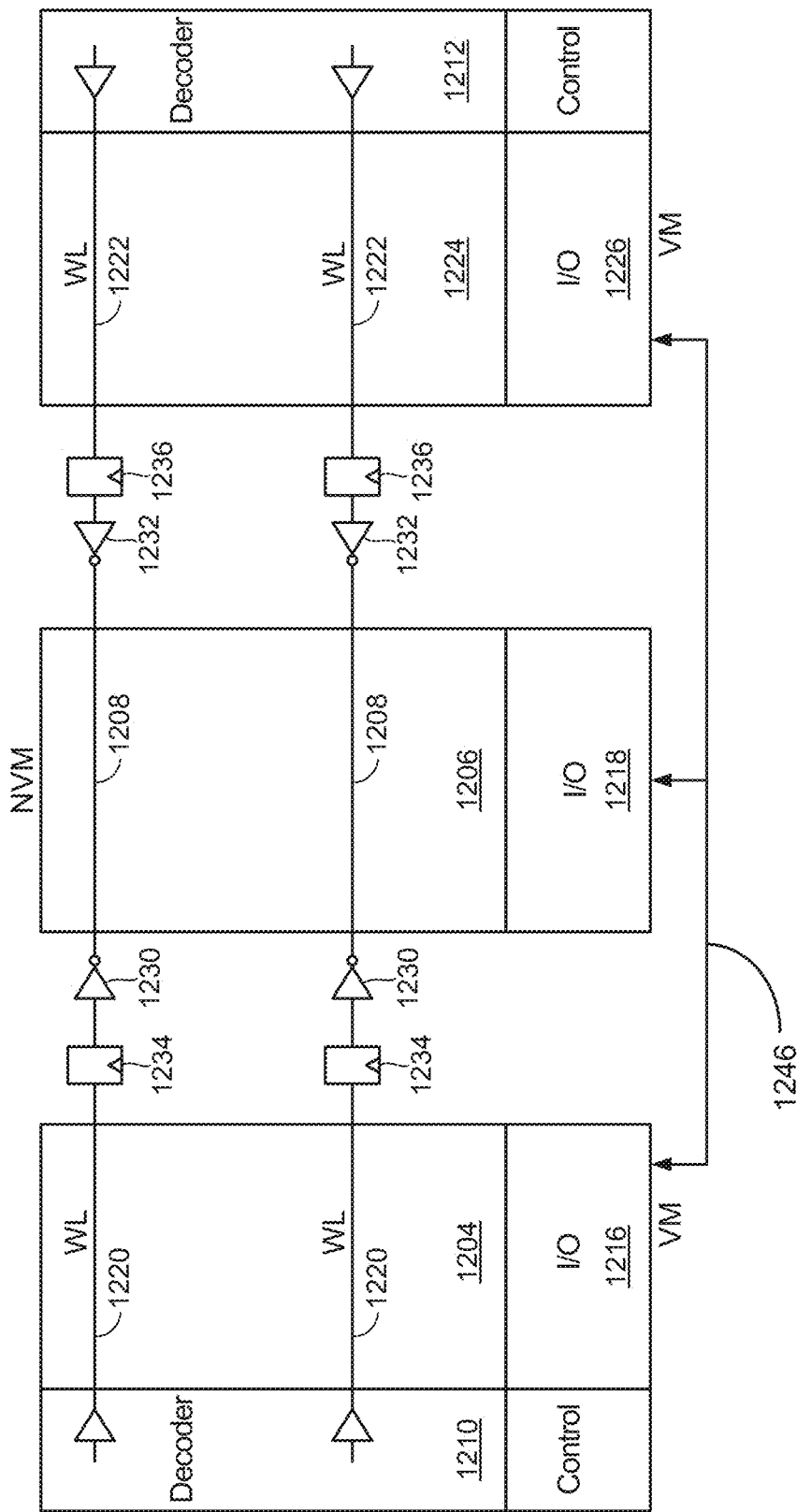
FIG. 12 is a schematic diagram illustrating an interleaving of volatile memory bitcells and non-volatile memory bitcells according to an embodiment.

Embodiments discussed above in connection with FIGS. 5 and 6 are directed to copying memory states between non-volatile memory bitcells and volatile memory bitcells by asserting a single access signal on a wordline to access non-volatile memory bitcells and volatile memory bitcells (e.g., by asserting a single access signal on a wordline 608 connected to selected bitcells in volatile memory array 604 and selected bitcells in non-volatile memory array 606, or by asserting a single access signal on a wordline 504 to access selected bitcells of volatile memory array 504 such that a corresponding wordline 508 is asserted through a buffer 514 to access selected bitcells of non-volatile memory array 506). FIG. 12 is a schematic diagram illustrating an interleaving of volatile memory bitcells and non-volatile memory bitcells according to an embodiment. In particular, an array of non-volatile memory bitcells 1206 is coupled to two arrays of volatile memory bitcells 1204 and 1224. According to an embodiment, memory states may be copied (or corresponding stored values transferred) between array of non-volatile memory bitcells 1206 and either array of volatile memory bitcells 1204 or array of volatile memory bitcells 1224.

In one implementation, bitcells in array of volatile memory bitcells 1204 may be accessed for a read operation responsive to a voltage signal applied to a first wordline 1220 such that memory states are detected by I/O circuitry 1216. Bitcells in array of non-volatile memory bitcells 1206 may be subsequently accessed for a write operation responsive to a second wordline signal applied to a wordline 1208 to copy memory states detected by I/O circuitry 1216. For example, the wordline 1208 may be coupled to the wordline 1220 through at least a tri-state buffer 1230 and possibly an optional flip-flop circuit 1234. Similar actions may be performed to copy memory states detected in bitcells of array of volatile memory bitcells 1224 to bitcells in array of non-volatile memory bitcells 1206 facilitated by tri-state buffer 1232 and possibly flip-flop circuit 1236, or to copy memory states detected in bitcells of array of non-volatile memory bitcells 1206 to bitcells of either array of volatile memory bitcells 1204 or 1224.

According to an embodiment, tristate buffers 1230 may isolate array of volatile memory bitcells 1204 while copying memory states between array of non-volatile memory bitcells 1206 and array of volatile memory bitcells 1224. For example, during read and write operations to copy memory states between bitcells in array of non-volatile memory bitcells 1206 and array of volatile memory bitcells 1224, tristate buffers 1230 may disconnect wordlines 1220 from wordlines 1208 and tristate buffers 1232 may connect selected wordlines 1208 and 1222. Similarly, tristate buffers 1232 may isolate array of volatile memory bitcells 1224 while copying memory states between array of non-volatile memory bitcells 1206 and array of volatile memory bitcells 1204. For example, during read and write operations to copy memory states between bitcells in array of non-volatile memory bitcells 1206 and array of volatile memory bitcells 1204, tristate buffers 1230 may disconnect wordlines 1220 from wordlines 1208 and tristate buffers 1232 may connect selected wordlines 1208 and 1222.

As pointed out above, the embodiment of FIG. 12 may include optional flip-flop circuits 1234 and 1236 to enable pipelining of operations to copy memory states between bitcells in array of non-volatile memory bitcells 1206 and bitcells in array of volatile memory bitcells 1204 or 1224. For example, during a read operation to detect memory states of selected bitcells in array of bitcells 1204, a rising edge voltage on a wordline 1220 may couple the selected bitcells to I/O circuitry 1216. In response to the rising edge voltage on wordline 1220, a flip-flop circuit 1234 may apply a voltage signal on a wordline 1208 to decouple corresponding bitcells in array of non-volatile memory bitcells 1206 from I/O circuitry 1218. Following completion of the read operation, a falling edge of a voltage on the wordline 1220 applied to the flip-flop circuit 1234 may change the voltage on the wordline 1208 so as to couple the corresponding bitcells array of non-volatile memory bitcells 1206 from I/O circuitry 1218 for a write operation.

According to an embodiment, tristate buffers 1230 and 1232 may additionally comprise level shifters to enable application of different wordline voltages to access volatile memory (on wordlines 1220 or 1222) and to access non-volatile memory on wordlines 1208. Also, non-volatile memory bitcells of 1206 may be accessed by signals originating at either decoder 1210 or decoder 1212. If transferring values between volatile memory bitcells 1204 and non-volatile memory bitcells 1206, for example, a voltage on a wordline 1208 may be affected to access non-volatile memory bitcells 1206 responsive to decoder circuit 1210. Likewise, if transferring values between volatile memory bitcells 1224 and non-volatile memory bitcells 1206, for example, a voltage on a wordline 1208 may be affected to access non-volatile memory bitcells 1206 responsive to decoder circuit 1212.

Figure 13A:
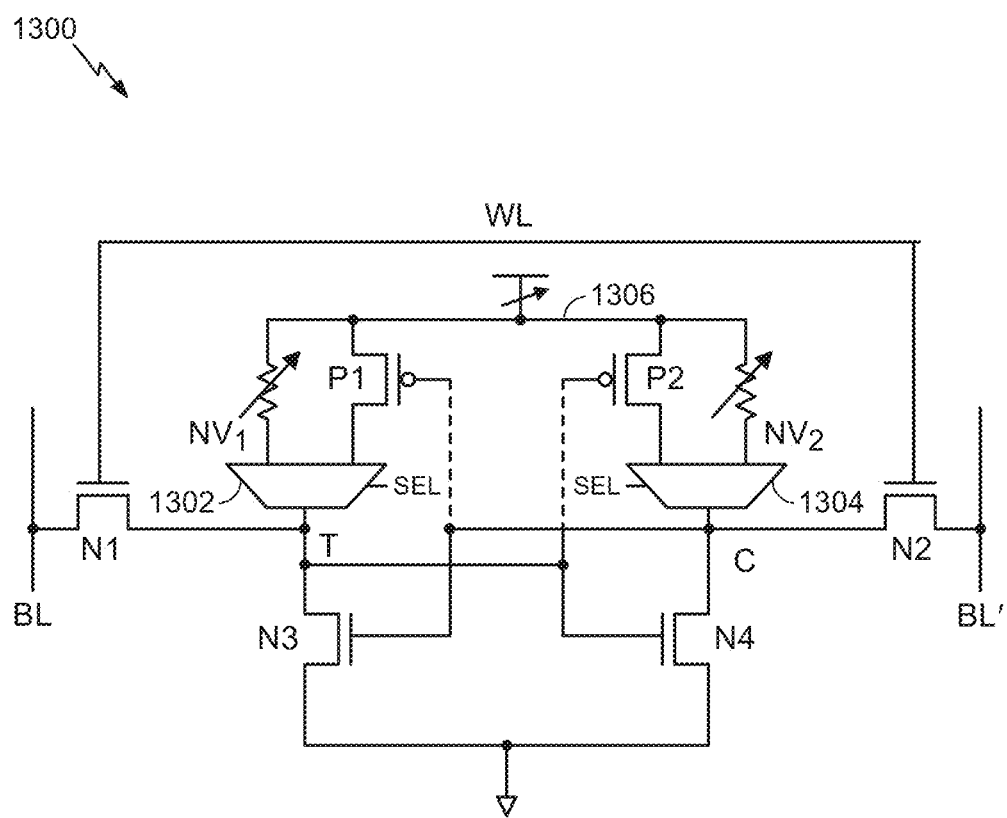
FIGS. 13A through 13E are schematic diagrams of a bitcell circuit comprising volatile memory elements and non-volatile memory elements according to an embodiment.

FIG. 13A is a schematic diagram of a bitcell circuit 1300 comprising volatile memory elements and non-volatile memory elements according to an embodiment. Bitcell circuit 1300 comprises two non-volatile memory elements $NV_1$ and $NV_2$, and two volatile memory elements formed in part by PFETs P1 and P2. Non-volatile memory elements $NV_1$ and $NV_2$ may be formed using any one of several different types of non-volatile memory devices including, for example, flash memory devices, correlated electron memory devices, phase change memory (PCM) devices, magnetic memory devices, just to provide a few examples. A voltage source 1306 is coupled to first terminals of non-volatile memory elements $NV_1$ and $NV_2$, and PFETs P1 and P2. Multiplexers 1302 and 1304 may selectively couple either second terminals of non-volatile memory elements $NV_1$ and $NV_2$ or second terminals of PFETs P1 and P2 to latch nodes T and C depending on whether bitcell circuit 1300 is to operate in a volatile memory mode or a non-volatile memory mode. In a particular implementation, multiplexers 1302 and 1304 may selectively couple either second terminals of non-volatile memory elements $NV_1$ and $NV_2$ or second terminals of PFETs P1 and P2 to latch nodes T and C responsive to a state of a selection signal SEL. In one example, selection signal SEL may comprise a single signal input. In another example, selection signal SEL may comprise multiple signal inputs on a bus In a particular implementation, to enable appropriate transition to a volatile memory mode, multiplexers 1302 and 1304 may transition connection of latch nodes T and C from non-volatile memory elements $NV_1$ and $NV_2$ to second terminals of PFETs P1 and P2 such that latch nodes T and C may be connected to second terminals of PFETs P1 and P2 prior to disconnection of latch nodes T and C from non-volatile memory elements $NV_1$ and $NV_2$.

In one implementation, bitcell circuit 1300 may be employed in a device that transitions between a powered up and powered down state. Here, it may be desirable to a preserve a particular memory state of volatile memory elements as the device transitions to a powered down state such that the particular memory state may be restored at a future time when the device transitions back to a powered up state. For example, as the device transitions to a powered down state, it may be desirable to copy a current state of non-volatile memory elements to non-volatile memory elements $NV_1$ and $NV_2$. This may comprise, for example, read operations to detect states of the non-volatile memory elements followed by operations to write the detected states to non-volatile memory elements $NV_1$ and $NV_2$.

In another example, as the device transitions from a powered down state to a powered up state, it may be desirable to copy or transfer a current state of non-volatile memory elements $NV_1$ and $NV_2$ to non-volatile memory elements. This may comprise, for example, read operations to detect states of the non-volatile memory elements $NV_1$ and $NV_2$ followed by write operations to store the detected states to volatile memory elements.

According to an embodiment, bitcell circuit 1300 may transfer or copy values stored in non-volatile memory elements $NV_1$ and $NV_2$ to non-volatile memory elements during a power up operation (e.g., power on reset). This may occur, for example, while FETs N1 and N2 are open (e.g., while signal WL is low) such that the bitcell circuit is disconnected from bitlines BL and BL'. In a particular implementation, non-volatile memory elements $NV_1$ and $NV_2$ may store a value, parameter, condition or symbol as a complementary resistance state or impedance state. In other words, non-volatile memory elements $NV_1$ and $NV_2$ may store a first value, parameter, condition or symbol by having $NV_1$ in a high impedance/resistance state and $NV_2$ in a low impedance/resistance state, and may store a second value, parameter, condition or symbol by having $NV_1$ in a low impedance/resistance state and $NV_2$ in a high impedance/resistance state. As power is applied at voltage source 1306, multiplexer 1302 may connect a terminal of $NV_1$ to node T (while disconnecting PFET P1 from node T) and multiplexer 1304 may connect a terminal of $NV_2$ to node C (while disconnecting PFET P2 from node C). Multiplexer 1302 may then connect PFET P1 to node T and multiplexer 1304 may connect PFET P2 to node C. If $NV_1$ is in a high impedance/resistance state and $NV_2$ is in a low impedance/resistance state (e.g., to store the first value, parameter, condition or symbol), node C may be placed at a higher voltage than node T, causing PFET P1 to be open and causing PFET P2 to be closed as part of a latch circuit including PFETs P1 and P2, and NFETs N3 and N4. Conversely, if $NV_1$ is in a low impedance/resistance state and $NV_2$ is in a high impedance/resistance state (e.g., to store the second value, parameter, condition or symbol), node C may be placed at a lower voltage than node T, causing PFET P1 to be closed and causing PFET P2 to be open. Following connection of PFETs P1 and P2 to nodes T and C, respectively, multiplexer 1302 may disconnect non-volatile memory element $NV_1$ from node T and multiplexer 1304 to disconnect $NV_2$ from node C, allowing bitcell circuit 1300 to operate as a volatile memory bitcell. In a particular implementation, while bitcell circuit is operating in non-volatile mode (while non-volatile memory elements $NV_1$ and $NV_2$ are connected to nodes T and C, respectively) voltages at nodes T and C may represent values stored in non-volatile memory elements $NV_1$ and $NV_2$, respectively. Similarly, while bitcell circuit is operating in a volatile mode (while non-volatile memory elements $NV_1$ and $NV_2$ are disconnected from nodes T and C, respectively) voltages at nodes T and C may represent values stored in volatile memory elements. Further, voltages at nodes T and C represent values that may be transferred between non-volatile memory elements $NV_1$ and $NV_2$, and volatile memory elements formed in part by PFETs P1 and P2.

Figure 13B:
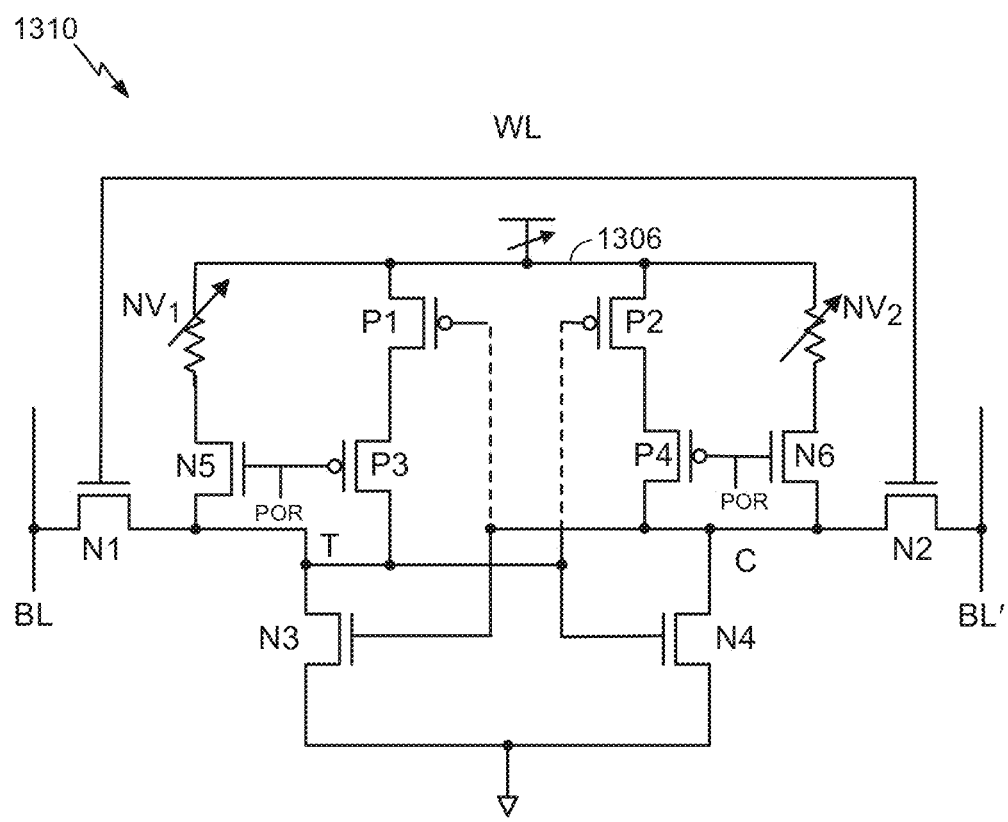

FIG. 13B is a schematic diagram of a specific implementation of bitcell circuit 1300 shown as bitcell circuit 1310 in which multiplexer 1302 is implemented as NFET N5 and PFET P3, and multiplexer 1304 is implemented as NFET N6 and PFET P4. Here, bitcell circuit 1310 may be switchable between operation in a volatile memory mode by lowering a voltage of signal power-on-reset (POR) and operation in a non-volatile memory mode by raising a voltage of signal POR.

Figure 13C:
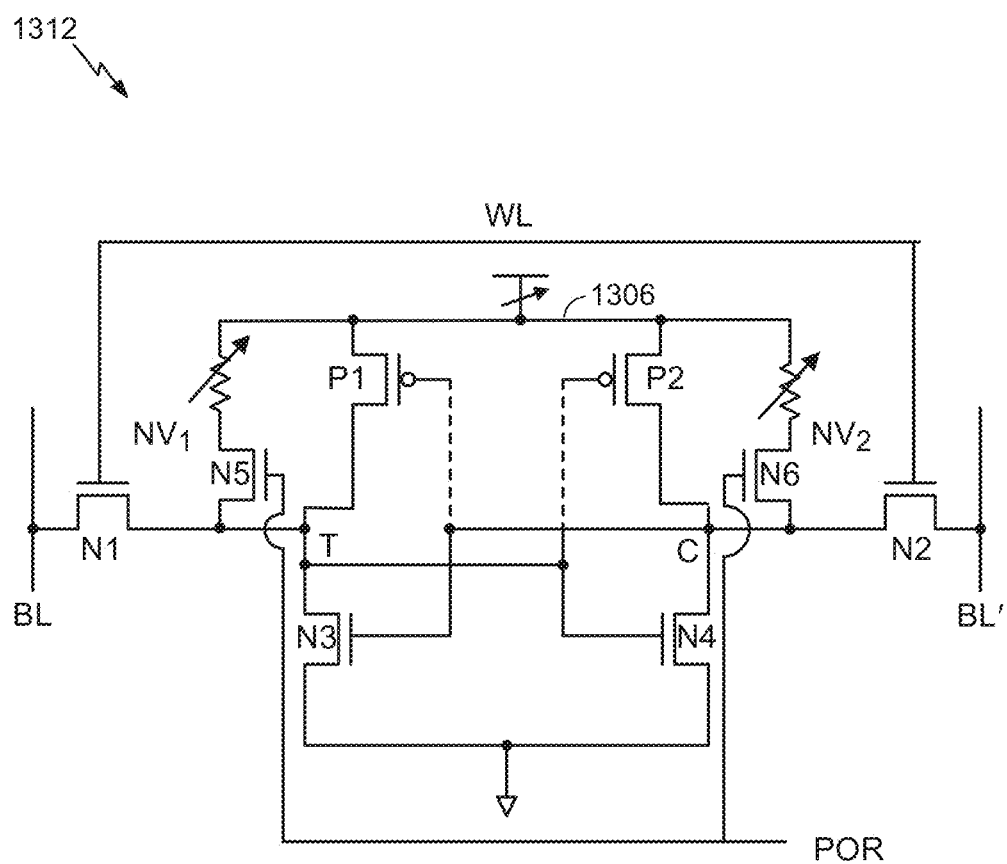

In the alternative implementation of FIG. 13C, a bitcell circuit 1312 may remove PFETs P3 and P4 from bitcell circuit 1310 of the particular implementation of FIG. 13B while maintaining NFETs N5 and N6 to selectively connect non-volatile memory element $NV_1$ to node T and non-volatile memory element $NV_2$ to node C responsive to a signal POR signal applied to gates of NFETs N5 and N6. However, PFET P1 remains connected to node T and PFET P2 remains connected to node C. Here, a voltage of signal POR may be may be raised following application of power at voltage source 1306. In an embodiment, the voltage of signal POR may be raised sufficiently soon and maintained at the raised voltage for a sufficient duration to enable reliable transfer of stored values from non-volatile memory elements $NV_1$ and $NV_2$ to initialize a memory state of bitcell circuit 1312 for operation as a volatile memory bitcell circuit.

Figure 13D:
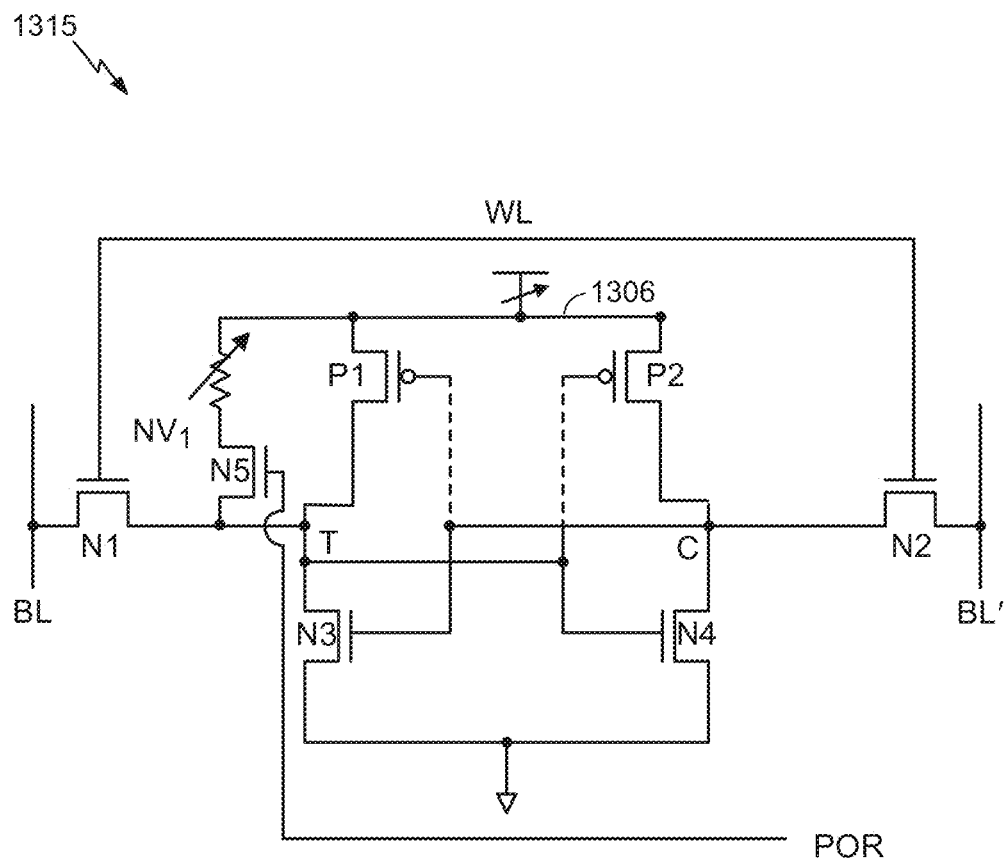

According to an embodiment, bitcell circuit 1312 may be further modified to store a memory state in a single non-volatile memory element $NV_1$ as shown in bitcell circuit 1315 shown in the schematic diagram of FIG. 13D. Here, a value, symbol or condition expressed by a memory state maintained by PFETs P1 and P2, and NFETs N3 and N4 may be transferred to non-volatile memory element $NV_1$ (e.g., in a power down event) to be expressed or represented as a high impedance or insulative state, or a low impedance or conductive state. Likewise, a value, symbol or condition expressed by a memory state maintained by non-volatile memory element $NV_1$ (expressed or represented as a high impedance or insulative state, or a low impedance or conductive state) may be transferred to a volatile memory state maintained by PFETs P1 and P2, and NFETs N3 and N4 (e.g., in a power up event). The particular implementation of bitcell circuit 1315 does not include NFET N6 and $NV_2$ to enable implementation of a bitcell circuit volatile memory elements and non-volatile memory elements using fewer components.

In one implementation, bitcell circuit 1315 may transfer a non-volatile memory state maintained by $NV_1$ to a volatile memory state maintained by non-volatile memory elements PFETS P1 and P2, and NFETS N3 and N4 by initializing a state of a latch circuit formed by PFETs P1 and P2, and NFETs N3 and N4. As power is applied at voltage source 1306, NFET N5 may be turned on to close responsive to signal POR, connecting a terminal of $NV_1$ to node T (while disconnecting PFET P1 from node T). If $NV_1$ in a high impedance/resistance state (e.g., to store a first value, parameter, condition or symbol), node C may be placed at a higher voltage than node T, causing PFET P1 to be open and causing PFET P2 to be closed as part of the latch circuit including PFETs P1 and P2, and NFETs N3 and N4. Conversely, if $NV_1$ in a low impedance/resistance state (e.g., to store the second value, parameter, condition or symbol), node C may be placed at a lower voltage than node T, causing PFET P1 to be closed and causing PFET P2 to be open. Following connection of PFETs P1 and P2 to nodes T and C, respectively, signal POR may be lowered to open NFET N5 and disconnect non-volatile memory element $NV_1$, allowing bitcell circuit 1315 to operate as a volatile memory bitcell.

As pointed out above, it may be desirable is some scenarios of a computing platform to transfer values stored in a volatile memory state to a non-volatile memory state. Following transfer of values stored in a volatile memory state to a non-volatile memory state, for example, the computing platform may be powered down. Transferring the values stored in the volatile memory state to the non-volatile memory state and then back into the volatile memory state from the non-volatile memory state may allow the computing platform to quickly resume from a state occurring before the power down event (e.g., without having to load a memory state from an external non-volatile memory device which may be a much slower operation).

According to an embodiment, values stored in a volatile memory state at bitcell circuit 1300 may be transferred for storage in a non-volatile memory state at non-volatile memory elements $NV_1$ and $NV_2$. Similarly, values stored in a volatile memory state at bitcell circuit 1315 may be transferred for storage in a non-volatile memory state at non-volatile memory element $NV_1$. In one implementation, a value stored in a volatile memory state at bitcell circuit 1300 may be transferred for storage in a non-volatile memory state at non-volatile memory elements $NV_1$ and $NV_2$ (or just in non-volatile memory element $NV_1$) using a read-modify-write procedure. Likewise, a value stored in a volatile memory state at bitcell circuit 1315 may be transferred for storage in a non-volatile memory state at non-volatile memory element $NV_1$ similarly using a read-modify-write procedure.

In the particular implementation of bitcell circuit 1300, a volatile memory state may be detected in a read operation including, for example, connecting bitcell circuit 1300 to bitlines BL and BL'. For example, bitcell circuit 1300 may be accessed for a read operation by raising a voltage of wordline signal WL to close or enable NFETs N1 and N2. Bitlines BL and BL' may be coupled to read circuit (not shown) capable of detecting the volatile memory state maintained at bitcell circuit 1300. The detected volatile memory state of bitcell circuit 1300 may be stored temporarily, and then written to non-volatile memory elements $NV_1$ and $NV_2$ in a subsequent write operation. For example, in the subsequent write operation, write driver circuits (not shown) coupled to bitlines BL and BL' may apply programming signals based on the temporarily stored value. For example, bitcell circuit 1300 may be accessed again for a write operation by raising a voltage of wordline signal WL to close or enable NFETs N1 and N2 to connect bitlines BL and BL' to bitcell circuit 1300. For example, while NFETs N1 and N2 are closed, write driver circuitry (not shown) may apply programming signals to non-volatile memory elements $NV_1$ and $NV_2$ to place non-volatile memory elements $NV_1$ and $NV_2$ in a memory state to represent values detected in the previous read operation. In a particular implementation in which non-volatile memory elements $NV_1$ and $NV_2$ comprise CES elements, such a programming signal may apply suitable voltages and current densities to non-volatile memory elements $NV_1$ and $NV_2$ (e.g., as described below in connection with FIGS. 14A and 14B) to place non-volatile memory elements $NV_1$ and $NV_2$ in complementary high impedance/insulative and low impedance/conductive states. A volatile memory state stored in bitcell circuit 1315 may be similarly transferred to a non-volatile memory state in non-volatile memory element $NV_1$.

Figure 13E:
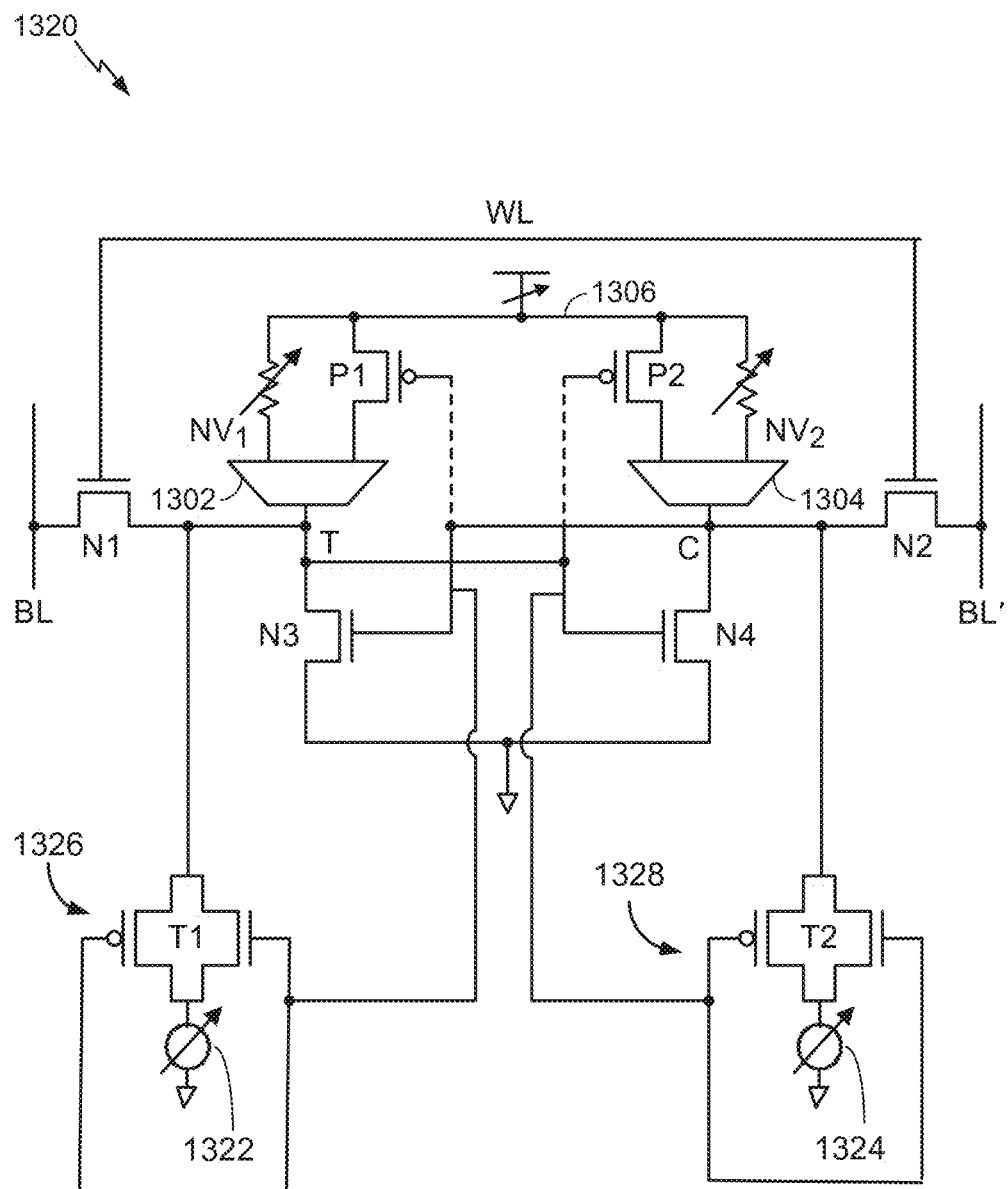

In an alternative embodiment as shown in FIG. 13E, a volatile memory state maintained by PFETs P1 and P2, and NFETs N3 and N4 may be transferred to non-volatile memory elements $NV_1$ and $NV_2$ without accessing bitcell circuit 1320 through the enabling of the word line devise N1 and N2. In other words, a volatile memory state maintained in bitcell circuit 1320 by PFETs P1 and P2, and NFETs N3 and N4 may be transferred to non-volatile memory elements $NV_1$ and $NV_2$ without connecting bitlines BL and BL' to bitcell circuit 1320 (e.g., by raising a voltage of wordline signal WL to close NFETs N1 and N2). Complementary write driver circuits 1326 and 1328 may then apply appropriate programming signals to non-volatile memory elements $NV_1$ and $NV_2$. As may be observed, transmission gate T2 of write driver circuit 1328 may be controlled based on a voltage at node T while transmission gate T1 of write driver circuit 1326 may be controlled based on a voltage at node C. In a particular implementation in which non-volatile memory elements $NV_1$ and $NV_2$ are formed as correlated electron switches, for example, a write driver circuits 1326 and 1328 may apply a programming signal comprising a voltage $V_{set}$ at a current $I_{set}$ to place a particular non-volatile memory element in a low impedance or conductive state. The particular elements indicated by 1322 and 1324 as part of the write drivers 1326 and 1328 may be coupled with T1 and T2 to create a combined voltage and current source and enable either a programming signal $V_{set}/I_{set}$ (e.g., to place a non-volatile memory element in a low impedance or conductive state) or programming signal $V_{reset}/I_{reset}$ (e.g., to place a non-volatile memory element in a high impedance or insulative state) through multiplexers 1302 and 1304. These elements may include a voltage source which supplies the appropriate voltage and current through T1 and T2 to enable non-volatile memory elements $NV_1$ and $NV_2$ to be written to appropriate states to maintain T and C when the power supply 1306 is removed and no power is applied to bitcell 1320.

As pointed out above, non-volatile memory bitcells described above may comprise bitcells including correlated electron switch (CES) elements incorporating a Correlated Electron Material (CEM). In this context, a CES element may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES element may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES element between an insulative state and a conductive state may be understood in terms of a Mott transition. In a Mott transition, a material may switch from an insulative state to conductive state if a Mott transition condition occurs. The criteria may be defined by the condition $(n_C)^{1/3}a=0.26$, where $n_C$ is a concentration of electrons and "a" is a Bohr radius. If a critical carrier concentration is achieved such that the Mott criteria is met, a Mott transition may occur and state may change from a high resistance/capacitance to a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In particular implementations of aspects of this disclosure, a resistive switching integrated circuit memory may comprise: a resistive switching memory cell including a CES element; a write circuit for placing the resistive switching memory cell in a first resistive state or a second resistive state depending on signals provided to the memory cell, wherein the impedance of the CES element is higher in the second impedance state than in the first impedance state; and a read circuit for sensing the state of the memory cell and providing an electrical signal corresponding to the sensed state of the memory cell. In a particular implementation, a CES element may switch resistive states responsive to a Mott-transition in the majority of the volume of the CES element. In one aspect, a CES element may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES element may be formed as a "CEM random access memory (CeRAM)" device. In this context, a CeRAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a write operation.

In a particular implementation, a CES element may comprise material sandwiched between conductive terminals. By applying a specific voltage and current between the terminals, the material may transition between the aforementioned conductive and insulative memory states. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative) than while the memory device in a second memory state referred to as a conductive or low impedance memory state. Furthermore, as discussed below with respect to a particular implementation, a CES element may be placed in any one of two or more different and distinguishable low impedance or conductive states.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

Figure 14A:
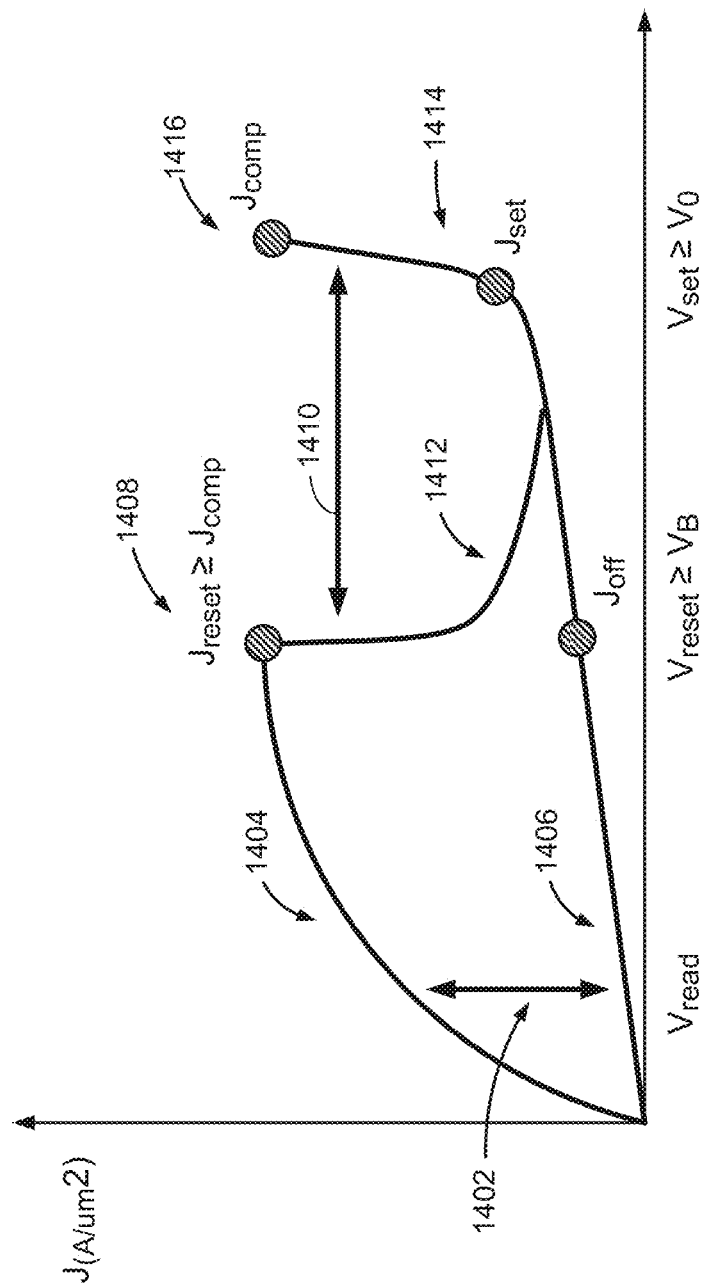
FIG. 14A shows a plot of current density versus voltage for a CES device according to an embodiment.

FIG. 14A shows a plot of current density versus voltage across terminals (not shown) for a CES element according to an embodiment. Based, at least in part, on a voltage applied to terminals of the CES element (e.g., in a write operation), the CES element may be placed in a conductive state or an insulative state. For example application of a voltage $V_{set}$ and current density $J_{set}$ may place the CES element in a conductive memory state and application of a voltage $V_{reset}$ and a current density $J_{reset}$ may place the CES element in an insulative memory state. Following placement of the CES element in an insulative state or conductive state, the particular state of the CES element may be detected by application of a voltage $V_{read}$ (e.g., in a read operation) and detection of a current or current density at terminals of the CeRAM device.

According to an embodiment, the CES device of FIG. 14A may include any TMO, such as, for example, perovskites, Mott insulators, charge exchange insulators, and Anderson disorder insulators. In particular implementations, a CES device may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES device may be prepared without electroforming. Other implementations may employ other transition metal compounds without deviating from claimed subject matter. For example, $\{M(chxn)_2Br\}Br_2$ where M may comprise Pt, Pd, or Ni, and chxn comprises 1R,2R-cyclohexanediamine, and other such metal complexes may be used without deviating from claimed subject matter.

In one aspect, the CES device of FIG. 14A may comprise materials that are TMO metal oxide variable resistance materials, though it should be understood that these are exemplary only, and are not intended to limit claimed subject matter. Particular implementations may employ other variable resistance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by $NiO(C_x)$. Here, one skilled in the art may determine a value of x for any specific carbon containing ligand and any specific combination of carbon containing ligand with NiO simply by balancing valences. In another particular example, NiO doped with extrinsic ligands may be expressed as NiO($L_x$), where $L_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES element may rapidly switch from a conductive state to an insulator state via the Mott transition. This may occur at point 1408 of the plot in FIG. 14A. At this point, electrons are no longer screened and become localized. This correlation may result in a strong electron-electron interaction potential which splits the bands to form an insulator. While the CES element is still in the insulative state, current may generated by transportation of electron holes. If enough bias is applied across terminals of the CES element, electrons may be injected into a metal-insulator-metal (MIM) diode over the potential barrier of the MIM device. If enough electrons have been injected and enough potential is applied across terminals to place the CES element in a particular low impedance or conductive state, an increase in electrons may screen electrons and remove a localization of electrons, which may collapse the band-splitting potential forming a metal.

According to an embodiment, current in a CES element may be controlled by an externally applied "compliance" condition determined based, at least in part, on an external current limited during a write operation to place the CES element in a conductive or low impedance state. This externally applied compliance current may also set a condition of a current density for a subsequent reset operation to place the CES element in a high impedance or insulative state. As shown in the particular implementation of FIG. 14A, a current density $J_{comp}$ applied during a write operation at point 1416 to place the CES element in a conductive or low impedance state may determine a compliance condition for placing the CES device in a high impedance or insulative state in a subsequent write operation. As shown, the CES device may be subsequently placed in an insulative or high impedance state by application of a current density $J_{reset} \geq J_{comp}$ at a voltage $V_{reset}$ at point 1408, where $J_{comp}$ is externally applied.

The compliance therefore may set a number of electrons in a CES element which are to be "captured" by holes for the Mott transition. In other words, a current applied in a write operation to place a CES element in a conductive memory state may determine a number of holes to be injected to the CES element for subsequently transitioning the CES element to an insulative memory state.

As pointed out above, a reset condition may occur in response to a Mott transition at point 1408. As pointed out above, such a Mott transition may occur at condition in a CES element in which a concentration of electrons n equals a concentration of electron holes p. This condition may be modeled according to expression (1) as follows:

$$\lambda_{TF} n^{\frac{1}{3}} = C \sim 0.26 \quad (1)$$

$$n = \left(\frac{C}{\lambda_{TF}}\right)^3$$

where:
$\lambda_{TF}$ is a Thomas Fermi screening length; and
C is a constant.

According to an embodiment, a current or current density in a region 1404 of the plot shown in FIG. 14A may exist in response to injection of holes from a voltage signal applied across terminals of a CES element. Here, injection of holes may meet a Mott transition criterion for the conductive state to insulative state transition at current $I_{MI}$ as a critical voltage $V_{MI}$ is applied across terminals of CES element. This may be modeled according to expression (2) as follows:

$$I_{MI}(V_{MI}) = \frac{dQ(V_{MI})}{dt} \approx \frac{Q(V_{MI})}{t} \quad (2)$$

$$Q(V_{MI}) = qn(V_{MI})$$

Where $Q(V_{MI})$ is the charged injected (hole or electron) and is a function of an applied voltage.

Injection of electron holes to enable a Mott transition may occur between bands and in response to critical voltage $V_{MI}$ and critical current $I_{MI}$. By equating electron concentration n with a charge concentration to bring about a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CeRam}} = \frac{q}{A_{CeRam} t}\left(\frac{C}{\lambda_{TF}(V_{MI})}\right)^3$$

Where:
$A_{CeRam}$ is a cross-sectional area of a CES element; and
$J_{reset}(V_{MI})$ is a current density through the CES element to be applied to the CES element at a critical voltage $V_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria.

In transitioning a CES to a conductive memory state, as enough electrons have been injected and the potential across terminal of the CES device overcomes a critical switching potential (e.g., $V_{set}$), injected electrons begin to screen and unlocalize double-occupied electrons to reverse a disproportion reaction and close the bandgap. A current density $J_{set}(V_{MI})$ for transitioning the CES to the conductive memory state at a critical voltage $V_{MI}$ enabling transition to the conductive memory state may be expressed according to expression (4) as follows:

$$I_{MI}(V_{MI}) = \frac{dQ(V_{MI})}{dt} \approx \frac{Q(V_{MI})}{t} \quad (4)$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{MI}) = J_{injection}(V_{MI}) = J_{MI}(V_{MI}) = \frac{I_{MI}(V_{MI})}{A_{CeRam}} = \frac{q}{A_{CeRam} t}\left(\frac{C}{a_B}\right)^3$$

where $a_B$ is a Bohr radius.

According to an embodiment, a "read window" 1402 for detecting an impedance state of a CES element in a read operation may be set out as a difference between a portion 106 the plot of FIG. 14A while the CES element is in an insulative state and a portion 104 of the plot FIG. 14A while the CES element is in a conductive state at a read voltage $V_{read}$. In a particular implementation, read window 1402 may be used to determine a Thomas Fermi screening length $\lambda_{TF}$ of material making up the CES element. For example, at a voltage $V_{reset}$, current densities $J_{reset}$ and $J_{set}$ may be related to according to expression (5) as follows:

$$\lambda_{TF}(@\,V_{reset}) = a_B \left( \frac{J_{reset}}{J_{off}} \right)^{\frac{1}{3}} \quad (5)$$

In another embodiment, a "write window" 1410 for placing a CES element in an insulative or conductive memory state in a write operation may be set out as a difference between $V_{reset}$ (at $J_{reset}$) and $V_{set}$ (at $J_{set}$). Establishing $|V_{set}|>|V_{reset}|$ enables a switch between conductive and insulative state. $V_{reset}$ may be approximately at a band splitting potential arising from correlation and $V_{set}$ may be approximately twice the band splitting potential. In particular implementations, a size of write window 1410 may be determined based, at least in part, by materials and doping of the CES element.

Figure 14B:
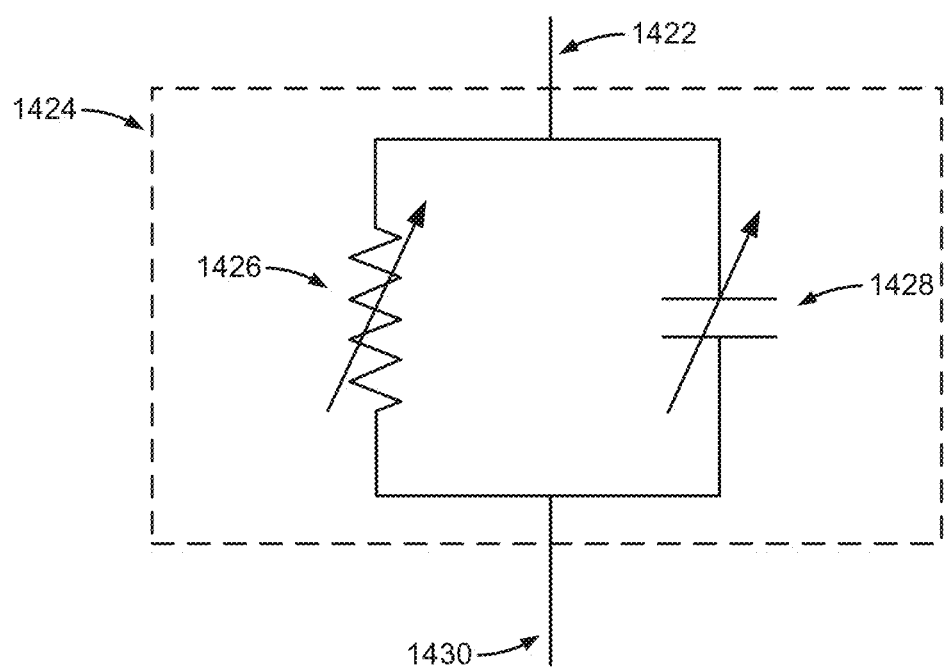
FIG. 14B is a schematic diagram of an equivalent circuit to a CES device according to an embodiment.

The transition from high resistance/capacitance to low resistance/capacitance in a CES element may be represented by a singular impedance of the CES element. FIG. 14B depicts a schematic diagram of an equivalent circuit of an example variable impeder device (such as a CES element), such as variable impeder device 1424. As mentioned, variable impeder device 1424 may comprise characteristics of both variable resistance and variable capacitance. For example, an equivalent circuit for a variable impeder device may, in an embodiment, comprise a variable resistor, such as variable resistor 1426 in parallel with a variable capacitor, such as variable capacitor 1428. Of course, although a variable resistor 1426 and variable capacitor 1428 are depicted in FIG. 14B as comprising discrete components, a variable impeder device, such as variable impeder device 1424, may comprise a substantially homogenous CEM element, wherein the CEM element comprises characteristics of variable capacitance and variable resistance. Table 1 below depicts an example truth table for an example variable impeder device, such as variable impeder device 1400.

TABLE 1

| Resistance | Capacitance | Impedance |
| --- | --- | --- |
| $R_{high}(V_{applied})$ | $C_{high}(V_{applied})$ | $Z_{high}(V_{applied})$ |
| $R_{low}(V_{applied})$ | $C_{low}(V_{applied})$~0 | $Z_{low}(V_{applied})$ |

In the particular implementation of a CES element of FIG. 14A, the CES element may be placed in either of two different impedance states: a low impedance or conductive state responsive to a set operation and a high impedance or insulative state responsive to a reset operation.

Figure 15:
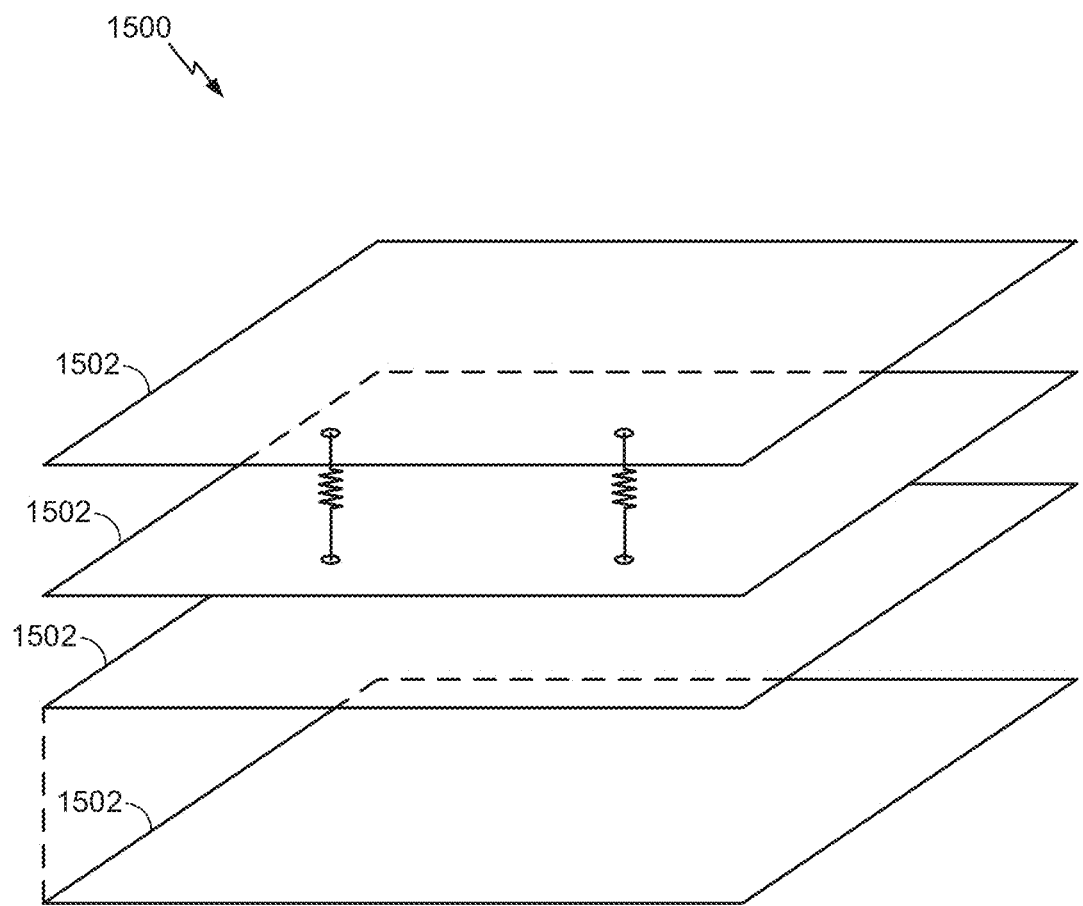
FIG. 15 is a schematic diagram of a three-dimensional integrated circuit structure integrating volatile memory bitcells and non-volatile memory bitcells according to an embodiment.

According to different embodiments, structures forming volatile memory bitcells and non-volatile memory bitcells (according to different implementations discussed above), may be integrated in a single integrated circuit (IC) or across multiple ICs. One particular implementation integrates structures forming volatile memory bitcells and non-volatile memory bitcells across multiple ICs in a three-dimensional (3D) IC 1500 as shown in FIG. 15. For example, layers 1502 in 3D IC 1500 may comprise monolithic ICs coupled by metallic interconnects wherein one particular layer 1502 comprises one or more memory arrays comprising exclusively volatile memory bitcells while a different particular layer 1502 comprises one or more memory arrays comprising exclusively non-volatile memory bitcells. In other implementations, structures forming volatile memory bitcells and non-volatile memory bitcells may be formed in a single layer 1502 and integrated according to embodiments discussed above.

A write operation performed in connection with particular embodiments described herein as a particular process of placing a memory device such as a CES element in a particular memory state of a plurality of predetermined memory states by applying a "programming signal" to terminals of the memory device. Particular ones of the predetermined memory states may correspond to particular voltage levels to be applied to the memory device (e.g., $V_{set}$ and $V_{reset}$). Similarly, particular ones of the predetermined memory states may correspond to particular current levels to be applied to the memory device (e.g., $I_{set}$ and $I_{reset}$). Accordingly, in a particular embodiment, a programming signal to place a CES device in a particular memory state in a write operation may be controlled to have a particular voltage level and current level corresponding to the particular memory state.

As described in particular implementations within, a voltage signal having a voltage level for a programming signal to place a memory device in a predetermined memory state may be selected at a signal selection circuit based, at least in part, on a data signal. Conducting elements connected to the signal selection circuit may selectively connect the voltage signal to or disconnect the voltage signal from the memory device at a current level corresponding to the predetermined memory state based, at least in part, on the data signal. In this context, a "conducting element" comprises a circuit element capable of permitting current to pass between two nodes. In a particular implementation, a conducting element may vary a current permitted to pass between nodes based, at least in part, on a particular condition. The particular implementations described herein may employ FETs as conducting elements to permit current to pass between source and drain terminals based, at least in part, on a voltage applied to a gate terminal. It should be understood, however, that other types of devices such as a bipolar transistor, diode, variable resistor, etc. may be used as a conducting element, and that claimed subject matter is not limited in this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conductive element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

As discussed above, example bitcells implemented in accordance with various embodiments may include volatile memory elements and non-volatile memory elements, including non-volatile memory elements comprising one or more correlated electron switch devices, for example. As also mentioned above, in particular implementations, a computing device or computing platform may copy or transfer memory states or stored values from a volatile memory device to a non-volatile memory. Likewise, a computing platform or computing device may copy memory states from a non-volatile memory to a volatile memory device. As discussed above, copying memory states and/or transferring stored values between volatile and non-volatile memory devices may entail latencies and power consumption affecting performance of a computing platform or device, for example. To help address such potential negative impacts to performance and/or power consumption, for example, implementations described below may be directed to a coupling of volatile memory elements and non-volatile magnetic memory elements within individual bitcells and/or within arrays of bitcells to reduce power consumption and/or latencies, for example in connection with copying memory states between volatile and non-volatile memory devices. Additionally, as discussed more fully below, volatile memory elements and non-volatile memory elements within a particular bitcell may be individually accessed without disturbing signals and/or states stored in other parts of a bitcell.

For example, in some circumstances, accessing (e.g., reading and/or writing) signals and/or states at a non-volatile magnetic memory element of a particular bitcell may interfere with (e.g., destroy, alter, etc.) signals and/or states stored at a volatile memory element of the particular bitcell. Therefore, in some circumstances, it may not be possible and/or advisable to utilize volatile memory elements and non-volatile magnetic memory elements of a bitcell as separate storage elements. To help address issues related to utilization of volatile memory elements and/or non-volatile magnetic memory elements to store separate signals and/or states, embodiments described herein may be directed at least in part to providing individual access to volatile memory elements and/or to non-volatile magnetic memory elements within particular bitcells without disturbing and/or altering values stored in respective memory elements. For example, embodiments discussed below may accomplish integration of non-volatile magnetic memory elements with volatile memory elements within a bitcell with negligible impact on volatile memory element read and/or write operations. Similarly, embodiments may integrate non-volatile magnetic memory elements with volatile memory elements within a bitcell with negligible impact on magnetic memory read and/or write due to presence of volatile memory element. Embodiments may integrate non-volatile magnetic memory elements with volatile memory elements within bitcells with relatively little increase in die area, device count, energy consumption, etc., for example.

Example embodiments implementing volatile memory elements and non-volatile magnetic memory elements within a bitcell may be utilized, for example, to implement relatively fast start-up (e.g., instant-on) and/or relatively fast sleep and/or shut-down (e.g., instant-off) in electronic devices, such as Internet of Things (IoT) devices (e.g., cell phones, tablets, notebook computers, wearable devices, etc.). Additionally, for example, volatile memory elements and non-volatile magnetic memory elements combined within a bitcell may also be utilized for predicting branching states and/or for restoring previous processing states, in an embodiment. Further, bitcells utilizing both volatile and/or non-volatile magnetic memory elements may utilize non-volatile and/or volatile memory elements as separate storage units that may be individually accessible. Such implementations may be utilized, for example, as programmable read-only memories and/or for look-up tables to enable near-memory computing (e.g., processor located in close proximity to memory), in an embodiment. Of course, these are merely examples of how volatile memory elements and/or non-volatile magnetic memory elements may be implements and/or utilized, and claimed subject matter is not limited in scope in these respects.

Figure 16:
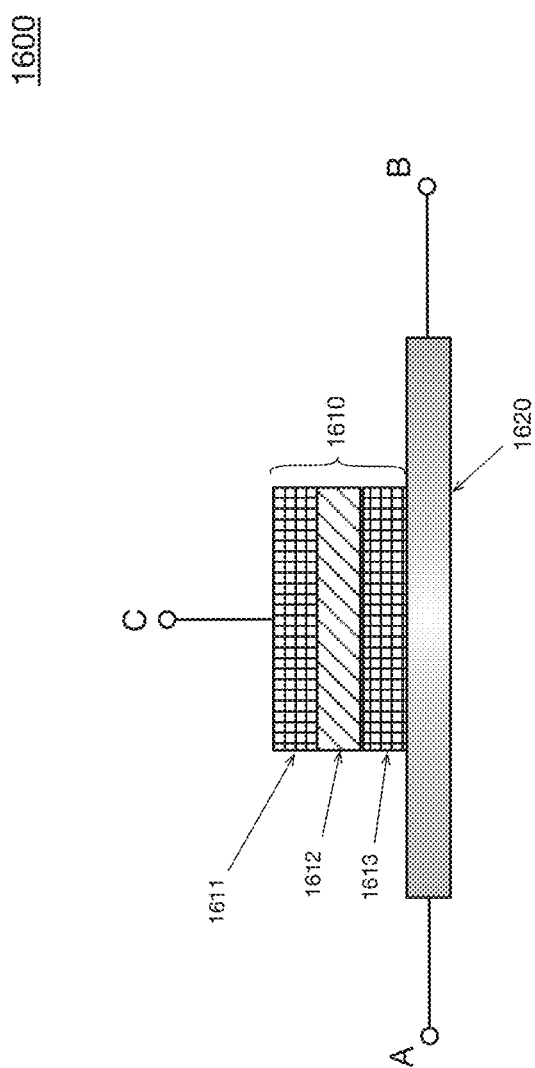
FIG. 16 depicts a cross-sectional view of an example non-volatile magnetic memory element, in accordance with an embodiment.

FIG. 16 depicts an embodiment 1600 of an example non-volatile magnetic memory element. In an embodiment, a non-volatile magnetic memory element, such as non-volatile magnetic memory element 1600, may comprise, for example, a Spin-Orbit-Torque Magnetic Tunnel Junction (SOT-MTJ) memory element. For example, a non-volatile magnetic memory element, such as SOT-MTJ memory element 1600, may comprise a three-terminal device, including terminals A, B, and C. In an embodiment, non-volatile magnetic memory element 1600 may comprise a Spin-Hall-Effect (SHE)-MTJ memory element, for example, including a metal layer, such as SOT metal layer 1620, and/or may further include a magnetic tunnel junction (MTJ) stack 1610. In an embodiment, SOT metal layer 1620 may comprise, for example, tantalum (Ta), platinum (Pt), etc., and/or alloys such as, for example, PtMn, IrMn, etc., and/or combinations thereof. Of course, SOT metal layer 1620 is not limited in scope to particular materials.

Also, in an embodiment, MTJ stack 1610 may include one or more layers, such as layers 1611, 1612, and/or 1613, comprising one or more layers of magnetic material, such as layers 1611 and/or 1613. In an embodiment, layers 1613 and/or 1611 may comprise CoFeB, for example. Also, in an embodiment, layer 1612 may comprise MgO, for example. However, claimed subject matter is not limited in scope to the particular materials mentioned for MTJ stack 1610. Further, an MTJ stack, such as MTJ stack 1610, may include any number and/or type of layers. In an embodiment, a layer, such as layer 1611, may comprise a "pinned" magnetic layer (e.g., magnetization vector is fixed in a particular orientation). Further, in an embodiment, a layer, such as layer 1613, may comprise a magnetic "free" layer (e.g., magnetization vector orientation may be switched to match the orientation of an external field). In an embodiment, an orientation of a magnetization vector within magnetic free layer 1613 may depend at least in part on a direction of a current to have flowed through SOT metal layer 1620. For example, for a current to have flowed through SOT metal layer 1620 in a first direction, such as from terminal A to terminal B, a magnetization vector of magnetic free layer 1613 may be oriented in a first direction. Also, for example, for a current to have flowed through SOT metal layer 1620 in a second direction, such as from terminal B to terminal A, a magnetization vector of magnetic free layer 1613 may be oriented in a second direction.

In an embodiment, magnetization vectors within pinned magnetic layer 1611 and magnetic free layer 1613 may be made to be oriented in the same direction or may be made to be oriented in an opposite direction depending on a direction of current flow through SOT metal layer 1620. In an embodiment, if orientations of magnetization vectors within magnetic free layer 1613 and pinned magnetic layer 1611 are substantially the same, then MTJ stack 1610 may exhibit a characteristic of a relatively lower resistance. Similarly, in an embodiment, if orientations of magnetization vectors within magnetic free layer 1613 and pinned magnetic layer 1611 are substantially opposite, then MTJ stack 1610 may exhibit a characteristic of a relatively higher resistance. In an embodiment, a current flow from terminal A to terminal B may result in a lower resistance within MTJ stack 1610. Further, in an embodiment, a current flow from terminal B to terminal A may result in a higher resistance within MTJ stack 1610. In this manner, for example, a data value (e.g., signal and/or state) may be written to non-volatile magnetic memory element 1600. Of course, claimed subject matter is not limited in scope to these particular examples. Additionally, in an embodiment, a data value (e.g., signal and/or state) may be read from non-volatile magnetic memory element 1600 by sensing a resistance state of MTJ stack 1610. For example, a current flow between terminal C and terminal B may be sensed to determine whether MTJ stack 1610 is in a relatively higher resistance state or in a relatively lower resistance state.

Figure 17:
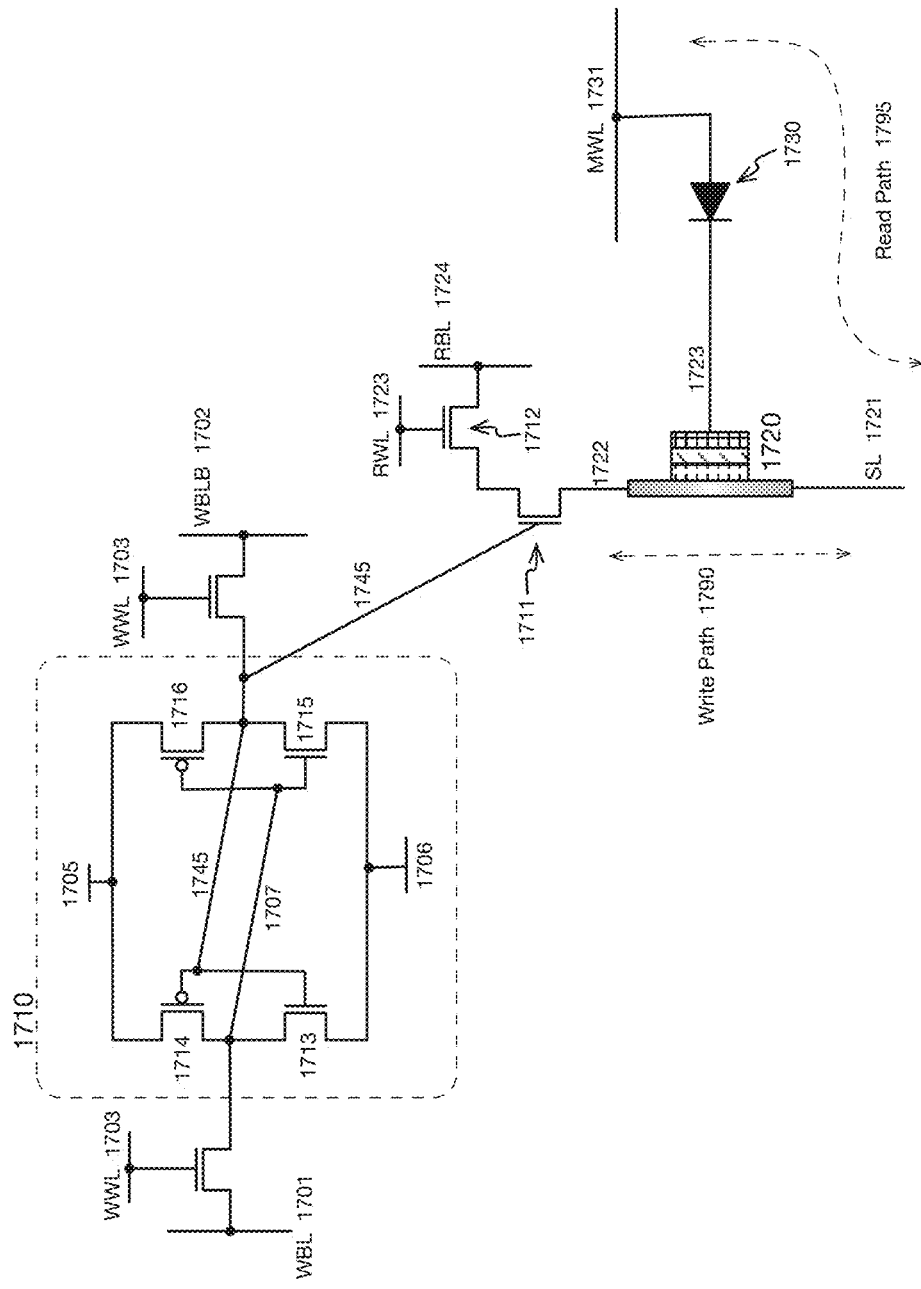
FIG. 17 is a schematic diagram depicting an example bitcell including a volatile memory element and a non-volatile magnetic memory element, in accordance with an embodiment.

FIG. 17 depicts an embodiment 1700 of a bitcell, including one or more volatile memory elements 1710 and/or one or more non-volatile magnetic memory elements 1720. In an embodiment, volatile memory element 1710 may comprise a 6T (six transistor) volatile memory element, for example. Of course, claimed subject matter is not limited in scope to any particular number and/or configuration of transistors utilized to implement a volatile memory element. Further, in an embodiment, non-volatile magnetic memory element 1720 may comprise an SOT-MTJ device, for example. In an embodiment, non-volatile magnetic memory element 1720 may comprise an SOT-MTJ device similar to device 1600 discussed above. In an embodiment, SOT-MTJ device 1720 may comprise an SHE-MTJ device, for example. In an embodiment, a non-volatile magnetic memory element, such as non-volatile magnetic memory element 1720, may be combined with a volatile memory element, such as volatile memory element 1710, to yield an 8T (eight transistor) bitcell, for example, wherein volatile memory element 1710 may be accessed without altering a signal and/or state stored at non-volatile magnetic memory element 1720. Of course, although a particular implementation utilizing eight transistors is depicted and/or discussed, claimed subject matter is not limited in scope in these respects. Further, embodiments in accordance with claimed subject matter may be configured into and/or may be operated in a variety of modes, as explained more fully below.

In an embodiment, non-volatile magnetic memory element 1720 may be configured such that an SOT metal layer of non-volatile magnetic memory element 1720 may be positioned in series with a read port of volatile memory element 1710. For example, a signal and/or state stored at node 1745 of volatile memory element 1710 may be sensed at least in part by asserting a read word line (RWL) 1723 and/or a read bit line (RBL) 1724 and/or by coupling a source line, such as source line 1721, to a common source (e.g., ground voltage level). Depending at least in part on a voltage at node 1745, a current may flow through a lower-resistance SOT metal layer of non-volatile magnetic memory element 1720 and/or may be sensed by a sensing circuit, for example, coupled to SL 1721 and/or to RBL 1724.

Figure 18:
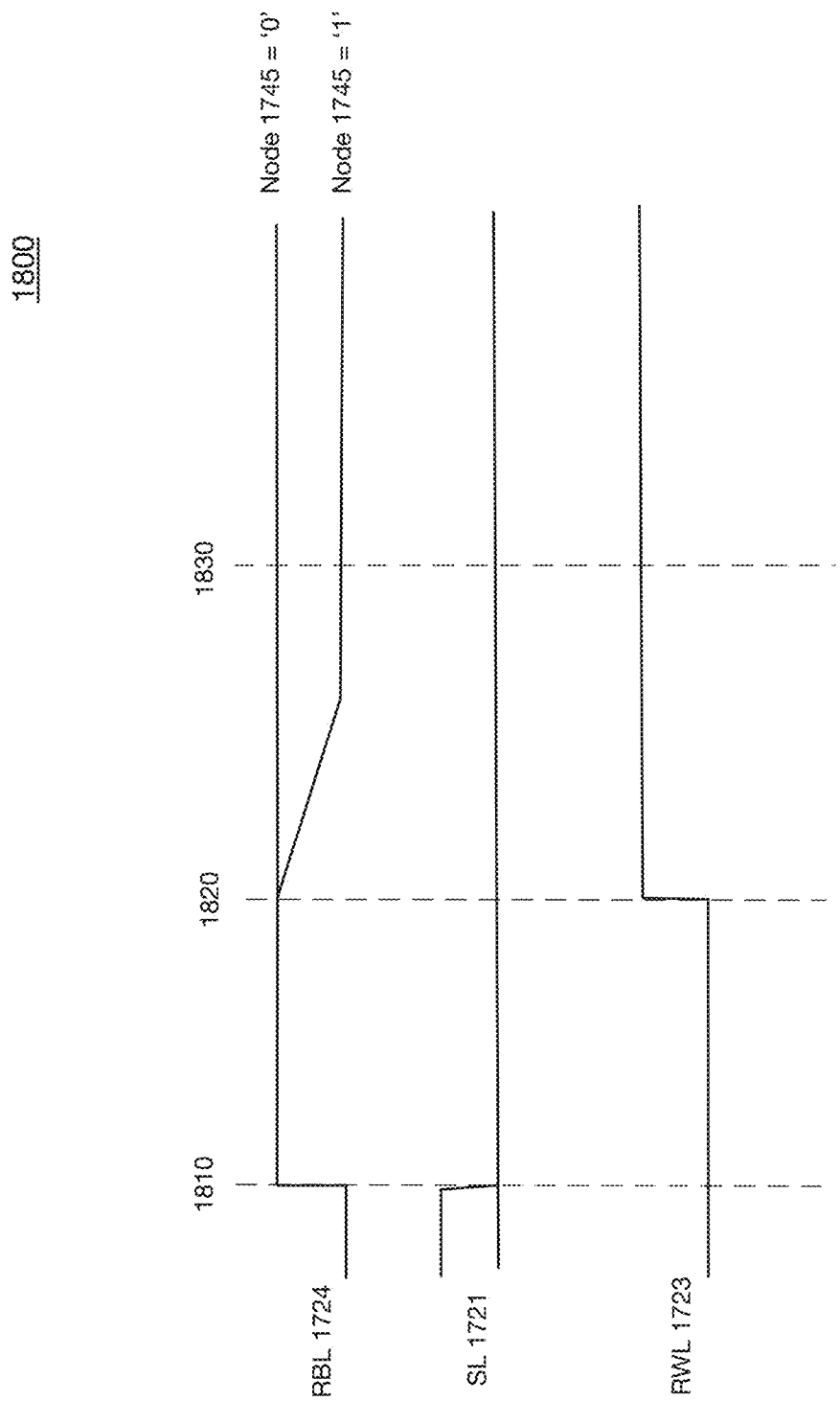
FIG. 18 is an illustration of an example simplified timing diagram depicting an example read operation for a volatile memory element of an example bitcell, in accordance with an embodiment.

For example, in an embodiment, to read a signal and/or state stored at volatile memory element 1710, RBL 1724 may be precharged to a specified voltage. See, for example, FIG. 18, wherein RBL 1724 is depicted at example point in time 1810 as being precharged. In an embodiment, simplified timing diagram 1800 may depict example relative and/or approximate timings for various signals related to example embodiment 1700. Of course, the relative and/or approximate timings and/or relationships among signals depicted in timing diagram 1800 are merely examples, and claimed subject matter is not limited in scope in these respects. In an embodiment, SL 1721, for example, may be coupled to a common source (e.g., ground). See FIG. 18, for example, wherein SL 1721 is depicted at example point in time 1810 as being set at a relatively lower voltage level (e.g., common source voltage). Also, for example, RWL 1723 may be asserted, thereby enabling current to flow through a switching device, such as transistor 1712. See, for example, FIG. 18 wherein RWL is depicted as being asserted at example point in time 1820. In an embodiment, at least in part in response to RBL 1724 being precharged and/or at least in part in response to transistor 1712 being enabled via assertion of RWL 1723, RBL 1724 may be discharged, and/or a current may be sensed to determine a higher resistance state or a lower resistance state.

For example, with RWL 1723 being asserted, a lower resistance path between SL 1721 and RBL 1724 may occur at least in part in response to transistor 1711 becoming enabled by a voltage on node 1745. For example, for a circumstance in which volatile memory element 1710 stores a "1," a voltage at node 1745 may enable transistor 1711, and a lower resistance path may exist between SL 1721 and RBL 1724. With a lower resistance path between SL 1721 and RBL 1724, a voltage on RBL 1724 may discharge relatively quickly. See, for example, FIG. 18 wherein RBL 1724 is shown to discharge relatively quickly in the case of node 1745="1". Further, for example, if volatile memory element 1710 stores a "0," a voltage at node 1745 may be insufficient to enable transistor 1711. In this circumstance, a relatively higher resistance path may result between SL 1721 and RBL 1724, and RBL 1724 may therefore discharge relatively slowly. See, for example, FIG. 18 wherein RBL 1724 is shown to discharge relatively slowly in the case of node 1745="0". A rate of discharge of RBL 1724 may be discerned by sensing circuitry to determine whether a "1" or a "0" is indicated, for example. For example, sensing circuitry may detect a voltage level on RBL 1724 at example point in time 1830 to determine whether a "1" or a "0" is indicated.

In an embodiment, the properties of one or more components, such as transistors 1711 and/or 1712, may be specified such that a signal and/or state stored at non-volatile magnetic memory element 1720 may not be altered by a read of volatile memory element 1710. For example, a current through SOT metal layer of non-volatile magnetic memory element 1720 may be kept low enough to avoid inadvertent and/or spurious switching of a magnetization vector orientation within an MTJ stack of non-volatile magnetic memory element 1720, in an embodiment. In another embodiment, circuitry may control sensing operation duration so that current flow through SOT metal layer of non-volatile magnetic memory element 1720 may be sufficiently limited to avoid inadvertent and/or spurious switching of a magnetization vector orientation within an MTJ stack of non-volatile magnetic memory element 1720. In this manner, for example, a signal and/or state may be read from volatile memory element 1710 without disturbing and/or altering a signal and/or state stored at non-volatile magnetic memory element 1720. Additionally, because of lower-resistance characteristics of SOT metal layer of non-volatile magnetic memory element 1720, read performance of volatile memory element 1710 may not be adversely impacted.

In an embodiment, a non-volatile magnetic memory element, such as non-volatile magnetic memory element 1720, may be read without disturbing and/or altering a value stored at a volatile memory element, such as volatile memory element 1710. For example, to read a signal and/or state stored in the MTJ stack of non-volatile magnetic memory element 1720, a magnetic memory word line (MWL) 1731 may be asserted. In an embodiment, SL 1721 may be coupled to a common source (e.g., ground voltage level), for example. In an embodiment, due at least in part to an assertion of MWL 1731, a selector device, such as diode 1730, may become forward-biased, and current may flow from MWL 1731 to SL 1721 through the MTJ stack of non-volatile magnetic memory element 1720. In an embodiment, selector device 1730 may comprise a back-end-of-line diode, for example. In other embodiments, for example, a selector device, such as selector device 1730, may comprise a transistor. FIG. 17 depicts a read path 1795 for the non-volatile magnetic memory element, for example. As depicted in FIG. 17, a diode, such as diode 1730, with its characteristic ability to allow current flow in a predefined direction, may be utilized to isolate a read port of non-volatile magnetic memory element 1720. Implementation of a diode, for example, may utilize less die area than would be utilized by a transistor in a similar function. Of course, embodiments may be implemented with a transistor and/or other devices that encourage unidirectional current flow, and claimed subject matter is not limited in scope in these respects.

A magnitude of current flow through the MTJ stack of non-volatile magnetic memory element 1720 may be based, at least in part, on orientations of magnetization vectors within different layers of the MTJ stack of non-volatile magnetic memory element 1720, for example. In an embodiment, a lower resistance within the MTJ stack of non-volatile magnetic memory element 1720 may indicate a stored value of "1" and a higher resistance within the MTJ stack of non-volatile magnetic memory element 1720 may indicate a stored value of "0." Of course, claimed subject matter is not limited in scope in these respects. Sense circuitry may sense an amount of current flow at MWL 1731 and/or at SL 1721, for example, to determine a resistance state of the MTJ stack of non-volatile magnetic memory element 1720, for example.

In performing a read of non-volatile magnetic memory element 1720, for example, a signal and/or state stored at volatile memory element 1710 may remain unaffected. For example, because volatile memory element 1710 is decoupled from non-volatile magnetic memory element 1720 by virtue of transistor 1711 and/or transistor 1712, for example, read operations may occur related to non-volatile magnetic memory element 1720 without interfering with operation of volatile memory element 1710, in an embodiment. Thus, as discussed above, volatile memory element 1710 and/or non-volatile magnetic memory element 1720 may be individually accessed (e.g., read) without altering signals and/or states stored in the respective memory elements.

In an embodiment, to write a data value (e.g., a signal and/or state) to volatile memory element 1710, write word line (WWL) signal 1703 may be asserted, thereby allowing conduction of a signal present on write bitline (WBL) 1701 to a node 1707, for example. Also, in an embodiment, a signal present on write bitline bar (WBLB) 1702 may be conducted to node 1745. In an embodiment, signals and/or states on nodes 1707 and/or 1745 may be latched, for example, by transistors 1713, 1714, 1715, and/or 1716, for example. Volatile memory element 1710 may also include node 1705 coupled to a source voltage and/or a node 1706 coupled to a common source (e.g., ground voltage level). In an embodiment, signals on WBL 1701 and WBLB 1702 may comprise a complementary pair of signals. For example, a logically-high voltage level (e.g., value of "1") may be present on WBL 1701 at a point in time and a logically-low voltage level (e.g., value of "0") may be present on WBLB 1702 at the point in time. Similarly, at another point in time, a logically low voltage level may be present on WBL 1701 and a logically-high voltage level may be present on WBLB 1702, for example. In an embodiment, a signal and/or state stored at volatile memory element 1710 may be represented by a voltage latched at node 1745, as indicated previously. Also, in an embodiment, a signal and/or state may be written to volatile memory element 1710 without disturbing and/or altering a signal and/or state stored at non-volatile magnetic memory element 1720.

Further, in an embodiment, to write a signal and/or state to non-volatile magnetic memory element 1720, a current may be made to flow through an SOT metal layer of non-volatile magnetic memory element 1720. A particular value to be written may depend at least in part in a direction of the current through the SOT metal layer. For example, a current flow from node 1722 to SL 1721 may result in the MTJ stack of non-volatile magnetic memory element 1720 being placed in a lower resistance state (e.g., data value "1"). Further, for example, a current flow from SL 1721 to node 1722 may result in the MTJ stack of non-volatile magnetic memory element 1720 being placed in a higher resistance state (e.g., data value "0"). Of course, claimed subject matter is not limited in scope in these respects.

Figure 19:
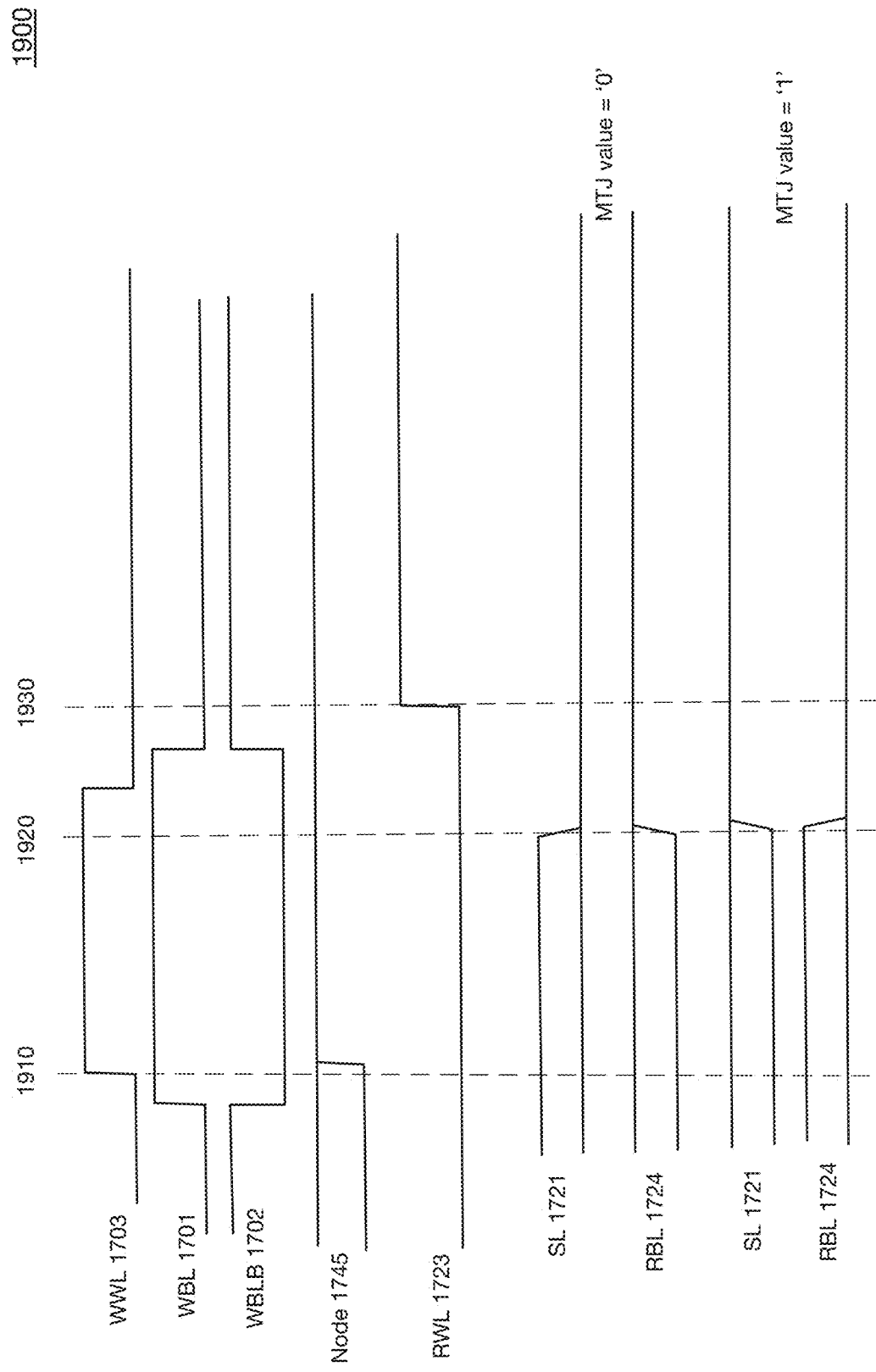
FIG. 19 is an illustration of an example simplified timing diagram depicting an example read operation for a non-volatile magnetic memory element of an example bitcell, in accordance with an embodiment.

In an embodiment, to write a signal and/or state to non-volatile magnetic memory element 1720, a signal and/or state may be written to volatile memory element 1710 to cause a voltage to appear on node 1745 sufficient to enable transistor 1711. To write to volatile memory element 1710, WBL 1701, WBLB 1702, and/or WWL 1703 may be utilized as described above, in an embodiment. A simplified timing diagram 1900 of FIG. 19 may depict example relative and/or approximate timings for various signals related to example embodiment 1700. Of course, the relative and/or approximate timings and/or relationships among signals depicted in timing diagram 1900 are merely examples, and claimed subject matter is not limited in scope in these respects. In an embodiment, as depicted in the example timing diagram 1900 of FIG. 19, a value of "1" may be written to node 1745 by asserting WBL 1701 and de-asserting WBLB 1702. At example point in time 1910, WWL 1703 may be asserted, thereby latching a signal and/or state present on WBL 1701 onto node 1745. In this example, a signal and/or state representative of a value "1" may be latched to node 1745.

In an embodiment, a direction of current flow along write path 1790, for example, may depend at least in part on signals present on RBL 1724 and/or SL 1721, for example. As depicted in example timing diagram 1900, signals SL 1721 and/or RBL 1724 may be configured at example point in time 1920 to write either a value of "1" or a value of "0" to the MTJ stack of non-volatile magnetic memory element 1720. Further, in an embodiment, transistor 1712 may be enabled via assertion of RWL 1723, as depicted at example point in time 1930. In an embodiment, to write a data value of "1" to non-volatile magnetic memory element 1720, RBL 1724 may be asserted to a logically high voltage level (e.g., coupled to a supply voltage signal) and/or SL 1721 may be pulled to logically low voltage level (e.g., coupled to a common source voltage). In a circumstance wherein RBL 1724 is asserted and SL 1721 is not asserted, current may flow from node 1722 to SL 1721, and the MTJ stack of non-volatile magnetic memory element 1720 may be placed in a relatively lower resistance state, for example. Similarly, for example, to write a data value of "0" to non-volatile magnetic memory element 1720, RBL 1724 may be de-asserted (e.g., coupled to a common source voltage) and/or SL 1721 may be asserted to a logically high voltage level (e.g., coupled to a source voltage signal). In a circumstance wherein RBL 1724 is de-asserted and SL 1721 is asserted, current may flow from SL 1721 to node 1722, and the MTJ stack of non-volatile magnetic memory element 1720 may be placed in a relatively higher resistance state, for example.

In an embodiment, once a non-volatile magnetic memory element, such as non-volatile magnetic memory element 1720, of a particular bitcell has been programmed, a volatile memory element, such as volatile memory element 1710, of the bitcell may be programmed without interfering with a value stored at the non-volatile magnetic memory element. A mode of operation wherein a non-volatile memory element of a particular bitcell may be programmed followed by programming of a volatile memory element of the particular bitcell may be referred to as a Programmable Read Only Memory (ROM) mode of operation. In such a mode of operation, and example bitcell, such as bitcell 1700, may utilize a volatile memory element, such as volatile memory element 1710, as a higher-speed memory element, and may utilize a non-volatile memory element, such as non-volatile magnetic memory element 1720, as a look-up table, for example. An example embodiment wherein bitcells, such as bitcell 1700, may arranged in an array are described below and/or depicted at FIG. 20.

Figure 20:
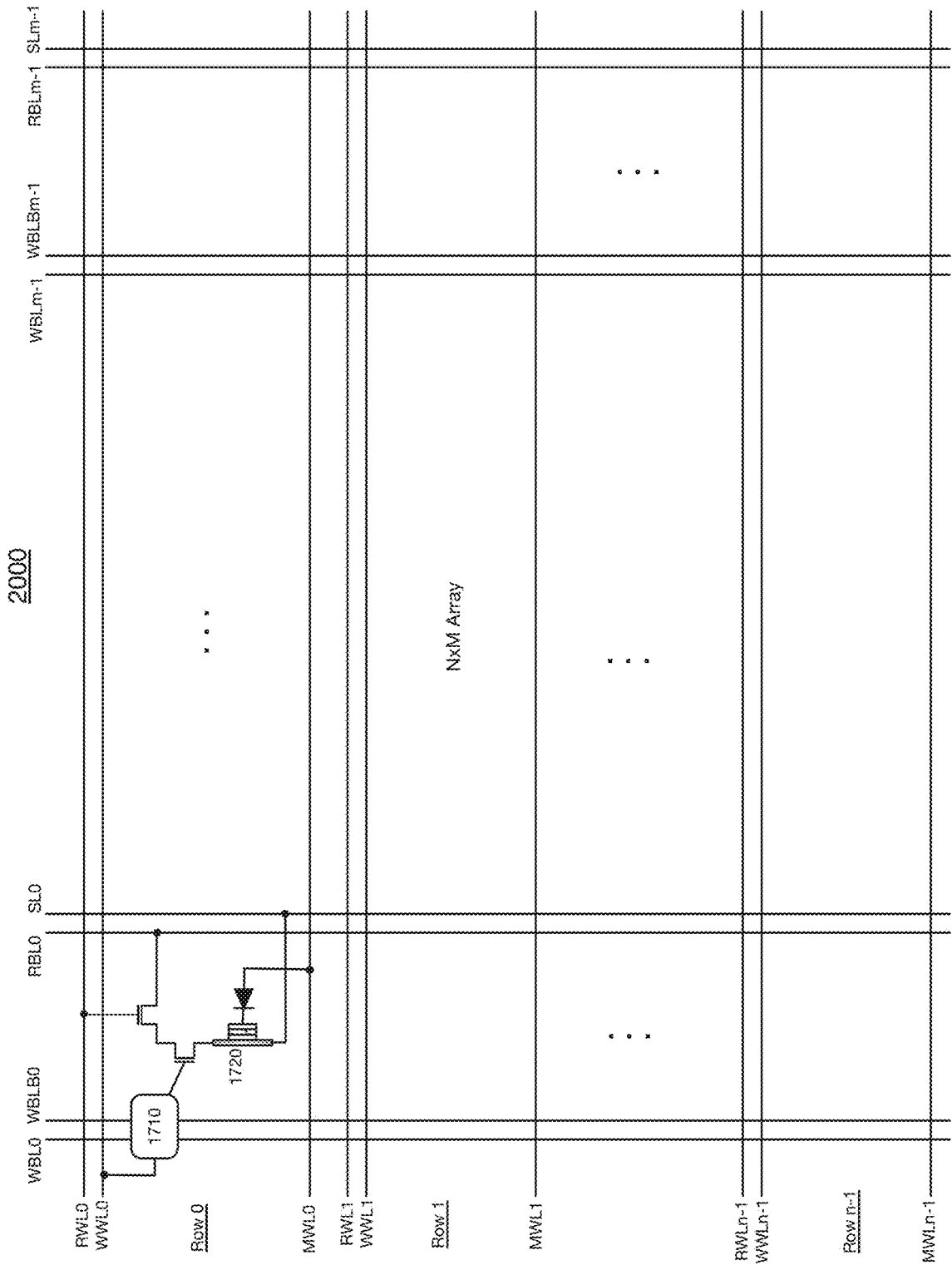
FIG. 20 is a schematic diagram depicting an example array of bitcells including volatile memory elements and non-volatile magnetic memory elements, in accordance with an embodiment.

FIG. 20 depicts an embodiment 2000 of an example array of bitcells, such as example bitcell 1700, including volatile memory elements 1710 and/or non-volatile memory elements 1720, for example. In an embodiment, an array, such as example array 2000, may include N rows and M columns. Bitcells, such as example bitcell 1700, including volatile memory elements, such as volatile memory elements 1710, and/or non-volatile magnetic memory elements, such as non-volatile magnetic memory elements 1720, may be located at intersections of rows and columns, such as depicted in FIG. 20 at example array 2000. In an embodiment, volatile memory elements, such as example volatile memory elements 1710, may be respectively coupled to pairs of write bitline signals WBL and/or WBLB and/or may be further respectively coupled to WWL signals, as depicted, for example, in array 2000. Similarly, for example, non-volatile magnetic memory elements, such as example non-volatile magnetic memory elements 1720, may be respectively coupled to RBL and/or SL signals and/or may be further coupled to respective RWL signals, as depicted, for example, in array 2000. Non-volatile magnetic memory elements, such as example non-volatile magnetic memory elements 1720, may also be coupled to respective MWL signals as also depicted in example array 2000. Of course, array 2000 is merely an example, and claimed subject matter is not limited in scope to the particular configuration of array 2000.

As mentioned, a mode of operation wherein a non-volatile memory element, such as non-volatile magnetic memory element 1720, of a particular bitcell, such as example bitcell 1700, may be programmed followed by programming of a volatile memory element, such as volatile memory element 1710, of the particular bitcell may be referred to as a Programmable Read Only Memory (ROM) mode of operation. In such a mode of operation, and example bitcell, such as bitcell 1700, may utilize a volatile memory element, such as volatile memory element 1710, as a higher-speed memory element, and may utilize a non-volatile memory element, such as non-volatile magnetic memory element 1720, as a look-up table close to a memory array, for example. In an embodiment, a presence of a look-up table embedded within an array of higher-speed volatile memory elements may allow for sharing of peripheral circuits, such as decoder circuits, column multiplexer circuits, sense amplifiers, etc., between volatile memory elements and non-volatile magnetic memory elements, thereby more efficiently utilizing semiconductor die area and/or other integrated circuit resources. The presence of a look-up table stored within an array of non-volatile magnetic memory elements, for example, embedded within an array of higher-speed volatile memory elements may also enable near-memory computing. For example, a read-only memory, such as may be implemented utilizing non-volatile magnetic memory elements 1720 as depicted in example array 2000, for example, may allow for more efficient of some types of computations, such as at least some types of computations related to neural networks and/or such as in a distributed processing architecture, in an embodiment.

In another embodiment, a non-volatile magnetic memory element, such as non-volatile magnetic memory element 1720, embedded at a read port of a volatile memory element, such as volatile memory element 1710, may be utilized as non-volatile backup of a signal and/or state stored at the volatile memory element. In an embodiment, utilization of a non-volatile magnetic memory element, such as non-volatile magnetic memory element 1720, as a backup for a volatile memory element, such as volatile memory element 1710, may enable more efficient implementation of normally-off computing devices (e.g., devices that can normally be powered down and relatively quickly restored to normal operation) and/or intermittently-powered devices (e.g., devices that may occasionally and/or relatively frequently powered-down then restored to normal operation). This may be due, at least in part, to the relatively quick and/or efficient backup of signals and/or states stored across arrays of volatile memory elements, for example.

Figure 21:
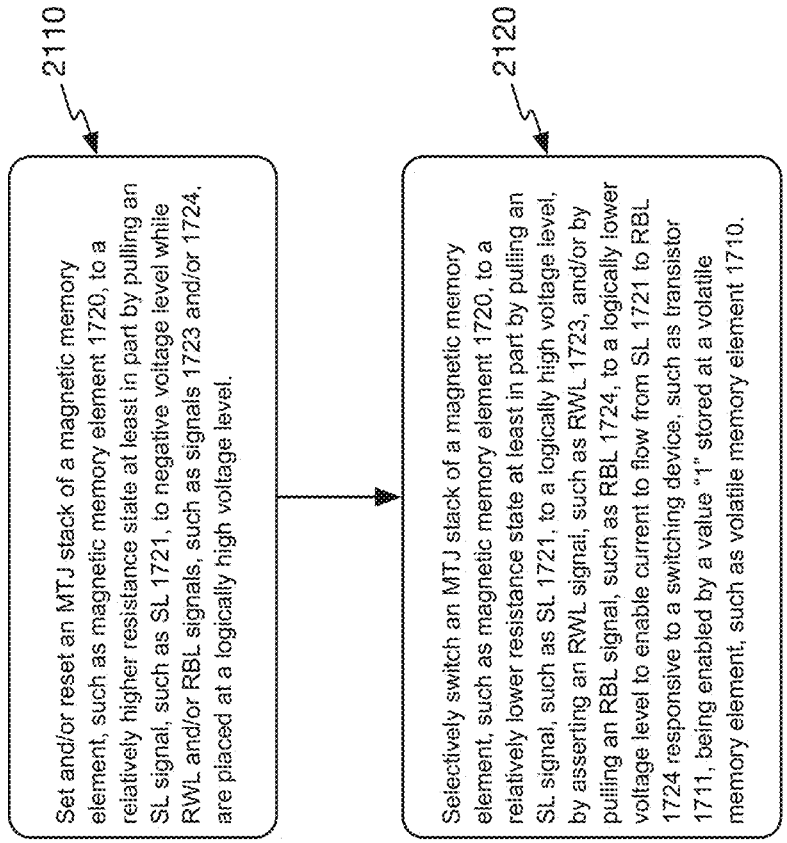
FIG. 21 is an illustration of an example simplified flow diagram depicting an example process for backing up signals and/or states stored at a volatile memory element at a non-volatile magnetic memory element, in accordance with an embodiment.

FIG. 21 depicts an embodiment 2100 of an example process for backing up signals and/or states from a volatile memory element, such as volatile memory element 1710, to a non-volatile magnetic memory element, such as non-volatile magnetic memory element 1720. Embodiments in accordance with claimed subject matter may include all of blocks 2110-2120, may include less than blocks 2110-2120, or may include more than blocks 2110-2120. Further, the order of blocks 2110-2120 is merely an example order, and claimed subject matter is not limited in scope in this respect. As depicted in example process 2100, backing up a signals and/or state from a volatile memory element, such as volatile memory element 1710, to a non-volatile magnetic memory element, such as non-volatile magnetic memory element 1720, may include setting and/or resetting a magnetic memory device, such as non-volatile magnetic memory element 1720, to a particular resistance state, and may also include selectively switching the magnetic memory device to another particular resistance state based, at least in part, on a signal and/or state stored in a volatile memory element. In this manner, a signal and/or state stored in a volatile memory element may be copied/backed-up to a non-volatile magnetic memory element.

For example, as depicted at block 2110, an MTJ stack of a non-volatile magnetic memory element, such as non-volatile magnetic memory element 1720, may be set to a higher resistance state, although claimed subject matter is not limited in scope in these respects. In an embodiment, to set and/or reset an MTJ stack of non-volatile magnetic memory element 1720 to a relatively higher resistance state, an SL signal, such as SL 1721, may be pulled to negative voltage level while RWL and/or RBL signals, such as signals 1723 and/or 1724, may be kept at a logically high voltage level. Such a configuration of signals may induce current flow from an RBL signal, such as RBL 1724, to an SL signal, such as SL 1721, irrespective of any signal and/or state stored at a volatile memory element, such as volatile memory element 1710, and thereby placing an MTJ stack of a non-volatile magnetic memory element, such as non-volatile magnetic memory element 1720, into a higher resistance state. In another embodiment, rather than pulling an SL signal, such as SL1721, to a negative voltage, an MWL signal, such as MWL 1731, may be pulled to a sufficiently higher voltage to induce current flow through an MTJ stack, such as the MTJ stack of non-volatile magnetic memory element 1720. For example, a voltage on MWL 1731 may be higher in magnitude than a voltage used for read operations for non-volatile magnetic memory element 1720, in an embodiment. Through application of a relatively higher voltage in this manner, sufficient current may flow through the MTJ stack to reset the stack to a higher impedance state due at least in part to a spin torque phenomenon within one or more layers of the MTJ stack, for example.

Further, in an embodiment, following setting and/or resetting a non-volatile magnetic memory element, such as non-volatile magnetic memory element 1720, to a relatively higher resistance state, the non-volatile magnetic memory element may be selectively switched to a lower resistance state depending, at least in part, on a signal and/or state stored in a volatile memory element, such as volatile memory element 1710, for example. To selectively switch a non-volatile magnetic memory element, such as non-volatile magnetic memory element 1720, to a lower resistance state, an SL signal, such as SL 1721, may be pulled to a logically high voltage level, for example. Additionally, in an embodiment, an RWL signal, such as RWL 1723, may be asserted, thereby enabling a transistor, such as transistor 1712, and/or an RBL signal, such as RBL 1724, may be pulled to a logically lower voltage level, for example. Due at least in part to a voltage on SL 1721, for example, being higher in magnitude than a voltage on RBL 1724, for example, current may tend to flow from SL 1721 to RBL 1724. However, in an embodiment, current flow may be regulated and/or otherwise determined by a transistor, such as transistor 1711, which in turn may be enabled and/or disabled depending on a signal and/or state stored at node 1745 of volatile memory element 1710, for example. In this manner, a value stored at a volatile memory element, such as volatile memory element 1710, may control, at least in part, whether a non-volatile magnetic memory element, such as non-volatile magnetic memory element 1720, is switched from a higher resistance state to a lower resistance state, for example.

In an embodiment, a higher resistance state of a non-volatile magnetic memory element may indicate a data value of "0." Thus, by selectively switching a non-volatile magnetic memory element from a higher resistance state to a lower resistance state, a value stored at the non-volatile magnetic memory element may be changed from "0" to "1." As discussed above, a logically high voltage level (e.g., indicative of a data value "1") on node 1745, for example, may enable a transistor, such as transistor 1711, thereby enabling current to flow and/or to enable a switch from a "0" to a "1" within the non-volatile magnetic memory element. In general, backing up a volatile memory element to a non-volatile magnetic memory element may include setting the non-volatile magnetic memory element to a value of "0" (e.g., higher resistance state) and then selectively switching the non-volatile magnetic memory element to a value of "1" (e.g., lower resistance state) responsive to a value of "1" being stored at the volatile memory element.

Although embodiments herein may be described with reference to particular data values corresponding to particular logical voltage levels and/or particular resistance states, for example, claimed subject matter is not limited in scope in these respects. Other embodiments may be implemented using other conventions with respect to data values, logical voltage levels, resistance states, etc. Further, although signals may be described herein as being asserted to a logically higher voltage level, other embodiments may include signals that may be asserted by pulling the signal to a lower and/or negative voltage level, for example. Similarly, although switch components, such as transistors, are described and/or depicted as being enabled by a logically high voltage signal, other switching devices may be utilized that may be enabled by logically low voltage signals and/or negative voltage signals, for example.

Figure 22:
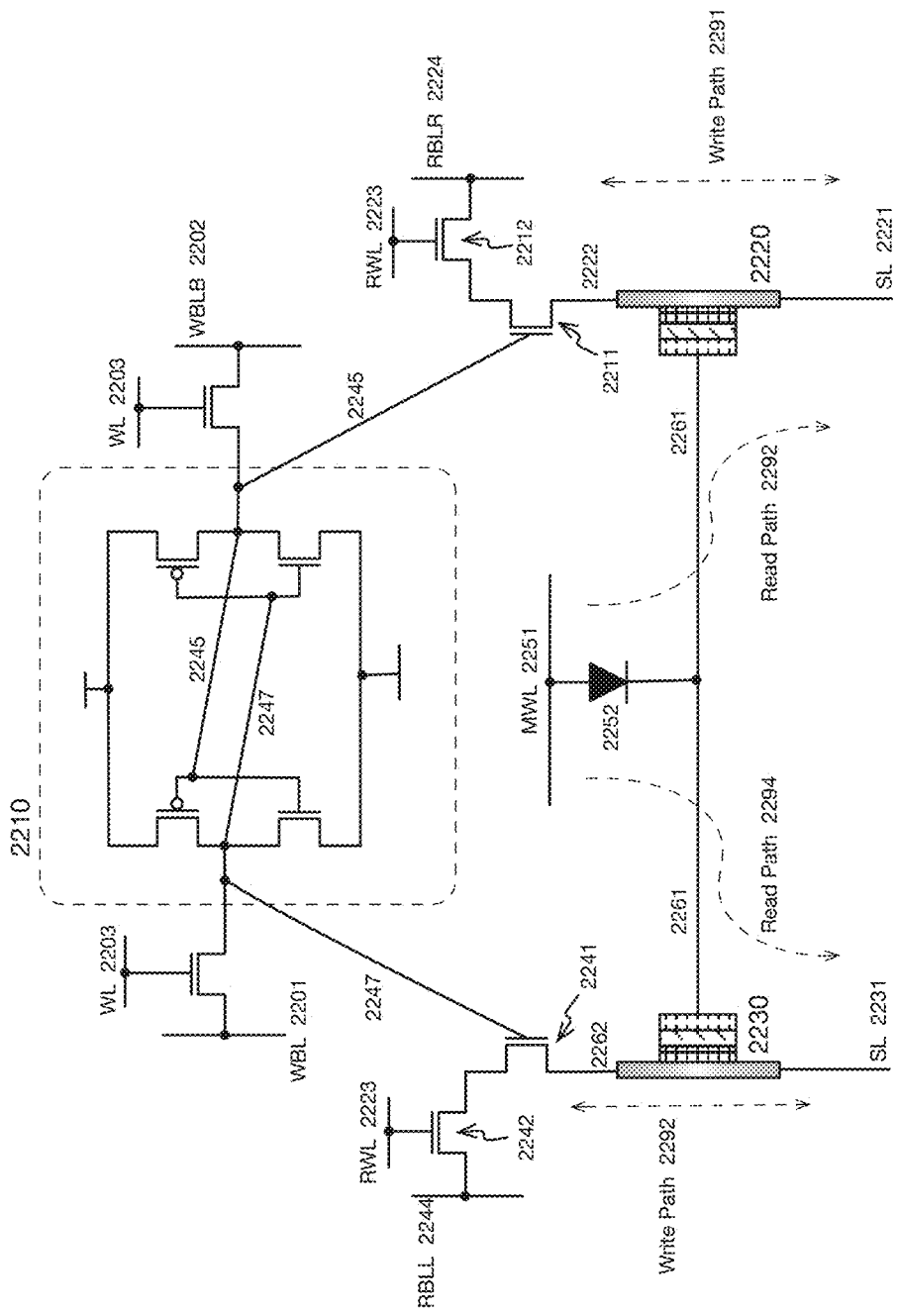
FIG. 22 is a schematic diagram depicting an example bitcell including a volatile memory element and a couple of non-volatile magnetic memory elements, in accordance with an embodiment.

FIG. 22 depicts an embodiment 2200 of an example bitcell configured from dual and/or differential storage for non-volatile magnetic memory elements, such as non-volatile magnetic memory elements 2220 and/or 2230. In an embodiment, a bitcell, such as bitcell 2200, may include a volatile memory element, such as volatile memory element 2210. In an embodiment, volatile memory element 2210 may include characteristics similar to those discussed above in connection with volatile memory element 1710. For example, in an embodiment, a data value (e.g., signal and/or state) may be written to volatile memory element 2210 by asserting WL signal 2203 to latch a differential pair of signals on WBL 2201 and/or WBLB 2202 onto nodes 2247 and 2245, respectively.

In an embodiment, data values may be copied and/or backed-up from volatile memory element 2210 to magnetic memory devices 2220 and/or 2230 in much a similar manner is described above in connection with example bitcell 1700. However, for example bitcell 2200, signals and/or states may be stored in magnetic memory devices 2220 and/or 2230 as a differential pair of signals and/or states. In an embodiment, volatile memory element 2210 may comprise a 6T (six transistor) volatile memory element, although claimed subject matter is not limited in scope in this respect. Further, in an embodiment, non-volatile magnetic memory elements 2220 and/or 2230 may comprise SHE-MTJ devices, for example. In an embodiment, volatile memory element 1710 may be accessed without altering a signal and/or state stored at non-volatile magnetic memory elements 2220 and/or 2230. Of course, although a particular implementations utilizing numbers and/or configurations of switching devices, such as transistors, claimed subject matter is not limited in scope in these respects.

In an embodiment, non-volatile magnetic memory elements 2220 and/or 2230 may be configured such that respective SOT metal layers of the non-volatile magnetic memory elements may be positioned in series with a pair of read port of volatile memory element 2210. For example, a signal and/or state stored at node 2245 of volatile memory element 2220 may be sensed at least in part by asserting RWL 2223 and/or a RBLR 2224 and/or by coupling SL 2221 to a common source (e.g., ground voltage level). Depending at least in part on a voltage at node 2245, a current may flow through an SOT metal layer of non-volatile magnetic memory element 2220 and/or may be sensed by a sensing circuit, for example, coupled to SL 2221 and/or to RBLR 2224. Similarly, a signal and/or state stored at node 2247 of volatile memory element 2230 may be sensed at least in part by asserting RWL 2223 and/or a RBLL 2244 and/or by coupling SL 2231 to a common source. Depending at least in part on a voltage at node 2247, a current may flow through an SOT metal layer of non-volatile magnetic memory element 2230 and/or may be sensed by a sensing circuit, for example, coupled to SL 2231 and/or to RBLL 2244.

In an embodiment, the properties of one or more components, such as transistors 2211, 2212, 2241, and/or 2242, may be specified such that a signal and/or state stored at non-volatile magnetic memory elements 2220 and/or 2230 may not be altered by a read of volatile memory element 2210. For example, current through SOT metal layers of non-volatile magnetic memory elements 2220 may be kept low enough to avoid inadvertent and/or spurious switching of a magnetization vector orientation within MTJ stacks of non-volatile magnetic memory elements 2220 and/or 2230, in an embodiment. In this manner, for example, a signal and/or state may be read from volatile memory element 2210 without disturbing and/or altering a signal and/or state stored at non-volatile magnetic memory elements 2220 and/or 2230.

In an embodiment, non-volatile magnetic memory elements 2220 and/or 2230 may be read without disturbing and/or altering a value stored at volatile memory element 2210. For example, to read a signal and/or state stored in the MTJ stack of non-volatile magnetic memory element 2220, MWL 2251 may be asserted. In an embodiment, SL 2221 may be coupled to a common source (e.g., ground voltage level), for example. In an embodiment, due at least in part to an assertion of MWL 2251, a selector device, such as diode 2252, may become forward-biased, and current may flow from MWL 2251 to SL 2221 through the MTJ stack of non-volatile magnetic memory element 2220. A read path 2292 for non-volatile magnetic memory element 2220 is depicted, for example. Further, to read a signal and/or state stored in the MTJ stack of non-volatile magnetic memory element 2230, MWL 2251 may be asserted and SL 2231 may be coupled to a common source, for example. Due at least in part to an assertion of MWL 2251, diode 2252 may become forward-biased, and current may flow from MWL 2251 to SL 2231 through the MTJ stack of non-volatile magnetic memory element 2230. A read path 2294 for non-volatile magnetic memory element 2230 is depicted, for example.

In performing read operations for non-volatile magnetic memory elements 2220 and/or 2230, for example, a signal and/or state stored at volatile memory element 2210 may remain unaffected. For example, because volatile memory element 2210 is decoupled from non-volatile magnetic memory elements 2220 and/or 2230 by transistor 2211, 2212, 2241, and/or 2242, for example, read operations related to non-volatile magnetic memory elements 2220 and/or 2230 without interfering with operation of volatile memory element 2210, in an embodiment.

In an embodiment, to write a signal and/or state to non-volatile magnetic memory element 2220, a current may be made to flow through an SOT metal layer of non-volatile magnetic memory element 2220. For example, a current flow from node 2222 to SL 2221 may result in the MTJ stack of non-volatile magnetic memory element 2220 being placed in a lower resistance state (e.g., data value "1"). Further, for example, a current flow from SL 2221 to node 2222 may result in the MTJ stack of non-volatile magnetic memory element 2220 being placed in a higher resistance state (e.g., data value "0"). Similarly, a current flow from node 2262 to SL 2231 may result in the MTJ stack of non-volatile magnetic memory element 2230 being placed in a lower resistance state, and a current flow from SL 2231 to node 2262 may result in the MTJ stack of non-volatile magnetic memory element 2230 being placed in a higher resistance state. Of course, claimed subject matter is not limited in scope in these respects.

In an embodiment, to write a differential pair of signals and/or states to non-volatile magnetic memory elements 2220 and/or 2230, non-volatile magnetic memory elements 2220 and/or 2230 may be placed in a higher resistance state, similar to the example process described above in backing up volatile memory element 1710 to non-volatile magnetic memory element 1720. For example, SL 2221 may be pulled to a negative voltage level while RWL 2223 and/or RBLR 2224 are asserted to a logically high voltage level. Similarly, SL 2231 may be pulled to a negative voltage level while RBLL 2244 is asserted to a logically high voltage level. Further, in an embodiment, non-volatile magnetic memory elements 2220 and/or 2230 may be selectively switched to a lower resistance state depending, at least in part, on values stored at nodes 2245 and/or 2247. In an embodiment, if node 2245 is at a logically high voltage level (indicating a value "1"), non-volatile magnetic memory element 2220 may be transitioned to a lower resistance state. Further, if node 2245 is at a logically high voltage level, node 2247 may be at a logically low voltage level and non-volatile magnetic memory element 2230 may not be switched to a lower resistance state. Thus, for a value of "1" stored at volatile memory device 2210, non-volatile magnetic memory element 2220 may be switched while non-volatile magnetic memory element 2230 stays at a higher resistance state. Similarly, for a value of "0" stored at volatile memory device 2210, non-volatile magnetic memory element 2220 may remain at a higher resistance state and memory element 2230 may be switched to a lower resistance state. In this manner, a differential pair of signals and/or states may be written to non-volatile magnetic memory elements 2220 and/or 2230.

In another embodiment, non-volatile magnetic memory elements 2220 and/or 2230 may be individually programmed. For example, non-volatile magnetic memory element 2220 may be programmed by setting SL2221, RBLR 2224 and/or RWL 2223 to appropriate values, depending at least in part on a desired direction of current flow through the SOT metal layer of non-volatile magnetic memory element 2220, and/or by enabling transistor 2211 by writing a value of "1" to volatile memory element 2210 (e.g., causing a logically high voltage to appear on node 2245). Additionally, to program non-volatile magnetic memory element 2230, SL2231, RBLL 2244 and/or RWL 2223 may be set to appropriate values, depending at least in part on a desired direction of current flow through the SOT metal layer of non-volatile magnetic memory element 2230. Further, a value of "0" may be written to volatile memory element 2210, thereby enabling transistor 2241 by placing a logically high voltage on node 2247. Of course, these are merely example techniques for programming non-volatile magnetic memory elements, such as non-volatile magnetic memory elements 2220 and/or 2230, and claimed subject matter is not limited in scope to these specific examples.

Figure 23:
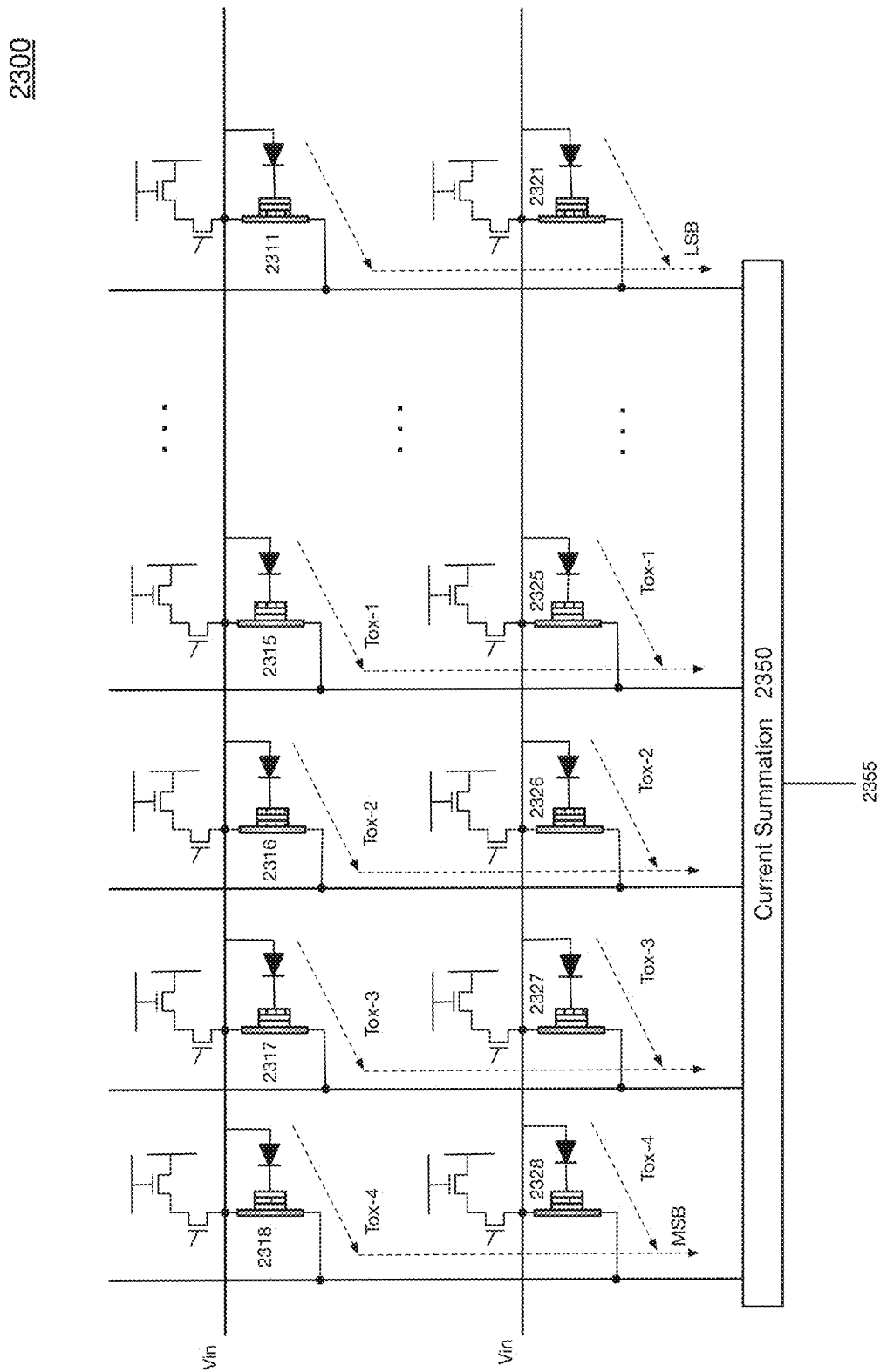
FIG. 23 is a schematic diagram depicting an example array of bitcells including non-volatile magnetic memory elements, in accordance with an embodiment.

FIG. 23 depicts an embodiment 2300 of an example array of non-volatile magnetic memory elements embedded within an array of volatile memory elements (not shown). The example depicted in FIG. 23 shows a number of non-volatile magnetic memory elements arranged in a two row, eight column array. However, claimed subject matter is not limited in scope to any particular size and/or configuration of array and/or matrix. Also, although not depicted in FIG. 23, individual non-volatile magnetic memory elements may be associated with respective volatile memory elements, similar to the combination described above in connection with example bitcell 1700, in an embodiment.

In an embodiment, an array, such as example array 2300, may be utilized to facilitate multiply-accumulate operations, for example. In an embodiment, non-volatile magnetic memory elements, such as non-volatile magnetic memory elements 2318, 2317, . . . , 2311, and/or 2328, 2327, . . . , 2321, may be utilized for operations, such as multiply-accumulate operations, without negatively impacting normal operation of associated volatile memory elements. Such operations may be referred to as "compute-in-memory," for example. In an embodiment, multiply-accumulate operations may be based, at least in part, on currents generated in response to activation (e.g., via "Vin") of particular MWL signals, such as MWL 1731. That is, non-volatile magnetic memory elements, such as 2318, 2317, . . . , 2311, and/or 2328, 2327, . . . , 2321, for example, of array 2300 may be utilized to implement multiply-accumulate operations. For example, currents (represented by broken arrows in FIG. 23) may be generated in accordance with Ohm's law (I=V/R) wherein R represents a resistance of a magnetic memory element, such as 2318, for example, and V represents a voltage (Vin) placed on MWL nodes. The example of FIG. 23 depicts a four-bit multiplication, wherein more significant bits (MSB) may weighted greater than lesser significant bits (LSB). In an embodiment, to weight particular bits, resistances for various MTJ stacks may be varied. For example array 2300, differences in resistance characteristics may be depicted by labels Tox-4, Tox-3, Tox-2, and Tox-1 (e.g., four different resistance characteristics for four-bit multiplication). In an embodiment, "Tox" may refer to a thickness of an oxide of a particular MTJ stack. In another embodiment, weights for particular bits may be implemented within current summation circuitry, such as circuitry 2350. Of course, claimed subject matter is not limited in scope to any particular bit-size for multiplication operations and/or is further not limited in scope to any particular technique for weighting bits, for example.

As described herein, example embodiments of bitcells, such as bitcell 1700, for example, may combine one or more volatile memory elements, such as volatile memory element 1710, and one or more non-volatile magnetic memory elements, such as non-volatile magnetic memory element 1720. Embodiments disclosed herein may exhibit negligible impact on reads from volatile memory elements due to the presence of non-volatile magnetic memory elements within a bitcell. Similarly, embodiments disclosed herein exhibit negligible impact on reads and/or writes involving non-volatile magnetic memory elements due to the presence of volatile memory elements within a bitcell. Further, embodiments described herein provide for individually accessible volatile memory elements and/or non-volatile magnetic memory elements. Embodiments having these characteristics may be advantageously applied in a number of implementations and/or applications, examples of which are mentioned herein.

Embodiments disclosed herein may include a bitcell circuit, including one or more volatile memory elements and also including one or more non-volatile magnetic memory elements electrically coupled to a first node of the one or more volatile memory elements. The one or more volatile memory elements and the one or more non-volatile magnetic memory elements may be individually accessible. For example, the one or more volatile memory elements may be accessible via a bitline responsive to a signal on a first wordline. In an embodiment, the one or more non-volatile magnetic memory elements may be accessible via a second wordline, wherein one or more signals and/or states stored at the one or more volatile memory elements are maintained if the one or more non-volatile magnetic memory elements are accessed.

Further, in an embodiment, a first non-volatile magnetic memory element of one or more non-volatile magnetic memory elements may comprise a spin-orbit-torque (SOT) metal layer electrically coupled between a first terminal and a second terminal, and may further comprise a magnetic tunnel junction (MTJ) component electrically coupled between a third terminal and the SOT metal layer. In an embodiment, the first non-volatile magnetic memory element may comprise a spin-orbit-torque magnetic tunnel junction (SOT-MTJ) memory element, for example. In an embodiment, a bitcell circuit may also comprise a circuit to apply a first signal to a first bit-line and to selectively conduct the first signal between the first bit-line and a second terminal of a first non-volatile magnetic memory element at least in part responsive to a voltage of a first node of the one or more volatile memory elements to implement an operation to read one or more signals and/or states stored at the one or more volatile memory elements. In an embodiment, a signal and/or state stored at a first non-volatile magnetic memory element may be maintained during an operation to read one or more signals and/or states stored at the one or more volatile memory elements.

In an embodiment, a first wordline may comprises a read wordline. An embodiment may also include a circuit to selectively conduct a first signal between a first bit-line and a second terminal of a first non-volatile magnetic memory element in further response to a signal applied to the read wordline. Further, a first bitline may comprise a read bitline, wherein a circuit may selectively conduct a first signal between a read bitline and a second terminal of a first non-volatile magnetic memory element in further response to the read wordline enabling a second conductive element. An embodiment may also include a sense circuit to sense a current or voltage conducted from the first terminal of the first non-volatile magnetic memory element to implement an operation to read one or more signals and/or states stored at one or more volatile memory elements.

In an embodiment, an example bitcell circuit may also include a sense circuit to detect a current conducted from a third terminal of a first non-volatile magnetic memory element through an MTJ component to a first terminal of a first non-volatile magnetic memory element to implement an operation to read a signal and/or state stored at a non-volatile magnetic memory element. One or more signals and/or states stored at the one or more volatile memory elements may be maintained if an operation to read a signal and/or state stored at a non-volatile magnetic memory element is implemented, in an embodiment.

Additionally, in an embodiment, a bitcell circuit may further comprise a circuit to apply a programming voltage of a specified polarity to first and second terminals of a first non-volatile magnetic memory element to place the first non-volatile magnetic memory element in a specified resistance state to implement an operation to write a specified signal and/or state to the first non-volatile magnetic memory element. Further, in an embodiment, one or more signals and/or states stored at one or more volatile memory elements may be maintained if the first non-volatile magnetic memory element is placed in the specified resistance state.

Also, in an embodiment, one or more non-volatile magnetic memory elements may comprise a differential pair of non-volatile magnetic memory elements, for example.

In another embodiment, a bitcell may further comprise a circuit to apply a negative voltage to a first terminal of a first non-volatile magnetic memory element and to apply a positive voltage to a second terminal of a first non-volatile magnetic memory element to set an MTJ component to a particular resistance state. Additionally, an example embodiment may include a circuit to apply a common source voltage to a first terminal of a first non-volatile magnetic memory element and to apply a positive voltage to a first bitline. An embodiment may further include a circuit to selectively electrically couple a second terminal of a first non-volatile magnetic memory element to a first bitline responsive to a voltage of a first node of one or more volatile memory elements to selectively switch an MTJ component to a different particular resistance state to implement an operation to copy one or more signals and/or states stored at one or more volatile memory elements to a non-volatile magnetic memory element.

In an embodiment, an example process may include accessing one or more non-volatile magnetic memory elements of a bitcell, wherein the bitcell further includes one or more volatile memory elements. In an embodiment, one or more non-volatile magnetic memory elements may be electrically coupled to a first node of the one or more volatile memory elements, wherein the one or more volatile memory elements and the one or more non-volatile magnetic memory elements may be individually accessible. The one or more volatile memory elements may be accessible via a bitline responsive to a signal on a first wordline and the one or more non-volatile magnetic memory elements may be accessible via a second wordline, for example. Further, one or more signals and/or states stored at one or more volatile memory elements of a bitcell may be maintained responsive to accessing one or more non-volatile magnetic memory elements, for example.

In an embodiment, a first non-volatile magnetic memory element of one or more non-volatile magnetic memory elements may comprise an SOT metal layer electrically coupled between a first terminal of the first non-volatile magnetic memory element and a second terminal of the first non-volatile magnetic memory element, and may further comprise a magnetic tunnel junction (MTJ) component electrically coupled between a third terminal of the first non-volatile magnetic memory element and the SOT metal layer. In an embodiment, the first non-volatile magnetic memory element may comprise a spin-orbit-torque magnetic tunnel junction (SOT-MTJ) memory element, for example.

In an embodiment, a bitline may comprise a read bitline, and an example process may further include reading one or more signals and/or states stored at one or more volatile memory elements at least in part by selectively applying a signal from a read bitline to a second terminal of a first non-volatile magnetic memory element at least in part responsive to a voltage of the first node of the one or more volatile memory elements, wherein the one or more signals and/or states stored at the one or more non-volatile magnetic memory elements may be maintained in response to reading the one or more signals and/or states stored at the one or more volatile memory elements. In an embodiment, reading one or more signals and/or states stored at one or more volatile memory elements may include sensing a current at a first terminal of a first non-volatile magnetic memory element. Additionally, accessing one or more non-volatile magnetic memory elements may include reading a signal and/or state stored at a first non-volatile magnetic memory element at least in part via sensing a current conducted from a non-volatile memory element wordline through an MTJ component to a first terminal of a first non-volatile magnetic memory element.

Further, in an embodiment, an example process may include backing up one or more signals and/or states stored at one or more volatile memory elements of a bitcell, including placing the one or more non-volatile magnetic memory elements in a particular resistance state, and selectively transitioning the one or more non-volatile magnetic memory elements to a second particular resistance state based at least in part on the one or more signals and/or states stored at the one or more volatile memory elements. In an embodiment, placing the one or more non-volatile magnetic memory elements in the particular resistance state may comprise applying a negative voltage to a first terminal of a first non-volatile magnetic memory element and may further include applying a positive voltage to a second terminal of a first non-volatile magnetic memory element to set an MTJ component to a particular resistance state. Additionally, in an embodiment, selectively transitioning one or more non-volatile magnetic memory elements to a second particular resistance state may include applying a common source voltage to a first terminal of a first non-volatile magnetic memory element and may also include applying a positive voltage to a read bitline. An example process may additionally include a circuit to selectively electrically couple a second terminal of a first non-volatile magnetic memory element to a first bitline responsive to a voltage of a first node of one or more volatile memory elements to selectively switch an MTJ component to a different particular resistance state to implement an operation to copy one or more signals and/or states stored at one or more volatile memory elements to one or more non-volatile magnetic memory elements.

An additional embodiment may include an array of bitcells individually comprising one or more volatile memory elements accessible via one or more bitlines responsive to one or more signals on one or more first wordlines and one or more non-volatile magnetic memory elements accessible via one or more second wordlines. In an embodiment, one or more signals and/or states stored at one or more volatile memory elements may be maintained if one or more non-volatile magnetic memory elements are accessed. Further, an example embodiment may include a circuit to place one or more non-volatile magnetic memory elements of individual bitcells of an array of bitcells in a particular resistance state. In an embodiment, a circuit may also selectively transition the one or more non-volatile magnetic memory elements of individual bitcells of an array of bitcells to a second particular resistance state based at least in part on one or more signals and/or states stored at one or more volatile memory elements.

In the context of the present patent application, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal or other conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, which generally refers to the ability for the client and server to transmit, receive, and/or exchange communications, as discussed in more detail later.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, is also used to mean that two or more tangible components and/or the like are not necessarily tangibly in direct physical contact, but are able to co-operate, liaise, and/or interact, such as, for example, by being "optically coupled." Likewise, the term "coupled" is also understood to mean indirectly connected. It is further noted, in the context of the present patent application, since memory, such as a memory component and/or memory states, is intended to be non-transitory, the term physical, at least if used in relation to memory necessarily implies that such memory components and/or memory states, continuing with the example, are tangible.

In the present patent application, in a particular context of usage, such as a situation in which tangible components (and/or similarly, tangible materials) are discussed above, a distinction exists between being "on" and being "over." As an example, deposition of a substance "on" a substrate refers to a deposition involving direct physical and tangible contact without an intermediary, such as an intermediary substance, between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under," as used herein, are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes an underlayment embodiment, as one illustration, in which, for example, orientation at various times (e.g., during fabrication or application) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

It is further noted that the terms "type" and/or "like," as used herein, such as with a feature, structure, characteristic, and/or the like, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," if the minor variations are sufficiently minor so that the feature, structure, characteristic, and/or the like would still be considered to be substantially present with such variations also present. It should be noted that the specification of the present patent application merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

Unless otherwise indicated, in the context of the present patent application, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques unless otherwise expressly indicated.

To the extent claimed subject matter is related to one or more particular measurements, such as with regard to physical manifestations capable of being measured physically, such as, without limit, temperature, pressure, voltage, current, electromagnetic radiation, etc., it is believed that claimed subject matter does not fall with the abstract idea judicial exception to statutory subject matter. Rather, it is asserted, that physical measurements are not mental steps and, likewise, are not abstract ideas.

It is noted, nonetheless, that a typical measurement model employed is that one or more measurements may respectively comprise a sum of at least two components. Thus, for a given measurement, for example, one component may comprise a deterministic component, which in an ideal sense, may comprise a physical value (e.g., sought via one or more measurements), often in the form of one or more signals, signal samples and/or states, and one component may comprise a random component, which may have a variety of sources that may be challenging to quantify. At times, for example, lack of measurement precision may affect a given measurement. Thus, for claimed subject matter, a statistical or stochastic model may be used in addition to a deterministic model as an approach to identification and/or prediction regarding one or more measurement values that may relate to claimed subject matter.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A bitcell circuit, comprising:
   one or more volatile memory elements to store a first pair of signals and/or states; and
   at least first and second non-volatile magnetic memory elements to store at least a second pair of signals and/or states, wherein the at least first and second non-volatile magnetic memory elements are individually accessible;
   wherein the one or more volatile memory elements to be accessed as part of a read operation and/or a write operation without altering the at least the second pair of signals and/or states stored at the at least first and second non-volatile magnetic memory elements.

2. The bitcell circuit of claim 1, wherein the first pair of signals and/or states comprise a first differential pair of signals and/or states.

3. The bitcell circuit of claim 2, wherein the at least the second pair of signals and/or states to comprise a second differential pair of signals and/or states.

4. The bitcell circuit of claim 3, wherein the second differential pair of signals and/or states to be copied to the at least first and second non-volatile magnetic memory elements from the first differential pair of signals and/or states stored at the one or more volatile memory elements.

5. The bitcell circuit of claim 1, wherein, to copy the first pair of signals and/or states stored at the one or more volatile memory elements to the at least first and second non-volatile magnetic memory elements, the at least first and second non-volatile magnetic memory elements to be placed in a first impedance state and to be subsequently selectively placed into a second impedance state depending at least in part on the first pair of signals and/or states stored at the one or more volatile memory elements.

6. The bitcell circuit of claim 5, wherein the first impedance state comprises a higher resistance state and wherein the second impedance state comprises a lower resistance state.

7. The bitcell circuit of claim 1, wherein the at least the second pair of signals and/or states stored at the at least first and second non-volatile memory elements comprise first and second individually written, non-differential signals and/or states.

8. The bitcell circuit of claim 6, wherein the at least the second pair of signals and/or states to be written to the at least first and second non-volatile magnetic memory elements without altering the first pair of signals and/or states stored at the one or more volatile memory elements.

9. The bitcell circuit of claim 1, wherein the at least first and second non-volatile magnetic memory elements individually comprise a spin-orbit-torque (SOT) metal layer electrically coupled between a first terminal and a second terminal, and further comprises a magnetic tunnel junction (MTJ) component electrically coupled between a third terminal and the SOT metal layer.

10. The bitcell circuit of claim 9, wherein the first pair of signals and/or states to be accessed as part of the read operation at least in part via a circuit to sense current to flow through the SOT metal layers of the respective first and second non-volatile magnetic memory elements without altering the signal and/or states stored at the MTJ components of the respective first and second non-volatile magnetic memory elements.

* * * * *